United States Patent
Lee et al.

(10) Patent No.: US 11,437,442 B2
(45) Date of Patent: Sep. 6, 2022

(54) TOUCH DETECTING UNIT CAPABLE OF PROXIMITY SENSING AND DISPLAY DEVICE INCLUDING THE SAME

(71) Applicant: Samsung Display Co., Ltd., Yongin-Si (KR)

(72) Inventors: Kang Won Lee, Seoul (KR); Do Ik Kim, Suwon-si (KR); Choon Hyop Lee, Anyang-si (KR); Jang Hui Kim, Suwon-si (KR); Sang Chul Lee, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/895,768

(22) Filed: Jun. 8, 2020

(65) Prior Publication Data

US 2021/0005677 A1    Jan. 7, 2021

(30) Foreign Application Priority Data

Jul. 2, 2019    (KR) .................. 10-2019-0079184

(51) Int. Cl.
*H01L 27/32* (2006.01)
*G06F 3/044* (2006.01)
*G06F 3/041* (2006.01)

(52) U.S. Cl.
CPC .......... *H01L 27/323* (2013.01); *G06F 3/0412* (2013.01); *G06F 3/0445* (2019.05)

(58) Field of Classification Search
CPC .. G06F 2203/04111; G06F 2203/04112; G06F 3/0412; G06F 3/04164; G06F 3/04166; G06F 3/0443; G06F 3/0445; G06F 3/0446; G06F 3/0448; H01L 27/323

See application file for complete search history.

(56) References Cited

U.S. PATENT DOCUMENTS

| | | | |
|---|---|---|---|
| 10,622,585 B2 * | 4/2020 | Kim | .................. H01L 51/5253 |
| 2015/0103035 A1 * | 4/2015 | Kim | .................. G06F 3/041662 345/174 |
| 2015/0160754 A1 * | 6/2015 | Wenzel | .................. G06F 3/0445 345/174 |
| 2015/0185926 A1 * | 7/2015 | Shepelev | .............. G06F 3/0446 345/174 |

(Continued)

FOREIGN PATENT DOCUMENTS

| KR | 10-2014-0063315 A | 5/2014 |
|---|---|---|
| KR | 10-2014-0069103 A | 6/2014 |
| KR | 10-2018-0073891 A | 7/2018 |

*Primary Examiner* — Chun-Nan Lin
(74) *Attorney, Agent, or Firm* — Innovation Counsel LLP

(57) ABSTRACT

A touch detecting unit comprises first sensor electrodes arranged in a first direction and electrically connected with one another second sensor electrodes arranged in a second direction crossing the first direction, and electrically connected with one another, the second sensor electrodes electrically separated from the first sensor electrodes, and third sensor electrodes electrically separated from the first sensor electrodes and the second sensor electrodes. Amounts of change in first capacitances between the first sensor electrodes and the second sensor electrodes are detected in a first mode. Amounts of change in the first capacitances and amounts of change in a second capacitance between the first sensor electrodes and the third sensor electrodes are detected in a second mode.

9 Claims, 46 Drawing Sheets

(56) References Cited

U.S. PATENT DOCUMENTS

| | | | |
|---|---|---|---|
| 2015/0302830 A1* | 10/2015 | Shepelev | G06F 3/0446 345/174 |
| 2016/0378221 A1* | 12/2016 | Solven | G06F 3/044 345/174 |
| 2017/0115779 A1* | 4/2017 | Shepelev | G06F 3/04184 |
| 2018/0011577 A1* | 1/2018 | Lee | G02F 1/13338 |
| 2018/0182333 A1* | 6/2018 | Ahn | G02F 1/13338 |
| 2018/0259803 A1* | 9/2018 | Chang | G02F 1/13338 |
| 2019/0102010 A1* | 4/2019 | Knabenshue | G06F 3/04162 |
| 2020/0103994 A1* | 4/2020 | Vaze | G06F 3/045 |
| 2021/0004135 A1* | 1/2021 | Kim | G06F 3/0412 |

* cited by examiner

TOUCH DETECTING UNIT CAPABLE OF PROXIMITY SENSING AND DISPLAY DEVICE INCLUDING THE SAME

CROSS-REFERENCE TO RELATED APPLICATION

This application claims priority to Korean Patent Application No. 10-2019-0079184 filed on Jul. 2, 2019, and all the benefits accruing therefrom under 35 U.S.C. § 119, the content of which in its entirety is herein incorporated by reference.

BACKGROUND

1. Field of the Disclosure

The disclosure relates to a touch detecting unit and a display device including the same.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions.

As display devices are employed by various electronic devices, display devices are required to have various designs. Recently, bezeless smart phones have been developed that minimize bezel width. The bezel refers to a non-display area disposed around the display area where an image is displayed.

In the bezel of a smart phone, a proximity sensor for detecting whether a user is located in front of the display device is generally disposed. Therefore, it is necessary to eliminate the proximity sensor in order to minimize the bezel width of a smart phone.

SUMMARY

Embodiments of the present disclosure are to provide a touch detecting unit capable of proximity sensing.

Embodiments of the present disclosure are also to provide a display device including touch detecting unit capable of proximity sensing.

According to an embodiment of the disclosure, a touch detecting unit comprises: first sensor electrodes arranged in a first direction and electrically connected with one another; second sensor electrodes arranged in a second direction crossing the first direction, and electrically connected with one another, the second sensor electrodes electrically separated from the first sensor electrodes; and third sensor electrodes electrically separated from the first sensor electrodes and the second sensor electrodes. Amounts of change in first capacitances between the first sensor electrodes and the second sensor electrodes are detected in a first mode. Amounts of change in the first capacitances and amounts of change in a second capacitance between the first sensor electrodes and the third sensor electrodes are detected in a second mode.

According to an embodiment of the disclosure, a touch detecting unit comprises: first sensor electrodes arranged in a first direction and electrically connected with one another; second sensor electrodes arranged in a second direction crossing the first direction, and electrically connected with one another, and the second sensor electrodes electrically separated from the first sensor electrodes; and third sensor electrodes electrically separated from the first sensor electrodes and the second sensor electrodes. Values of first capacitances between the first sensor electrodes and the second sensor electrodes are detected in a first mode. The values of the first capacitances and values of second capacitances between the second sensor electrodes and the third sensor electrodes are detected in a second mode.

According to an embodiment of the disclosure, a touch detecting unit comprises: first sensor electrodes arranged in a first direction and electrically connected with one another; second sensor electrodes arranged in a second direction crossing the first direction, electrically connected with one another and electrically separated from the first sensor electrodes; third sensor electrodes electrically separated from the first sensor electrodes and the second sensor electrodes; fourth sensor electrodes electrically separated from the first sensor electrodes and the second sensor electrodes. Amounts of change in first capacitances between the first sensor electrodes and the second sensor electrodes are detected in a first mode. The amounts of change in the first capacitances, amounts of change in a second capacitance between the first sensor electrodes and the third sensor electrodes, and amounts of change in a third capacitance between the first sensor electrodes and the fourth sensor electrodes are detected in a second mode.

According to an embodiment of the disclosure, by detecting the amounts of change in first mutual capacitances and the amounts of change in second mutual capacitances in a first area, it is possible to determine whether a person or an object is proximate thereto. This allows the display device to detect the proximity of a person or an object without any proximity sensor, and thus it is possible to reduce the bezel width of the display device on which otherwise the proximity sensor is disposed.

It should be noted that effects of the present disclosure are not limited to those described above and other effects of the present disclosure will be apparent to those skilled in the art from the following descriptions.

BRIEF DESCRIPTION OF THE DRAWINGS

The above and other features of the present disclosure will become more apparent by describing in detail example embodiments thereof with reference to the accompanying drawings, in which.

DETAILED DESCRIPTION OF THE EMBODIMENTS

Figure 1:
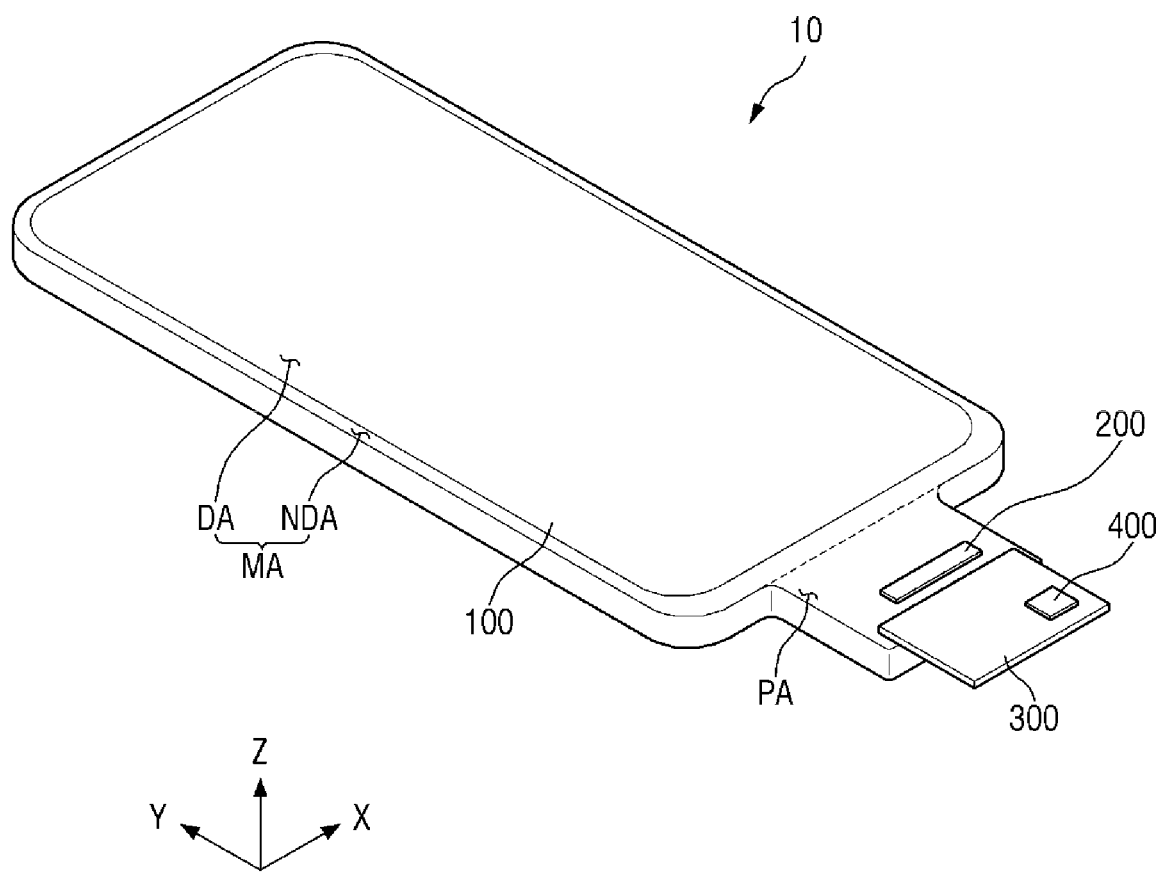
FIG. 1 is a perspective view of a display device according to an example embodiment of the current disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The example term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The example terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Example embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described in detail with reference to the accompanying drawings.

Figure 2:
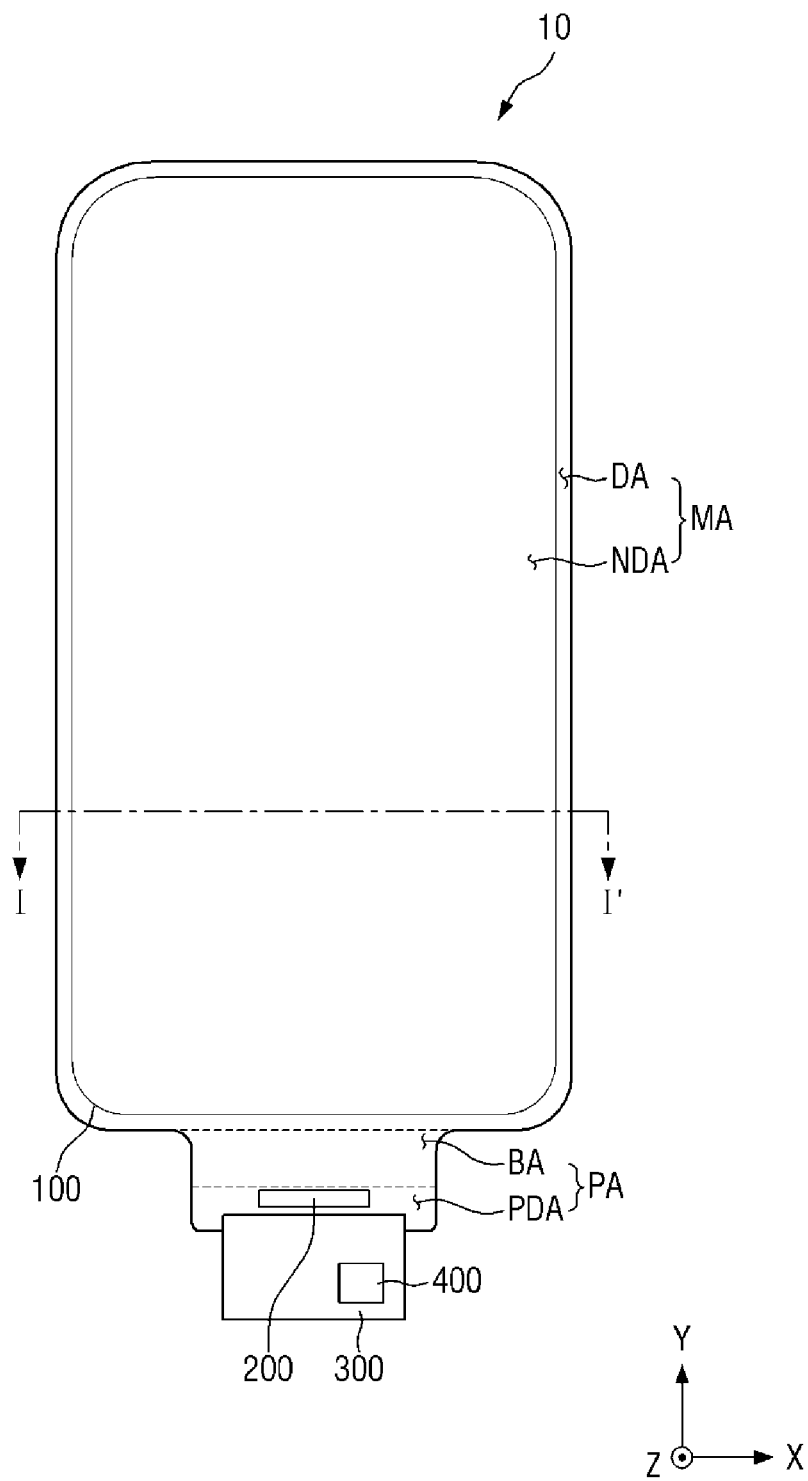
FIG. 2 is a plan view showing a display device according to an example embodiment of the current disclosure.
Figure 3:
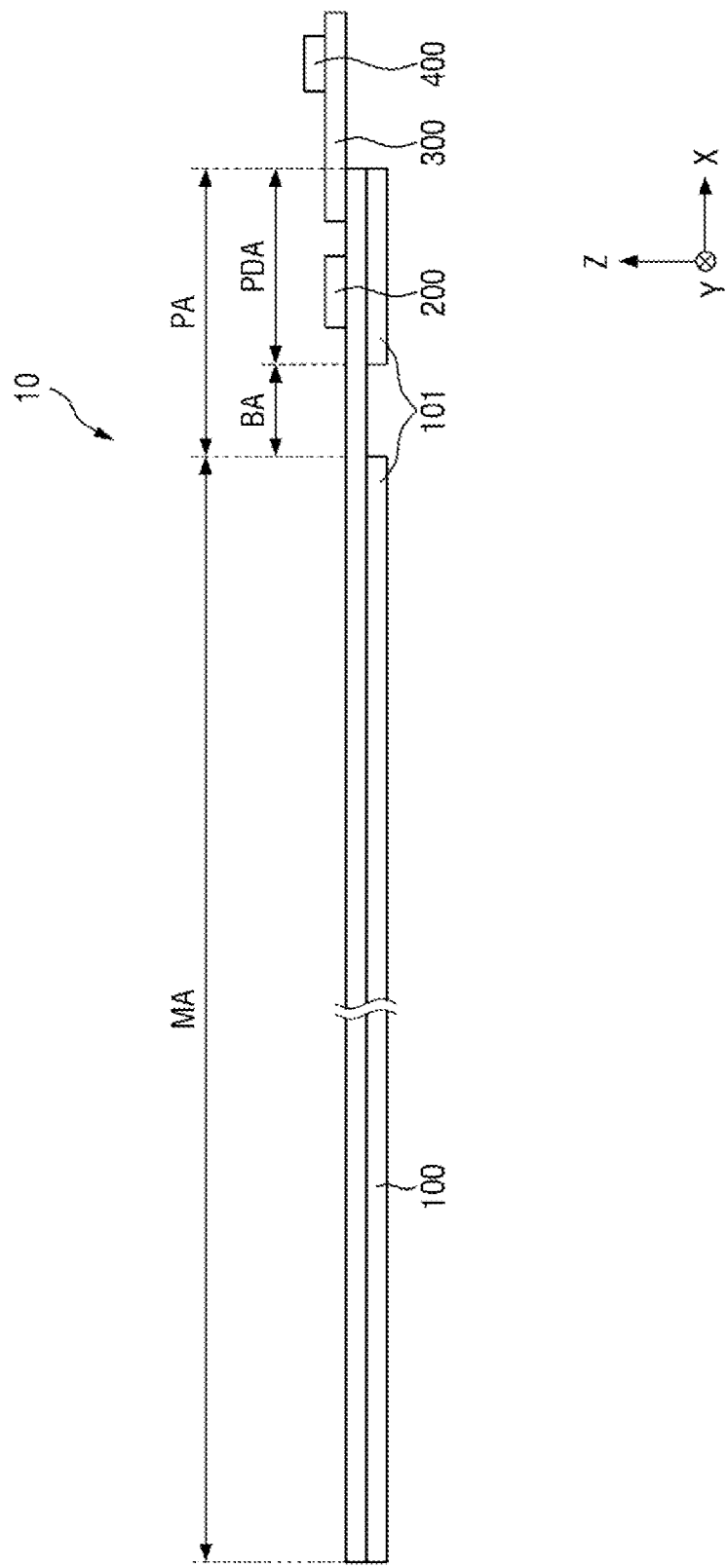
FIGS. 3 and 4 are side views showing a display device according to an example embodiment of the current disclosure.
Figure 4:
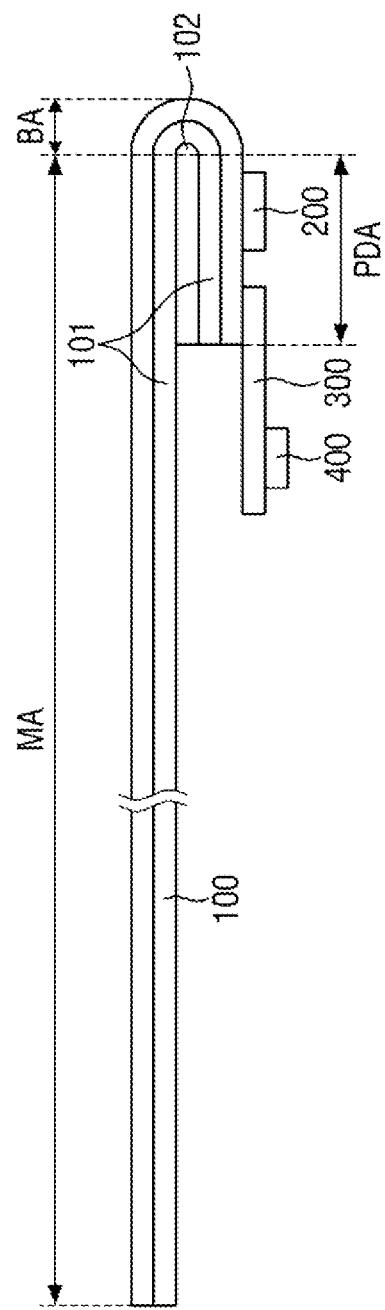

FIG. 1 is a perspective view of a display device according to an example embodiment of the present disclosure. FIG. 2 is a plan view of a display device according to an example embodiment of the present disclosure. FIGS. 3 and 4 are side views showing a display device according to an example embodiment of the present disclosure.

As used herein, the terms "above," "top" and "upper surface" refer to the upper side of the display panel 100, i.e., the side indicated by the arrow in the z-axis direction, whereas the terms "below," "bottom" and "lower surface" refer to the lower side of the display panel 100, i.e., the opposite side in the z-axis direction. As used herein, the terms "left," "right," "upper" and "lower" sides indicate relative positions when the display panel 100 is viewed from the top. For example, the "left side" refers to the opposite direction indicated by the arrow of the x-axis, the "right side" refers to the direction indicated by the arrow of the x-axis, the "upper side" refers to the direction indicated by the arrow of the y-axis, and the "lower side" refers to the opposite direction indicated by the arrow of the y-axis.

Referring to FIGS. 1 to 2, a display device 10 is for displaying moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and an ultra mobile PC (UMPC), as well as the display screen of various products such as a television, a notebook, a monitor, a billboard and the Internet of Things. The display device 10 may be one of an organic light-emitting display device, a liquid-crystal display device, a plasma display device, a field emission display device, an electrophoretic display device, an electrowetting display device, a quantum dot light-emitting display device, a micro LED display device and the like. In the following description, an organic light-emitting display device is described as an example of the display device 10. It is, however, to be understood that the present disclosure is not limited thereto.

According to an example embodiment of the present disclosure, a display device 10 includes a display panel 100, a display driving circuit 200, a circuit board 300 and a touch driving circuit 400.

The display panel 100 may include a main area MA and a protruding area PA protruding from one side of the main area MA.

The main area MA may be formed in a rectangular plane having short sides in a first direction (x-axis direction) and long sides in a second direction (y-axis direction) intersecting the first direction (x-axis direction). Each of the corners where the short side in the first direction (x-axis direction) meets the long side in the second direction (y-axis direction) may be rounded with a predetermined curvature or may be a right angle. The shape of the display device 10 when viewed from the top is not limited to a quadrangular shape, but may be formed in another polygonal shape, circular shape, or elliptical shape. The main area MA may be, but is not limited to being, formed to be flat. The main area MA 10 may include curved portions formed at left and right ends thereof. The curved portions may have a constant curvature or varying curvatures.

The main area MA may include a display area DA where pixels PX are formed to display images, and a non-display area NDA around the display area DA.

In addition to the pixels, scan lines, data lines, and power lines connected to the pixels may be disposed in the display area DA. When the main area MA includes a curved portion, the display area DA may be disposed on the curved portion. In such case, the image of the display panel 100 can also be seen on the curved portion.

The non-display area NDA may be defined as the area from the outside of the display area DA to the edge of the display panel 100. In the non-display area NDA, a scan driver for applying scan signals to scan lines, and link lines connecting the data lines with the display driving circuit 200 may be disposed.

The protruding area PA may protrude from one side of the main area MA. For example, the protruding area PA may protrude from the lower side of the main area MA as shown in FIG. 2. The length of the protruding area PA in the first direction (x-axis direction) may be smaller than the length of the main area MA in the first direction (x-axis direction).

The protruding area PA may include a bending area BA and a pad area PDA. In such case, the pad area PDA may be disposed on one side of the bending area BA, and the main area MA may be disposed on the opposite side of the bending area BA. For example, the pad area PDA may be disposed on the lower side of the bending area BA, and the main area MA may be disposed on the upper side of the bending area BA.

The display panel 100 may be formed to be flexible so that it can be curved, bent, folded or rolled. Therefore, the display panel 100 may be bent at the bending area BA in the thickness direction. As shown in FIG. 3, one surface of the pad area PDA of the display panel 100 upwardly faces before the display panel 100 is bent. As shown in FIG. 4, the surface of the pad area PDA of the display panel 100 downwardly faces after the display panel 100 is bent. As a result, since the pad area PDA is disposed under the main area MA, it may overlap the main area MA.

Pads electrically connected to the display driving circuit 200 and the circuit board 300 may be disposed in the pad area PDA of the display panel 100.

A panel cover member 101 may be disposed under the display panel 100. The panel cover member 101 may be attached to the lower surface of the display panel 100 by an adhesive member. The adhesive member may be a pressure-sensitive adhesive (PSA).

The panel cover member 101 may include: a light-absorbing member for absorbing light incident from outside, a buffer member for absorbing external impact, and a heat dissipating member for efficiently discharging heat from the display panel 100.

The light-absorbing member may be disposed under the display panel 100. The light-absorbing member blocks the transmission of light to prevent the elements disposed thereunder from being seen from above the display panel 100, such as the display circuit board 310. The light-absorbing member may include a light-absorbing material such as a black pigment and a black dye.

The buffer member may be disposed under the light-absorbing member. The buffer member absorbs an external impact to prevent the display panel 100 from being damaged. The buffer member may be made up of a single layer or multiple layers. For example, the buffer member may be formed of a polymer resin such as polyurethane, polycarbonate, polypropylene and polyethylene, or may be formed of a material having elasticity such as a rubber and a sponge obtained by foaming a urethane-based material or an acrylic-based material. The buffer member may be a cushion layer.

The heat dissipating member may be disposed under the buffer member. The heat dissipation member may include a first heat dissipation layer including graphite or carbon nanotubes, and a second heat dissipation layer formed of a thin metal film such as copper, nickel, ferrite and silver, which can block electromagnetic waves and have high thermal conductivity.

In order to allow the display panel 100 to be easily bent, the panel cover member 101 may not be disposed in the bending area BA of the display panel 100 as shown in FIG. 3. Since the display panel 100 is bent in the bending area BA such that the pad area PDA is disposed under the main area MA, the display panel 100 may overlap the main area MA. Accordingly, the panel cover member 101 disposed in the main area MA of the display panel 100 and the panel cover member 101 disposed in the pad area PDA of the display panel 100 may be attached together by an adhesive member 102. The adhesive member 102 may be a pressure-sensitive adhesive.

The display driving circuit 200 outputs signals and voltages for driving the display panel 100. For example, the display driving circuit 200 may apply data voltages to the data lines. In addition, the display driving circuit 200 may apply supply voltage to the power line and may apply scan control signals to the scan driver. The display driving circuit 200 may be implemented as an integrated circuit (IC) and may be attached to the display panel 100 in a pad area PDA by a chip on glass (COG) technique, a chip on plastic (COP) technique, or an ultrasonic bonding. For example, the display driving circuit 200 may be mounted on the circuit board 300.

The pads may include display pads electrically connected to the display driving circuit 200 and touch pads electrically connected to touch lines.

The circuit board 300 may be attached to the pads using an anisotropic conductive film. In this manner, the lead lines of the circuit board 300 may be electrically connected to the pads. The circuit board 300 may be a flexible printed circuit board, a printed circuit board, or a flexible film such as a chip on film.

The touch driving circuit 400 may be connected to the sensor electrodes of the touch sensing layer TSL of the display panel 100. The touch driving circuit 400 applies driving signals to the sensor electrodes of the touch sensing layer TSL and measures mutual capacitances of the sensor electrodes. The driving signals may have driving pulses. The touch driving circuit 400 can determine whether a user has touched or has presented based on the mutual capacitances. A user's touch means that an object such as the user's finger or a pen is brought into contact with a surface of the display device 10 disposed on the touch sensing layer TSL. The user's proximity touch means that an object such as the user's finger or a pen is hovering over a surface of the display device 10.

The touch driving circuit 400 may be disposed on the circuit board 300. The touch driving circuit 400 may be implemented as an integrated circuit (IC) and may be mounted on the circuit board 300.

Figure 5:
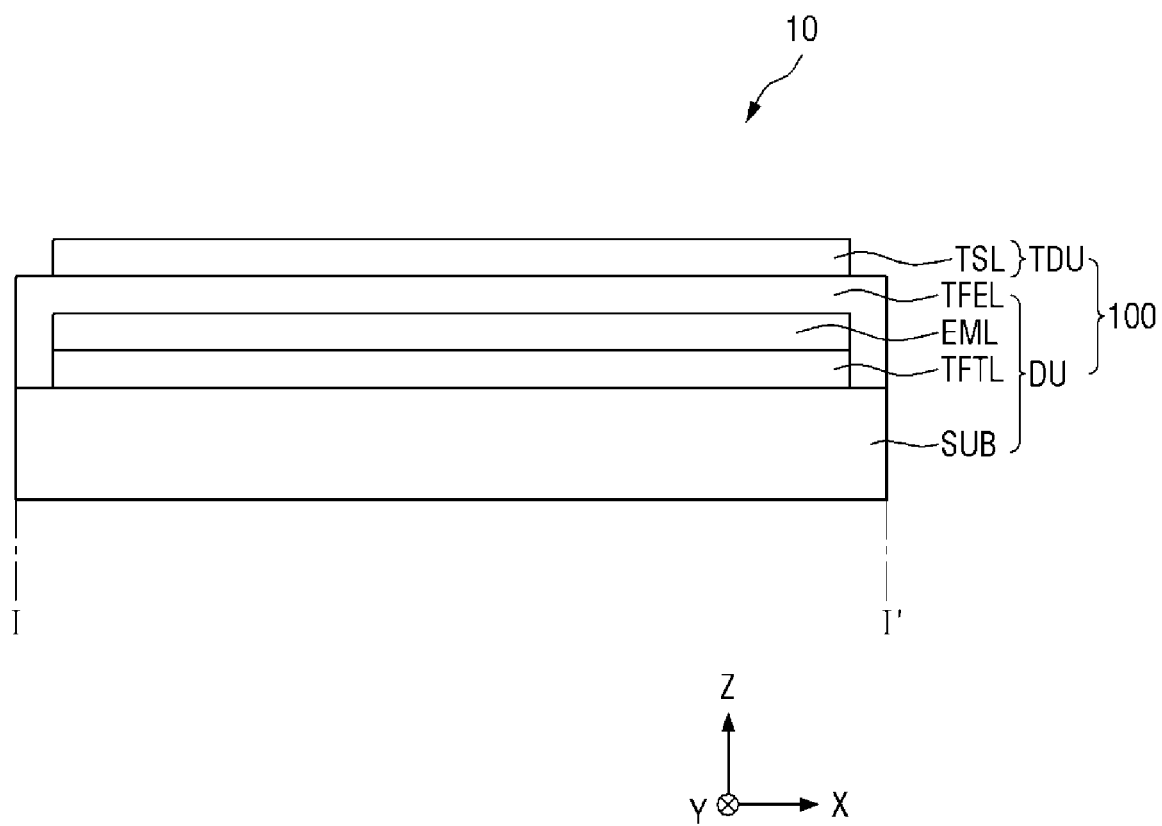
FIG. 5 is a cross-sectional view taken along line I-I' of FIG. 2.

FIG. 5 is a cross-sectional view taken along line I-I' of FIG. 2.

Referring to FIG. 5, the display device 100 may include a display unit DU having a substrate SUB, a thin-film transistor layer TFTL disposed on the substrate SUB, an emission material layer EML and a thin-film encapsulation layer TFEL; and a touch detecting unit TDU having a touch sensing layer TSL.

The substrate SUB may be made of an insulating material such as glass, quartz and a polymer resin. Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (CAT), cellulose acetate propionate (CAP) or a combination thereof. Alternatively, the substrate SUB may include a metallic material.

The substrate SUB may be a rigid substrate or a flexible substrate that can be bent, folded, rolled, and so on. When the substrate SUB is a flexible substrate, it may be formed of, but is not limited to, polyimide (PI).

Figure 6:
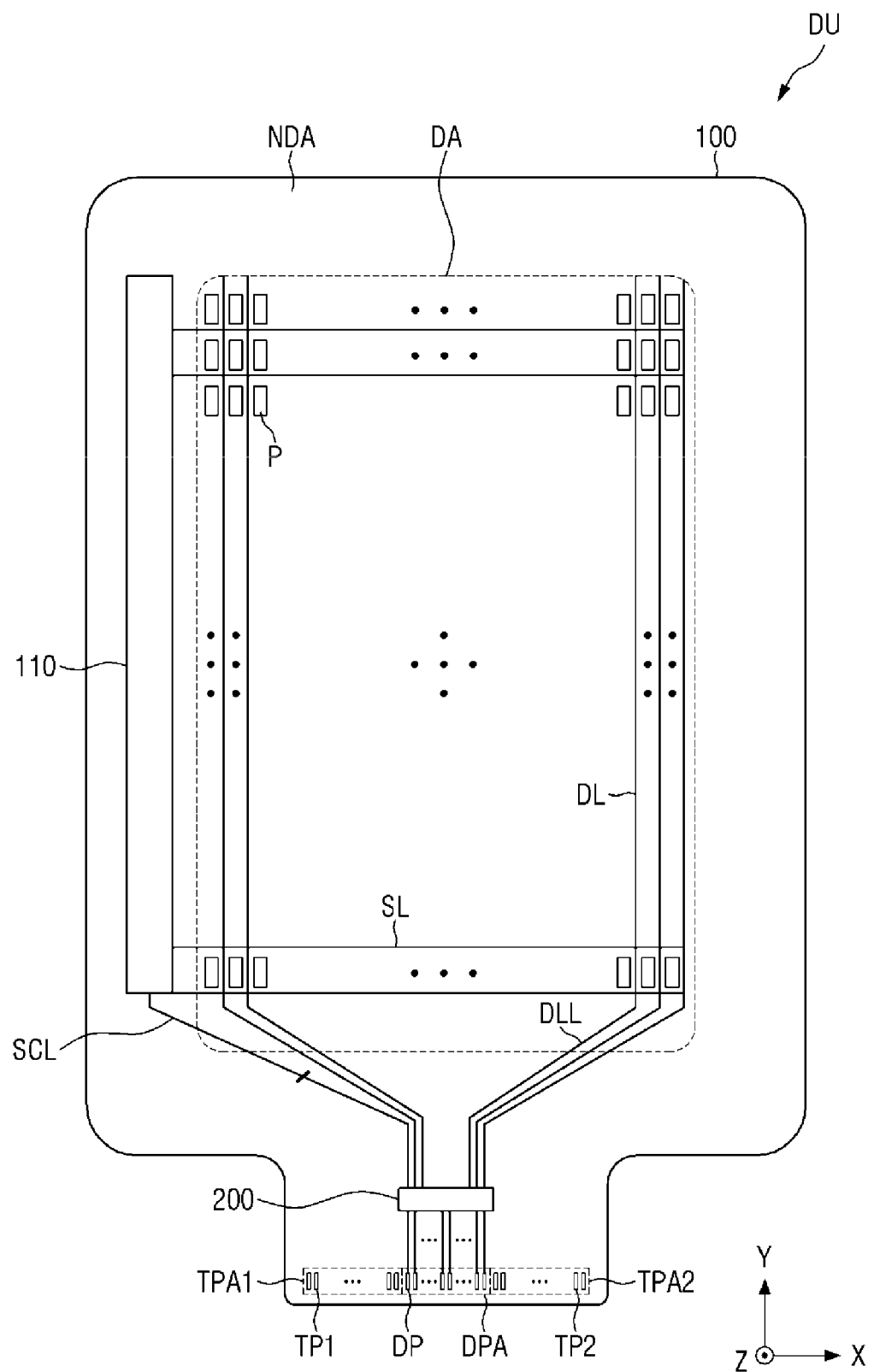
FIG. 6 is a plan view showing the display unit of FIG. 5 and related elements.

The thin-film transistor layer TFTL may be disposed on the substrate SUB. On the thin-film transistor layer TFTL, scan lines, data lines, power supply lines, scan control lines, and routing lines connecting the pads with the data lines may be formed as well as thin-film transistors in the pixels. Each of the thin-film transistors may include a gate electrode, a semiconductor layer, a source electrode, and a drain electrode. When the scan driver 110 is formed in the non-display area NDA of the display panel 100 as shown in FIG. 6, the scan driver 110 may include thin-film transistors.

The thin-film transistor layer TFTL may be disposed in the display area DA and the non-display area NDA. Specifically, the thin-film transistors in the pixels, the scan lines, the data lines, and the power supply lines on the thin-film transistor layer TFTL may be disposed in the display area DA. The scan control lines and the link lines on the thin-film transistor layer TFTL may be disposed in the non-display area NDA.

The emission material layer EML may be disposed on the thin-film transistor layer TFTL. The emission material layer EML may include pixels including a first electrode, an emitting layer, a plurality of pixel including a second electrode, and a bank. The emitting layer may be an organic emitting layer containing an organic material. Then, the emitting layer may include a hole transporting layer, an organic light-emitting layer, and an electron transporting layer. When voltage is applied to the first electrode and cathode voltage is applied to the second electrode through the thin-film transistor on the thin-film transistor layer TFTL, the holes and electrons move to the organic light-emitting layer through the hole transporting layer and the electron transporting layer, respectively, so that they combine in the organic light-emitting layer to emit light. The pixels on the emission material layer EML may be disposed in the display area DA.

The thin-film encapsulation layer TFEL may be disposed on the emission material layer EML. The thin-film encapsulation layer TFEL serves to prevent oxygen or moisture from permeating into the emission material layer EML. To this end, the thin-film encapsulation layer TFEL may include at least one inorganic layer. The inorganic layer may be, but not limited to, a silicon nitride layer, a silicon oxynitride layer, a silicon oxide layer, a titanium oxide layer, or an aluminum oxide layer. In addition, the thin-film encapsulation layer TFEL protects the emission material layer EML from foreign substances such as dust. To this end, the thin-film encapsulation layer TFEL may include at least one organic layer. The organic layer may be formed of, but is not limited to, an acryl resin, an epoxy resin, a phenolic resin, a polyamide resin and a polyimide resin.

The thin-film encapsulation layer TFEL may be disposed in the display area DA as well as the non-display area NDA. Specifically, the thin-film encapsulation layer TFEL may cover the display area DA and the emission material layer EML, and may cover the thin-film transistor layer TFTL in the non-display area NDA.

The touch sensing layer TSL may be disposed on the thin-film encapsulation layer TFEL. As the touch sensing layer TSL is disposed directly on the thin-film encapsulation layer TFEL, the thickness of the display device 10 can be reduced, compared with a display device in which a separate touch panel including the touch sensing layer TSL is attached on the thin-film encapsulation layer TFEL.

Figure 7:
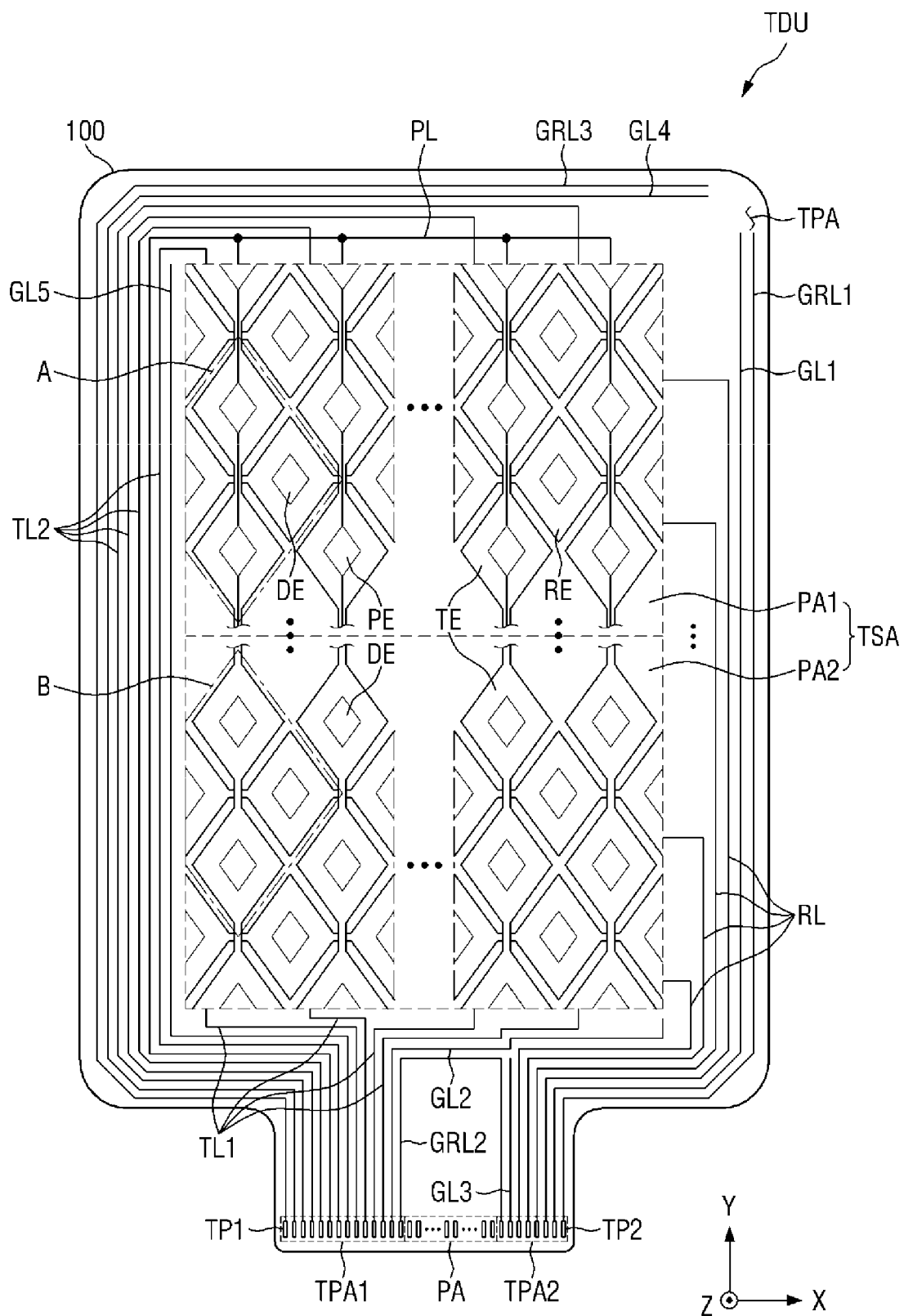
FIG. 7 is a plan view showing the touch detecting unit of FIG. 5 and the related elements.

The touch sensing layer TSL may include sensor electrodes for sensing a user's touch by mutual capacitive sensing and touch lines for connecting the pads with the sensor electrodes. The sensor electrodes of the touch sensing layer TSL may be disposed in a touch sensing area TSA overlapping the display area DA as shown in FIG. 7. The touch lines of the touch sensing layer TSL may be disposed in a touch peripheral area TPA overlapping the non-display area NDA as shown in FIG. 7.

A polarizing film may be disposed on the touch sensing layer TSL. The polarizing film may include a linear polarizer and a phase retardation film such as a λ/4 (quarter-wave) plate. In such case, the phase retardation film may be disposed on the touch sensing layer TSL, and the linear polarizer may be disposed on the phase retardation film. In addition, a cover window may be disposed on the polarizing film. The cover window may be attached onto the polarizing film by a transparent adhesive member such as an optically clear adhesive (OCA) film.

FIG. 6 is a plan view showing the display unit of FIG. 5 and related elements.

For convenience of illustration, FIG. 6 shows only pixels P, scan lines SL, data lines DL, scan control lines SCL, fan-out lines DLL, a scan driver 110, a display driving circuit 200 and display pads DP of the display unit DU.

Referring to FIG. 6, the scan lines SL, the data lines DL, and the pixels P are disposed in the display area DA. The scan lines SL may be arranged in the first direction (x-axis direction), while the data lines DL may be arranged in the second direction (y-axis direction) intersecting the first direction (x-axis direction).

Each of the pixels P may be connected to at least one of the scan lines SL and at least one of the data lines DL. Each of the pixels P may include thin-film transistors including a driving transistor and at least one switching transistor, a light-emitting element, and a capacitor. When a scan signal is applied from a scan line SL, each of the pixels P receives a data voltage from a data line DL and supplies a driving current to the light-emitting element according to the data voltage applied to the gate electrode, so that light is emitted. Although an organic light-emitting element including an anode electrode, an organic emitting layer, and a cathode electrode has been described as an example of the light-emitting element, the present disclosure is not limited thereto. The light-emitting element may be implemented as a quantum-dot light-emitting element including an anode electrode, a quantum-dot emitting layer, and a cathode electrode, as an inorganic light-emitting element including an anode electrode, an inorganic emitting layer having an inorganic semiconductor, and a cathode electrode, or as a micro light-emitting element including a micro light-emitting diode. The scan driver 110 is connected to the display driving circuit 200 through a plurality of scan control lines SCL. Accordingly, the scan driver 110 may receive the scan control signal of the display driver circuit 200. The scan driver 110 generates scan signals according to scan control signal and supplies the scan signals to the scan lines SL.

Although the scan driver 110 is formed in the non-display area NDA on the left side of the display area DA in FIG. 5, the present disclosure is not limited thereto. For example, the scan driver 110 may be formed in the non-display area NDA on the left side as well as in the non-display area NDA on the right side of the display area DA.

The display driving circuit 200 is connected to the display pads DP and receives digital video data and timing signals. The display driving circuit 200 converts the digital video data into analog positive/negative data voltages and supplies them to the data lines DL through the fan-out lines DLL. In addition, the display driving circuit 200 generates and supplies scan control signal for controlling the scan driver 110 through the scan control lines SCL. The pixels P to which the data voltages are supplied are selected by the scan signals of the scan driver 110 and the data voltages are supplied to the selected pixels P. The display driver circuit 200 may be implemented as an integrated circuit (IC) and may be attached to the substrate SUB by a chip on glass (COG) technique, a chip on plastic (COP) technique, or an ultrasonic bonding. It is, however, to be understood that the present disclosure is not limited thereto. For example, the display driving circuit 200 may be mounted on the circuit board 300.

As shown in FIG. 6, the display panel 100 may include display pads DP electrically connected to the display driving circuit 200 and touch pads TP1 and TP2 electrically connected to the touch lines. A display pad area DPA in which the display pads DP are disposed may be disposed between a first touch pad area TPA1 in which the first touch pads TP1 are disposed and a second touch pad area TPA2 in which the second touch pads TP2 are disposed. As shown in FIG. 6, the display pad area DPA may be disposed at the center of one end of the protruding area PA, the first touch pad area TPA1 may be disposed at the left side of the end of the protruding area PA, and the second touch pad area TPA2 may be disposed on the right side of the end of the protruding area PA.

The circuit board 300 may be attached to the display pads DP and the touch pads TP1 and TP2 using an anisotropic conductive film. Accordingly, the lead lines of the circuit board 300 may be electrically connected to the display pads DP and the touch pads TP1 and TP2. The circuit board 300 may be a flexible printed circuit board, a printed circuit board, or a flexible film such as a chip on film.

The touch driving circuit 400 may be connected to the sensor electrodes of the touch detecting unit of the display panel 100. The touch driving circuit 400 applies driving signals to the sensor electrodes and measures mutual capacitances of the sensor electrodes. The driving signals may have a plurality of driving pulses. The touch driving circuit 400 may calculate the coordinates of a touch input according to mutual capacitances.

The touch driving circuit 400 may be disposed on the circuit board 300. The touch driving circuit 400 may be implemented as an integrated circuit (IC) and may be mounted on the circuit board 300.

FIG. 7 is a plan view showing the touch detecting unit of FIG. 5 and the related elements.

For convenience of illustration, FIG. 7 shows only sensor electrodes TE, RE and PE, conductive patterns DE, touch lines TL, RL and PL, touch pads TP1 and TP2, guard lines GL1 to GL5, and ground lines GRL1 to GRL3.

Referring to FIG. 7, the touch detecting unit TDU includes a touch sensing area TSA for sensing a user's touch, and a touch peripheral area TPA disposed around the touch sensing area TSA. The touch sensing area TSA may overlap the display area DA of the display panel 100, and the touch peripheral area TPA may overlap the non-display area NDA of the display unit DU.

The touch sensing area TSA includes a first area PA1 for sensing whether a person or an object is proximate thereto, and a second area PA2 other than the first area PA1. Although the first area PA1 of the touch sensing area TSA is adjacent to the upper side of the display device 10 in the example shown in FIG. 7, the present disclosure is not limited thereto. The first area PA1 of the touch sensing area TSA may be adjacent to another side of the display device 10 or may be the center area of the touch sensing area TSA. In addition, although the first area PA1 is a part of the touch sensing area TSA in the example shown in FIG. 7, the present disclosure is not limited thereto. The touch sensing area TSA may include only the first area PA1 without the second area PA2.

The sensor electrodes TE, RE and PE may include first sensor electrodes TE, second sensor electrodes RE, and third sensor electrodes PE. In the example embodiment shown in FIG. 7, the first sensor electrode is the driving electrode TE, the second sensor electrode is the sensing electrode RE, and the third sensor electrode is the proximity sensing electrode PE.

The sensing electrodes RE may be arranged in the first direction (x-axis direction) and electrically connected to one another. The driving electrodes TE may be arranged in the second direction (y-axis direction) crossing the first direction (x-axis direction) and may be electrically connected to one another. The proximity sensing electrodes PE are arranged in the second direction (y-axis direction) and may be electrically connected to one another. Although each of the driving electrodes TE, the sensing electrodes RE and the proximity sensing electrodes PE has a diamond shape when viewed from the top in the example shown in FIG. 7, the shape of each of the driving electrodes TE, the sensing electrodes RE and the proximity sensing electrodes PE is not limited thereto.

The driving electrodes TE, the sensing electrodes RE and the proximity sensing electrodes PE may be electrically separated from each other. The driving electrodes TE, the sensing electrodes RE and the proximity sensing electrodes PE may be spaced apart from each other. The driving electrodes TE and the proximity sensing electrodes PE may be arranged in parallel in the second direction (y-axis direction). The proximity sensing electrodes PE may be surrounded by the driving electrodes TE, respectively. In order to electrically separate the sensing electrodes RE from the driving electrodes TE at their intersections, the driving electrodes TE adjacent to each other in the second direction (y-axis direction) may be connected through the first connection patterns BE1, and the sensing electrodes RE adjacent to each other in the first direction (x-axis direction) may be connected through second connection patterns BE2. In addition, in order to electrically separate the sensing electrodes RE from the proximity sensing electrodes PE at their intersections, the proximity sensing electrodes PE adjacent to each other in the second direction (y-axis direction) may be connected through third connection patterns BE3, and the sensing electrodes RE adjacent to each other in the first direction (x-axis direction) may be connected through the second connection patterns BE2.

The driving electrodes TE and the sensing electrodes RE may be disposed in both the first area PA1 and the second area PA2 of the touch sensing area TSA. On the contrary, the proximity sensing electrodes PE may be disposed only in the first area PA1 of the touch sensing area TSA. Therefore, in the first area PA1, first mutual capacitances $C_{m1}$ may be formed between the driving electrodes TE and the sensing electrodes RE, and second mutual capacitances may be formed between the driving electrodes TE and the proximity sensing electrodes PE.

The conductive patterns DE may be electrically separated from the driving electrodes TE and the sensing electrodes RE. The driving electrodes TE, the sensing electrodes RE, and the conductive patterns DE may be disposed apart from each other. In the first area PA1, the conductive patterns DE may be surrounded by the sensing electrodes RE, respectively. In the second area PA2, the conductive patterns DE may be surrounded by the driving electrodes TE and the sensing electrodes RE, respectively. The parasitic capacitance between the second electrode of the emission material layer EML and the driving electrode TE or the sensing electrode RE may be reduced due to the conductive patterns DE. When the parasitic capacitance is reduced, there is an advantage in that the mutual capacitance between the driving electrode TE and the sensing electrode RE can be charged more quickly. However, as the area of the driving electrode TE and the sensing electrode RE is reduced due to the conductive patterns DE, the mutual capacitance between the driving electrode TE and the sensing electrode RE may be reduced. As a result, they may be affected by noise. Therefore, it is desired to determine the area of the conductive patterns DE by the trade-off between the parasitic capacitance and the mutual capacitance.

The touch lines TL, RL and PL may be disposed in the touch peripheral area TPA. The touch lines TL and RL may include sensing lines RL connected to the sensing electrodes RE, first driving lines TL1 and second driving lines TL2 connected to the driving electrodes TE, and a proximity sensing line PL connected to the proximity sensing electrodes PE.

The sensing electrodes RE disposed on one side of the touch sensing area TSA may be connected to the sensing lines RL. For example, some of the sensing electrodes RE electrically connected in the first direction (x-axis direction) that are disposed at the right end may be connected to the sensing lines RL as shown in FIG. 7. The sensing lines RL may be connected to second touch pads TP2. Thus, the touch driving circuit 400 may be electrically connected to the sensing electrodes RE.

The driving electrodes TE disposed on the one side of the touch sensing area TSA may be connected to the first driving lines TL1, while the driving electrodes TE disposed on the other side of the touch sensing area TSA may be connected to the second driving lines TL2. For example, some of the driving electrodes TE electrically connected to one another in the second direction (y-axis direction) on the lowermost side may be connected to the first driving line TL1, while some of the driving electrodes TE disposed on the uppermost side may be connected to the second driving line TL2. The second driving lines TL2 may be connected to the driving electrodes TE on the upper side of the touch sensing area TSA via the left outside of the touch sensing area TSA. The first driving lines TL1 and the second driving lines TL2 may be connected to the first touch pads TP1. Thus, the touch driving circuit 400 may be electrically connected to the driving electrodes TE.

The proximity sensing electrodes PE disposed on the other side of the touch sensing area TSA may be connected to the proximity sensing line PL. For example, the uppermost one of the proximity sensing electrodes PE electrically connected with one another in the second direction (y-axis direction) may be connected to the proximity sensing line PL. The proximity sensing line PL may be extended along the left outside of the touch sensing area TSA to be connected to the proximity sensing electrodes PE on the upper side of the touch sensing area TSA. The proximity sensing line PL may be connected to first touch pads TP1. Thus, the touch driving circuit 400 may be electrically connected to the proximity sensing electrodes PE.

The display device 10 may detect whether a person or an object is proximate to the touch detecting unit TDU by sensing the amount of change in the second mutual capacitance between the driving electrodes TE and the proximity sensing electrodes PE. Proximity sensing should be able to detect the presence of a person or an object without any physical contact with the touch detecting unit TDU. Therefore, it is desired that the magnitude of the mutual capacitance for detecting proximity of a person or an object is larger than the magnitude of the mutual capacitance for detecting a touch of a person or an object. Since the magnitude of the second mutual capacitance is proportional to the magnitude of the driving electrode TE and the magnitude of the proximity sensing electrode PE, in order to increase the magnitude of the second mutual capacitance, the proximity sensing electrodes PE may be electrically connected to the single proximity sensing line PL as shown in FIG. 7.

The first guard line GL1 may be disposed on the outside of the outermost one of the sensing lines RL. In addition, the first ground line GRL1 may be disposed on the outside of the first guard line GL1. As shown in FIG. 7, the first guard line GL1 may be disposed on the right side of the rightmost one of the sensing lines RL, and the first ground line GRL1 may be disposed on the right side of the first guard line GL1.

A second guard line GL2 may be disposed between the innermost one of the sensing lines RL and the rightmost one of the first driving lines TL1. As shown in FIG. 7, the innermost one of the sensing lines RL may be the leftmost one of the sensing lines RL. The second guard line GL2 may be disposed between the rightmost one of the first driving lines TL1 and the second ground line GRL2.

A third guard line GL3 may be disposed between the innermost one of the sensing lines RL and the second ground line GRL2. The second ground line GRL2 may be connected to the rightmost one of the first touch pads TP1 and the leftmost one of the second touch pads TP2.

A fourth guard line GL4 may be disposed on the outside of the outermost one of the second driving lines TL2. As shown in FIG. 7, the fourth guard line GL4 may be disposed on the left side of the leftmost one of the second driving lines TL2.

In addition, the third ground line GRL3 may be disposed on the outside of the fourth guard line GL4. As shown in FIG. 7, the fourth guard line GL4 may be disposed on the left side and upper side of the leftmost and uppermost one of the second driving lines TL2, and the third ground line GRL3 may be disposed on the left side and upper side of the fourth guard line GL4.

A fifth guard line GL5 may be disposed on the inside of the innermost one of the second driving lines TL2. As shown in FIG. 7, the fifth guard line GL5 may be disposed between the rightmost one of the second driving lines TL2 and the sensing electrodes RE.

A ground voltage may be applied to the first ground line GRL1, the second ground line GRL2 and the third ground line GRL3. In addition, a ground voltage may be applied to the first guard line GL1, the second guard line GL2, the third guard line GL3, the fourth guard line GL4 and the fifth guard line GL5.

According to the example embodiment shown in FIG. 7, the driving electrodes TE and the sensing electrodes RE may be disposed in both the first area PA1 and the second area PA2 of the touch sensing area TSA, and the proximity sensing electrodes PE may be disposed only in the first area PA1 of the touch sensing area TSA. Therefore, in the first area PA1, first mutual capacitances $C_{m1}$ may be formed between the driving electrodes TE and the sensing electrodes RE, and second mutual capacitances may be formed between the driving electrodes TE and the proximity sensing electrodes PE. As a result, touch sensing as well as proximity sensing can be performed simultaneously. On the other hand, in the second area PA2, since only the first mutual capacitances $C_{m1}$ are formed between the driving electrodes TE and the sensing electrodes RE, only touch sensing can be performed.

According to the example embodiment of the present disclosure shown in FIG. 7, the first ground line GRL1, the second ground line GRL2, and the third ground line GRL3 are disposed on the uppermost side, the leftmost side, and the rightmost side of the display panel 100, respectively. In addition, ground voltage is applied to the first ground line GRL1, the second ground line GRL2 and the third ground line GRL3. Accordingly, when static electricity is applied from the outside, the static electricity can be discharged to the first ground line GRL1, the second ground line GRL2, and the third ground line GRL3.

In addition, according to the example embodiment of the present disclosure shown in FIG. 7, the first guard line GL1 is disposed between the outermost one of the sensing lines RL and the first ground line GRL1, so that it can reduce the influence on the outermost one of the sensing lines RL by a change in the voltage of the first ground line GRL1. The second guard line GL2 is disposed between the innermost one of the sensing lines RL and the outermost one of the first driving line TL1. Therefore, the second guard line GL2 can reduce the influence by a change in the voltage on the innermost one of the sensing lines RL and on the outermost one of the first driving lines TL1 by a change in the voltage. The third guard line GL3 is disposed between the innermost one of the sensing lines RL and the second ground line GRL2, so that it can reduce the influence on the innermost one of the sensing lines RL by a change in the voltage of the second ground line GRL2. The fourth guard line GL4 is disposed between the outermost one of the second sensing lines TL2 and the third ground line GRL3, so that it can reduce the influence on the second driving line TL2 by a change in the voltage of the third ground line GRL3. The fifth guard line GL5 is disposed between the innermost one of the second driving lines TL2 and the touch electrodes TE and RE, so that it can suppress the innermost one of the second driving lines TL2 and the touch electrodes TE and RE from influencing mutually.

Figure 8:
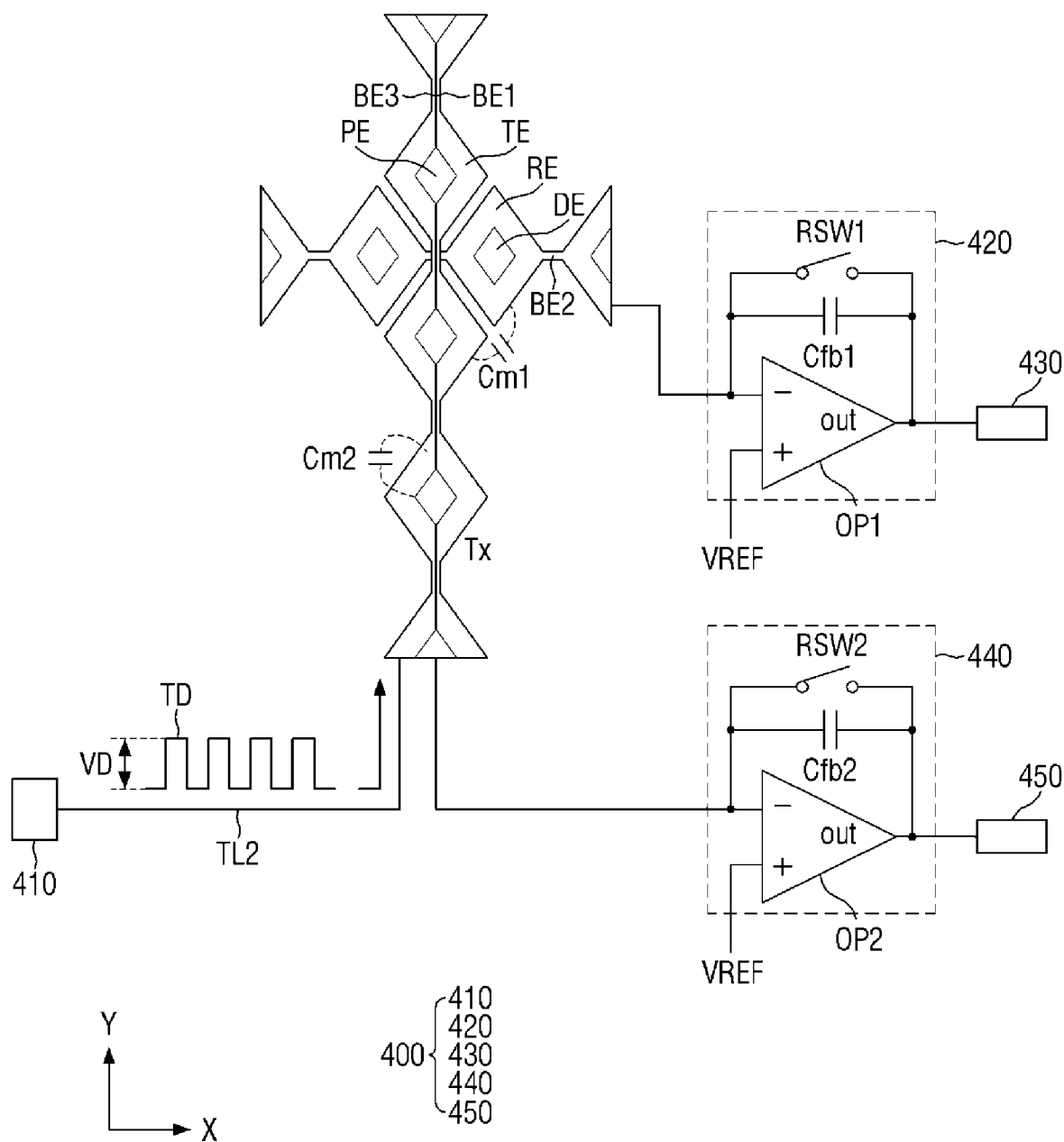
FIG. 8 is an example of a method of detecting the amount of change in a first mutual capacitance and the amount of change in a second mutual capacitance in the first area of FIG. 7.
Figure 9:
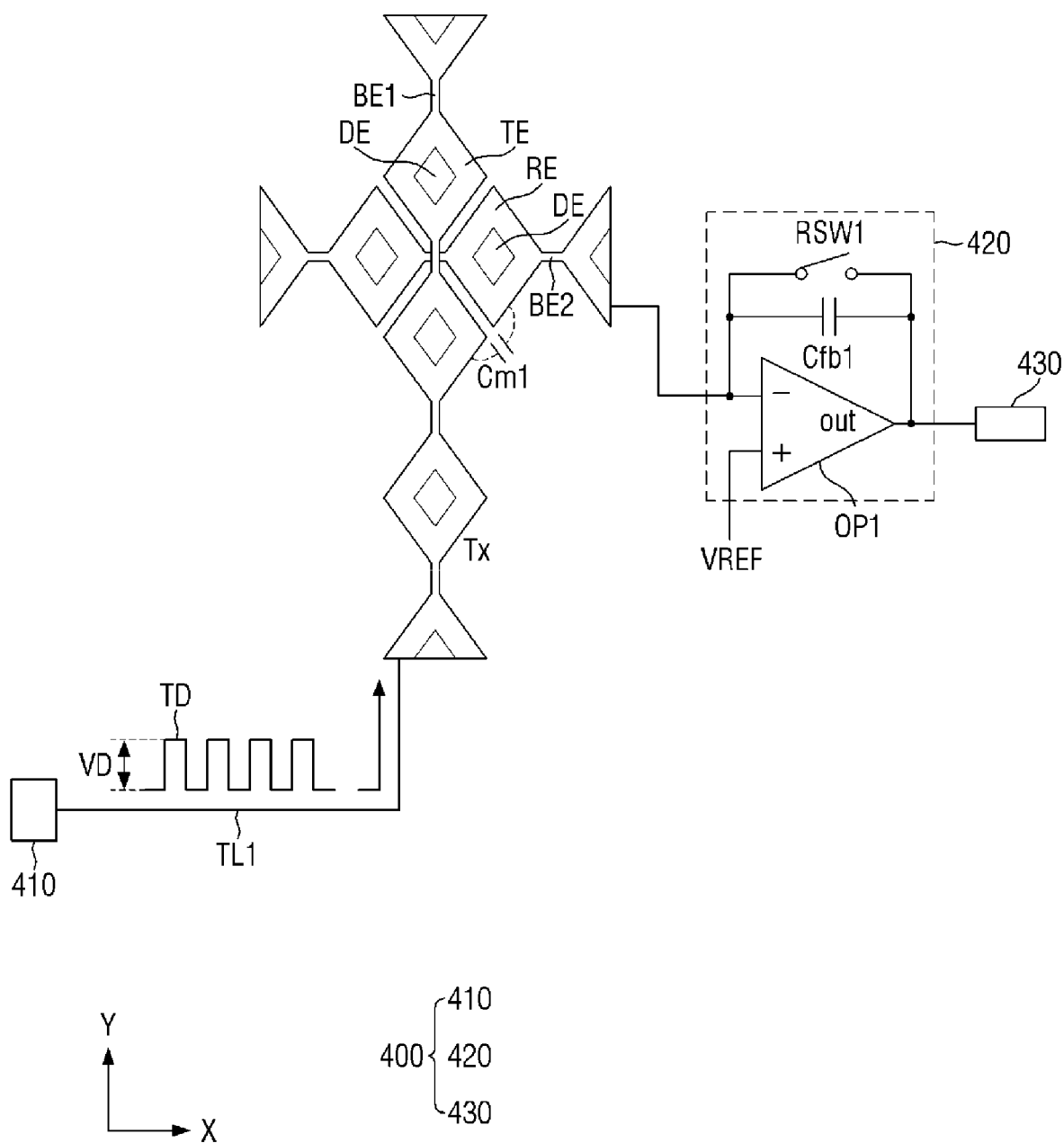
FIG. 9 is an example of a method of detecting the amount of change in a first mutual capacitance in the second area of FIG. 7.

FIG. 8 is a view showing an example of a method for detecting the amount of change in a first mutual capacitance and the amount of change in a second mutual capacitance in the first area of FIG. 7. FIG. 9 is a view showing an example of a method for detecting the amount of change in a first mutual capacitance in the second area of FIG. 7.

For convenience of illustration, FIGS. 8 and 9 shows only driving electrodes TE arranged in a row and electrically connected to each other in the second direction (y-axis direction), and sensing electrodes RE arranged in a row and electrically connected to each other in the first direction (x-axis direction).

Referring to FIGS. 8 and 9, in the first area PA1, a first mutual capacitance $C_{m1}$ may be formed between the driving electrode TE and the sensing electrode RE, and a second mutual capacitance $C_{m2}$ may be formed between the driving electrode TE and the proximity sensing electrode PE. In the second area PA2, the first mutual capacitance $C_{m1}$ may be formed between the driving electrode TE and the sensing electrode RE.

The touch driving circuit 400 may include a touch driving signal output 410, a first touch detector 420, a first analog-to-digital converter 430, a second touch detector 440, and a second analog-to-digital converter 450.

The touch driving signal output 410 may output a touch driving signal TD to the driving electrodes TE through the first driving line TL1, and the touch driving signal TD to the driving electrodes TE through the second driving line TL2. The touch driving signal TD may include a plurality of pulses.

The touch driving signal output 410 may output the touch driving signal TD to the driving lines TL1 and TL2 in a predetermined order. For example, the touch driving signal output 410 may output the touch driving signal TD sequentially from the driving electrodes TE disposed on the left side of the touch sensing area TSA of FIG. 7 to the driving electrodes TE disposed on the right side of the touch sensing area TSA.

The first touch detector 420 detects the voltage charged in the first mutual capacitance $C_{m1}$ through the sensing line RL electrically connected to the sensing electrodes RE. The first touch detector 420 may include a first operational amplifier OA1, a first feedback capacitor $C_{fb1}$, and a first reset switch RSW1. The first operational amplifier OA1 may include a first input terminal (−), a second input terminal (+), and an output terminal (out). The first input terminal (−) of the first operational amplifier OA1 may be connected to the sensing line RL, the initialization voltage $V_{REF}$ may be supplied to the second input terminal (+), and the output terminal (out) of the first operational amplifier OA1 may be connected to a first storage capacitor Cs1. The first storage capacitor Cs1 is connected between the output terminal (out) and the ground to store the output voltage $V_{out1}$ of the first operational amplifier OA1. The first feedback capacitor $C_{fb1}$ and the first reset switch RSW1 may be connected in parallel between the first input terminal (−) and the output terminal (out) of the first operational amplifier OA1. The first reset switch RSW1 controls the connection of both ends of the first feedback capacitor $C_{fb1}$. When the first reset switch RSW1 is turned on so that both ends of the first feedback capacitor $C_{fb1}$ are connected, the first feedback capacitor $C_{fb1}$ may be reset.

The output voltage $V_{out1}$ of the first operational amplifier OA1 may be defined as in Equation 1 below:

$$Vout1 = \frac{Cm1 \times Vt1}{Cfb1} \quad \text{[Equation 1]}$$

where $V_{out1}$ denotes the output voltage of the first operational amplifier OA1, $C_{m1}$ denotes the first mutual capacitance, $C_{fb1}$ denotes the capacitance of the first feedback capacitor, and $V_{t1}$ denotes the voltage charged in the first mutual capacitance $C_{m1}$.

The first analog-to-digital converter 430 may convert the output voltage $V_{out1}$ stored in the first storage capacitor $C_{s1}$ into first digital data and output the first digital data.

The second touch detector 440 detects the voltage charged in the second mutual capacitance $C_{m2}$ through the proximity sensing line PL connected to the proximity sensing electrodes PE. The second touch detector 440 may include a second operational amplifier OA2, a second feedback capacitor $C_{fb2}$, and a second reset switch RSW2. The second operational amplifier OA2 may include a first input terminal (−), a second input terminal (+), and an output terminal (out). The first input terminal (−) of the second operational amplifier OA2 may be connected to the proximity sensing line PL, the initialization voltage $V_{REF}$ may be supplied to the second input terminal (+), and the output terminal (out) of the second operational amplifier OA2 may be connected to a second storage capacitor $C_{s2}$. The second storage capacitor $C_{s2}$ is connected between the output terminal (out) and the ground to store the output voltage $V_{out2}$ of the second operational amplifier OA2. The second feedback capacitor $C_{fb2}$ and the second reset switch RSW2 may be connected in parallel between the first input terminal (−) and the output terminal (out) of the second operational amplifier OA2. The second reset switch RSW2 controls the connection of both ends of the second feedback capacitor $C_{fb2}$. When the second reset switch RSW2 is turned on such that both ends of the second feedback capacitor $C_{fb2}$ are connected, the second feedback capacitor $C_{fb2}$ may be reset.

The output voltage $V_{out2}$ of the second operational amplifier OA2 may be defined as in Equation 2 below:

$$Vout2 = \frac{Cm2 \times Vt2}{Cfb2} \quad \text{[Equation 2]}$$

where $V_{out2}$ denotes the output voltage of the second operational amplifier OA2, $C_{m2}$ denotes the second mutual capacitance, $C_{fb2}$ denotes the capacitance of the second feedback capacitor, and $V_{t2}$ denotes the voltage charged in the second mutual capacitance $C_{m2}$.

The second analog-to-digital converter 450 may convert the output voltage $V_{out2}$ stored in the second storage capacitor $C_{s2}$ into second digital data and output the second digital data.

The touch driving circuit 400 may be driven in a touch sensing mode (or a first mode) and a proximity sensing mode (or a second mode). In the touch sensing mode, the touch driving circuit 400 may be driven to detect the amounts of change in the first mutual capacitances $C_{m1}$ of the first area PA1 and the second area PA2. In the proximity sensing mode, the touch driving circuit 400 may be driven to detect the amounts of change in the first mutual capacitances $C_{m1}$ and changes in the second mutual capacitances $C_{m2}$ of the first area PA1.

For example, the touch driving signal output 410 may output the touch driving signal TD to the driving electrodes TE through the driving lines TL1 and TL2 in the touch sensing mode. The first touch detector 420 may detect a voltage charged in the first mutual capacitance $C_{m1}$ through the sensing line RL electrically connected to the sensing electrodes RE in the touch sensing mode. The first analog-to-digital converter 430 may convert the output voltage $V_{out1}$ of the first touch detector 420 stored in the first storage capacitor $C_{s1}$ into first digital data in the touch sensing mode. The touch driving circuit 400 may calculate touch coordinates by analyzing the first digital data in the touch sensing mode. For example, the touch driving circuit 400 may calculate first digital data equal to or greater than a first threshold value as first touch data, and may calculate the coordinates of the first mutual capacitance $C_{m1}$ corresponding to the first touch data as touch coordinates.

In addition, the touch driving signal output 410 may output the touch driving signal TD to the driving electrodes TE through the driving lines TL1 and TL2 in the proximity sensing mode. The first touch detector 420 may detect the voltage charged in the first mutual capacitance $C_{m1}$ through the sensing line RL electrically connected to the sensing electrodes RE in the proximity sensing mode. The first analog-to-digital converter 430 may convert the output voltage $V_{out1}$ of the first touch detector 420 stored in the first storage capacitor $C_{s1}$ into first digital data in the proximity sensing mode. The second touch detector 440 may sense a voltage charged in the second mutual capacitance $C_{m2}$ through the proximity sensing line PL electrically connected to the proximity sensing electrodes PE in the proximity sensing mode. The second analog-to-digital converter 450 may convert the output voltage $V_{out2}$ of the second touch detector 440 stored in the second storage capacitor $C_{s2}$ into second digital data in the proximity sensing mode to output it. The touch driving circuit 400 may determine whether a person or an object is proximate by analyzing the first digital data and the second digital data in the proximity sensing mode. For example, in the proximity sensing mode, the touch driving circuit 400 may determine that a person or an object is proximate when the sum of the first digital data and the second digital data is greater than or equal to a second threshold value.

In order to perform the proximity sensing, it is required to detect the presence of a person or an object without any physical contact with the touch detecting unit TDU. Therefore, it is desired that the magnitude of the mutual capacitance for detecting proximity of a person or an object is larger than the magnitude of the mutual capacitance for sensing a touch of a person or an object. To this end, the voltage difference VD between the high voltage and the low voltage of the touch driving signal TD applied in the proximity sensing mode may be greater than the voltage difference VD between the high voltage and the low voltage of the touch driving signal TD applied in the touch sensing mode. Alternatively, the period during which the second touch detector 440 detects the voltage charged in the second mutual capacitance $C_{m2}$ through the proximity sensing line PL in the proximity sensing mode may be longer than the period during which the second touch detector 440 detects the voltage charged in the second mutual capacitance $C_{m2}$ through the proximity sensing line PL in the touch sensing mode.

According to the example embodiment shown in FIGS. 8 and 9, the touch detecting unit TDU detects the amounts of change in the first mutual capacitances and the amount of change in the second mutual capacitance in the first area PA1, thereby determining whether a person or an object is proximate thereto. Therefore, the display device 10 can detect whether a person or an object is proximate without a proximity sensor. Accordingly, it is possible to prevent reduce the bezel width of the display device 10 where otherwise the proximity sensor is disposed. The bezel refers to the non-display area NDA disposed around the display area DA where an image is displayed.

Figure 10:
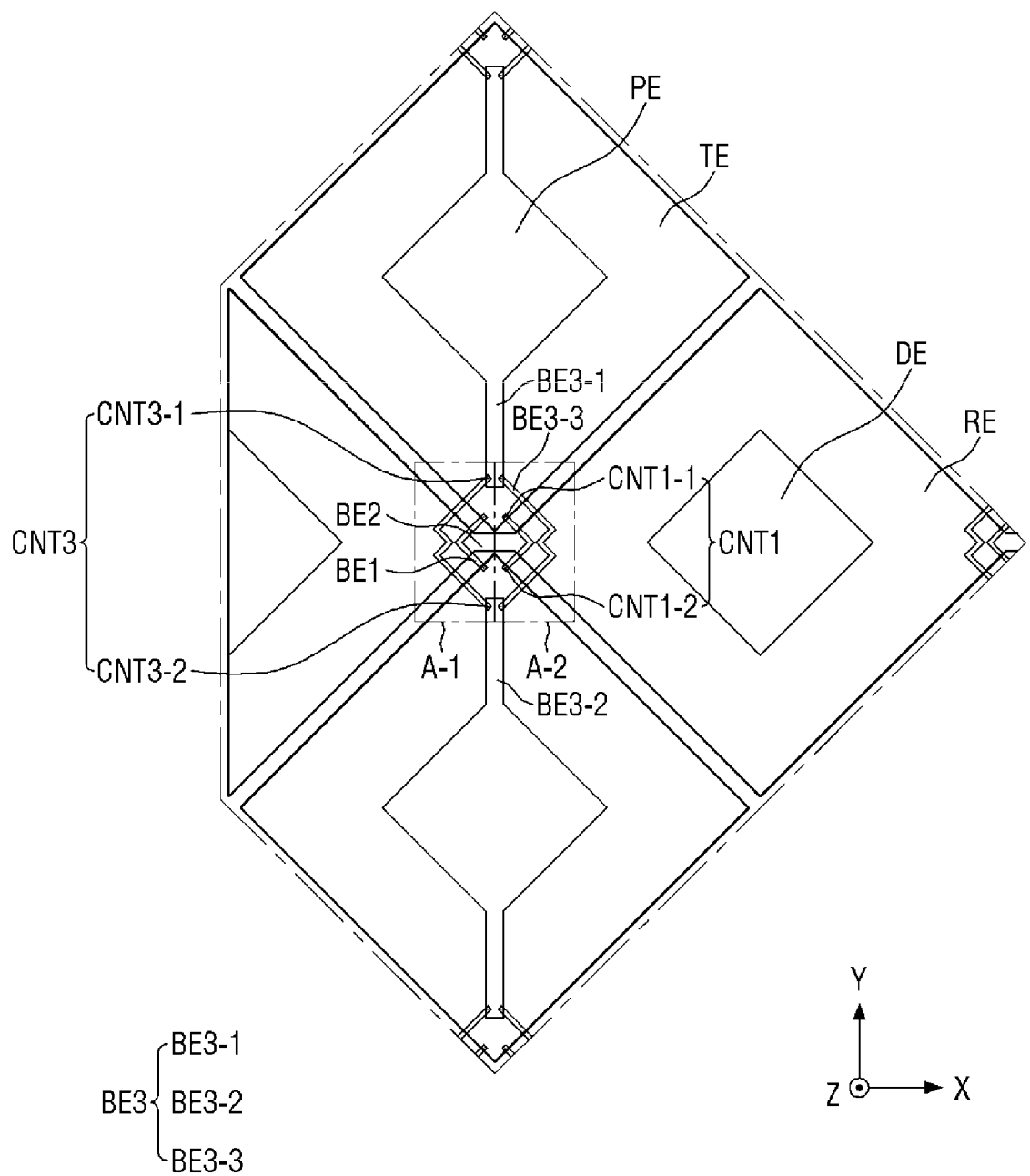
FIG. 10 is an enlarged plan view showing an example of area A of FIG. 7.

FIG. 10 is an enlarged plan view showing an example of area A of FIG. 7.

Referring to FIG. 10, the sensing electrodes RE may be arranged in the first direction (x-axis direction) and electrically connected to one another. The driving electrodes TE may be arranged in the second direction (y-axis direction) and may be electrically connected to one another. The proximity sensing electrodes PE are arranged in the second direction (y-axis direction) and may be electrically connected to one another.

The driving electrodes TE, the sensing electrodes RE, the proximity sensing electrodes PE, and the conductive patterns DE may be electrically separated from each other. The driving electrodes TE, the sensing electrodes RE, the proximity sensing electrodes PE, and the conductive patterns DE may be spaced apart from each other. The driving electrodes TE and the proximity sensing electrodes PE may be arranged in parallel in the second direction (y-axis direction). The proximity sensing electrodes PE may be surrounded by the driving electrodes TE, respectively. The conductive patterns DE may be surrounded by the sensing electrodes RE, respectively.

As shown in FIG. 10, the driving electrodes TE and the sensing electrodes RE may have substantially the same size. The proximity sensing electrodes PE and the conductive patterns DE may be substantially the same size. The size of the driving electrodes TE may be larger than that of the proximity sensing electrodes PE. The size of the driving electrodes TE may be larger than that of the conductive patterns DE. The size of the sensing electrodes RE may be larger than that of the proximity sensing electrodes PE. The size of the sensing electrodes RE may be larger than that of the conductive patterns DE. Although each of the driving electrodes TE, the sensing electrodes RE, the proximity sensing electrodes PE, and the conductive patterns DE has a diamond shape when viewed from the top in the example shown in FIG. 10, the shape of each of the driving electrodes TE, the sensing electrodes RE, the proximity sensing electrodes PE, and the conductive patterns DE is not limited thereto.

In order to electrically separate the sensing electrodes RE from the driving electrodes TE at their intersections, the driving electrodes TE adjacent to each other in the second direction (y-axis direction) may be connected through the first connection patterns BE1, and the sensing electrodes RE adjacent to each other in the first direction (x-axis direction) may be connected through second connection patterns BE2. In addition, in order to electrically separate the sensing electrodes RE from the proximity sensing electrodes PE at their intersections, the proximity sensing electrodes PE adjacent to each other in the second direction (y-axis direction) may be connected through third connection patterns BE3, and the sensing electrodes RE adjacent to each other in the first direction (x-axis direction) may be connected through the second connection patterns BE2.

The first connection pattern BE1 may be formed on a different layer from the driving electrodes TE and may be connected to the driving electrodes TE through the first contact holes CNT1. For example, the first connection pattern BE1 may be formed in the first layer, and the driving electrodes TE may be formed in the second layer shown in FIG. 14. The second layer may be disposed on the first layer. The first layer is defined as a layer disposed on the thin-film encapsulation layer TFEL. Therefore, the first layer may be covered by the first touch insulating layer TINS1. The second layer is defined as a layer disposed on the first touch insulating layer TINS1. Therefore, the second layer may be covered by the second touch insulating layer TINS2.

Each of the first connection patterns BE1 may be bent at least once. In FIG. 10, the first connection patterns BE1 are bent in the shape of "<" or ">", but the shape of the first connection patterns BE1 is not limited thereto. In addition, since the driving electrodes TE adjacent to each other in the second direction (y-axis direction) are connected by the plurality of first connection patterns BE1, even if any of the first connection patterns BE1 is disconnected, the driving electrodes TE can still be stably connected with each other. Although two adjacent ones of the driving electrodes TE are connected by two first connection patterns BE1 in the example shown in FIG. 10, but the number of first connection patterns BE1 is not limited thereto.

The second connection pattern BE2 is formed on the same layer as the sensing electrodes RE and may have a shape extended from the sensing electrodes RE. The sensing electrodes RE and the second connection pattern BE2 may be formed of the same material. For example, the sensing electrodes RE and the second connection pattern BE2 may be formed in the second layer.

As shown in FIG. 10, the third connection pattern BE3 may include a (3-1) connection pattern BE3-1, a (3-2) connection pattern BE3-2, and a (3-3) connection pattern BE3-3. Each of the (3-1) connection pattern BE3-1 and the (3-2) connection pattern BE3-2 may be electrically separated from the driving electrode TE. Each of the (3-1) connection pattern BE3-1 and the (3-2) connection pattern BE3-2 may be spaced apart from the driving electrode TE.

The (3-1) connection pattern BE3-1 may be connected to the proximity sensing electrode PE surrounded by one of the driving electrodes TE adjacent to each other in the second direction (y-axis direction). The (3-2) connection pattern BE3-2 may be connected to the proximity sensing electrode PE surrounded by another one of the driving electrodes TE adjacent to each other in the second direction (y-axis direction).

Each of the (3-3) connection patterns BE3-3 may be connected to the (3-1) connection pattern BE3-1 and the (3-2) connection pattern BE3-2. The (3-3) connection patterns BE3-3 may be formed on a different layer from the (3-1) connection patterns BE3-1 and the (3-2) connection patterns BE3-2, and may be connected to the (3-1) connection pattern BE3-1 and the (3-2) connection pattern BE3-2 through the third contact holes CNT3. For example, the (3-3) connection patterns BE3-3 may be formed in the first layer shown in FIG. 14, and the proximity sensing electrodes PE, the (3-1) connection pattern BE3-1, and the (3-2) connection pattern BE3-2 may be formed in the second layer shown in FIG. 14. The second layer may be disposed on the first layer.

Each of the (3-3) connection patterns BE3-3 may be bent at least once. As shown in FIG. 10, the (3-3) connection pattern BE3-3 may be bent more than the first connection pattern BE1 is bent, but the present disclosure is not limited thereto. In FIG. 10, the (3-3) connection pattern BE3-3 is bent three times, but the number of bending of the (3-3) connection pattern BE3-3 is not limited thereto. In addition, since the proximity sensing electrodes PE adjacent to each other in the second direction (y-axis direction) are connected by a plurality of the (3-3) connection patterns BE3-3, even if any of the (3-3) connection patterns BE3-3 is disconnected, the proximity sensing electrodes PE can still be stably connected with each other. Although two adjacent ones of the proximity sensing electrodes PE are connected by two (3-3) connection patterns BE3-3 in the example shown in FIG. 10, but the number of the (3-3) connection patterns BE3-3 is not limited thereto.

According to the example embodiment shown in FIG. 10, the first connection patterns BE1 connecting the driving electrodes TE adjacent to one another in the second direction (y-axis direction) and the (3-3) connection patterns BE3-3 electrically connecting the driving electrodes TE adjacent to one another in the second direction (y-axis direction) may be formed in the first layer, whereas the driving electrodes TE, the sensing electrodes RE, the proximity sensing electrodes PE, the second connection pattern BE2, the (3-1) connection pattern BE3-1, and the (3-2) connection pattern BE3-2 may be formed in the second layer different from the first layer. Therefore, the driving electrodes TE, the sensing electrodes RE, and the proximity sensing electrodes PE may be electrically separated from each other at their intersections, the sensing electrodes RE may be electrically connected with one another in the first direction (x-axis direction), and the driving electrodes TE and the proximity sensing electrodes PE may be electrically connected with each other in the second direction (y-axis direction).

Figure 11:
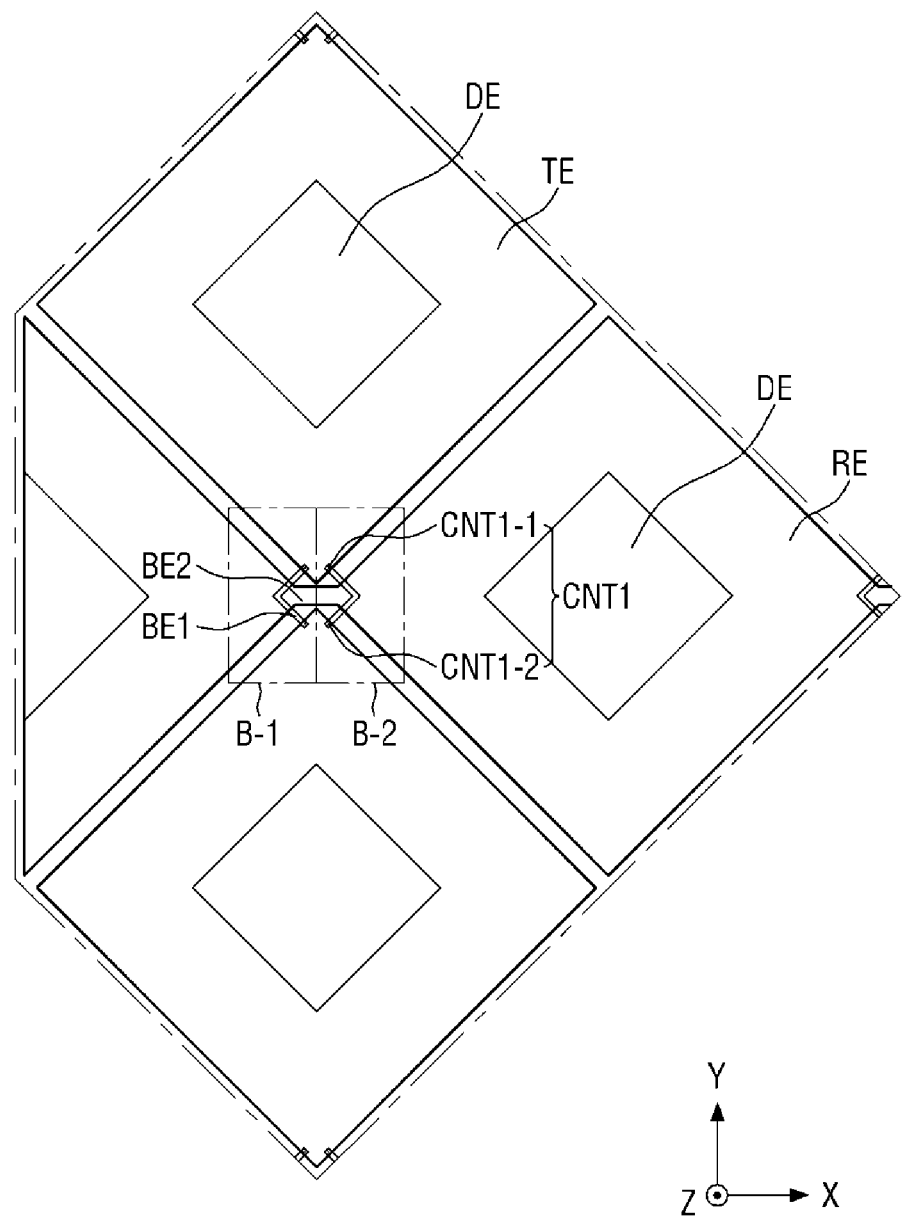
FIG. 11 is an enlarged plan view showing an example of area B of FIG. 7.

FIG. 11 is an enlarged plan view showing an example of area B of FIG. 7.

Figure 12A:
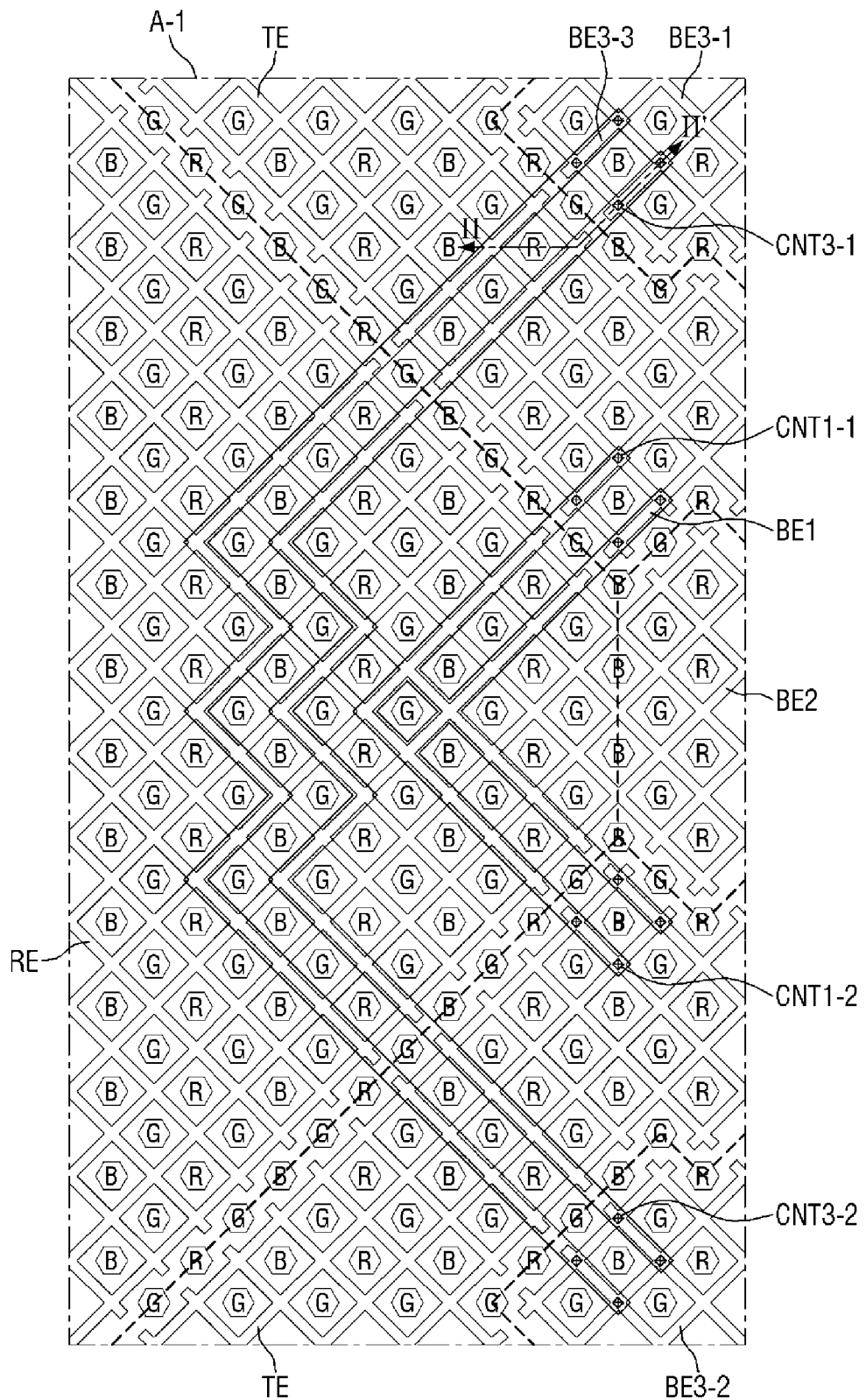
FIGS. 12A and 12B are enlarged plan views showing areas A-1 and A-2 of FIG. 10, respectively.
Figure 12B:
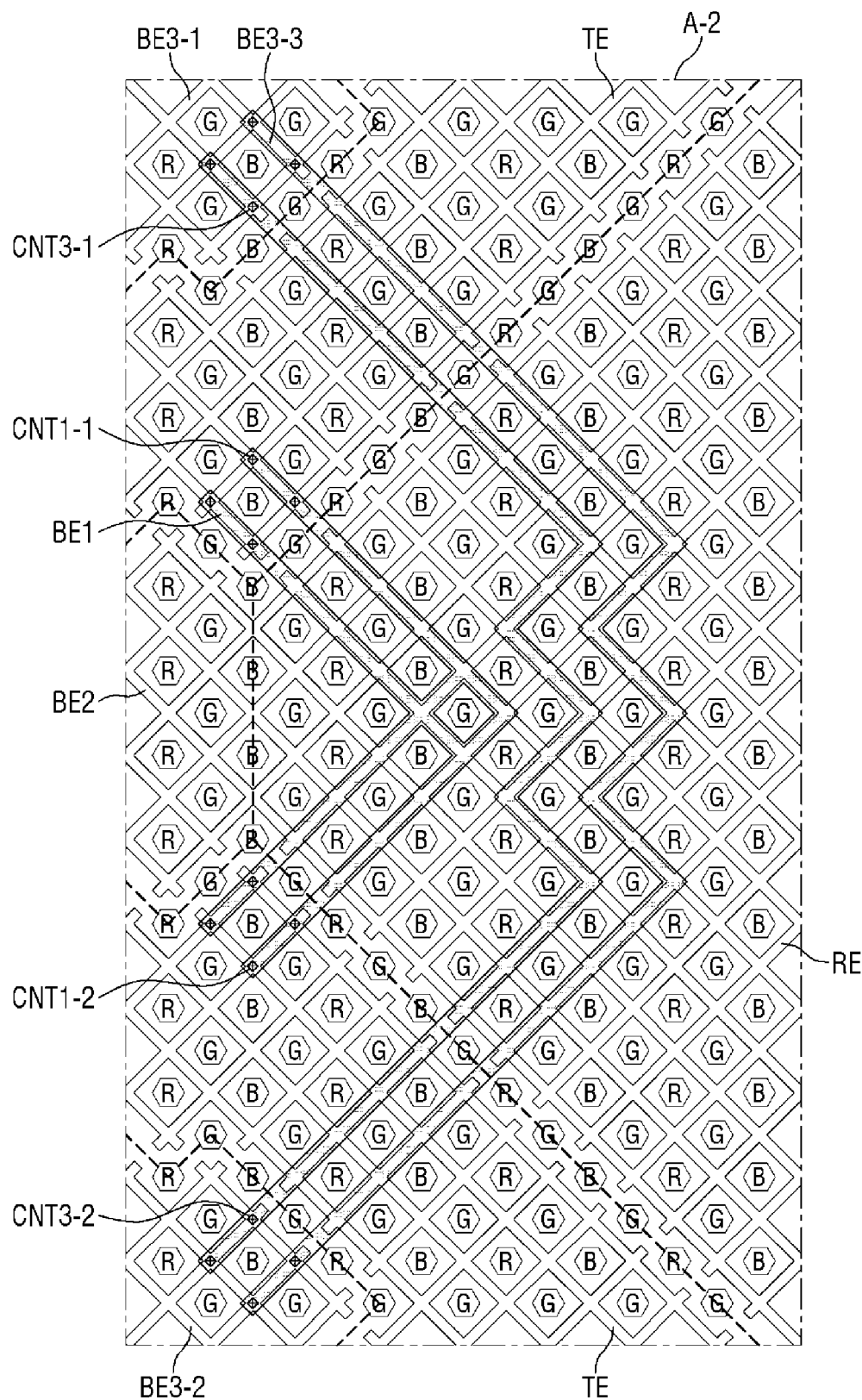

Referring to FIG. 11, the second area PA2 is different from the structure of the first area PA in that the proximity sensing electrodes PE are replaced with the conductive patterns DE and the third connection patterns BE for electrically connecting the proximity sensing electrodes PE with one another in the second direction (y-axis direction) are eliminated. Therefore, the driving electrodes TE, the sensing electrodes RE, the conductive patterns DE, the first connection patterns BE1, and the second connection patterns BE2 shown in FIG. 11 are substantially identical to those described above with reference to FIG. 10. Therefore, the driving electrodes TE, the sensing electrodes RE, the conductive patterns DE, the first connection patterns BE1, and the second connection patterns BE2 shown in FIG. 11 will not be described again. FIGS. 12A and 12B are enlarged plan views showing areas A-1 and A-2 of FIG. 10, respectively.

Referring to FIGS. 12A and 12B, the driving electrodes TE, the sensing electrodes RE, the first connection patterns BE1, the second connection patterns BE2, the (3-1) connection patterns BE3-1, the (3-2) connection patterns BE3-2, and the (3-3) connection patterns BE3-3 may be formed in a mesh shape. The proximity sensing electrodes PE and the conductive patterns DE may also be formed in a mesh shape. When the touch sensing layer TSL including the driving electrodes TE, the sensing electrodes RE, and the proximity sensing electrodes PE is formed directly on the thin-film encapsulation layer TFEL as shown in FIG. 5, the distance between the second electrode of the emission material layer EML and each of the driving electrodes TE, the sensing electrodes RE, and the proximity sensing electrodes PE of the touch sensing layer TSL becomes close one another. Therefore, large parasitic capacitance may be formed between the second electrode of the emission material layer EML and each of the driving electrodes TE, the sensing electrodes RE, and the proximity sensing electrodes PE of the touch sensing layer TSL. Since the parasitic capacitance is proportional to the overlapping area between the second electrode of the emission material layer EML and each of the driving electrodes TE, the sensing electrodes RE, and the proximity sensing electrodes PE of the touch sensing layer TSL. Therefore, in order to reduce the parasitic capacitance, it is desired that each of the driving electrodes TE, the sensing electrodes RE, and the proximity sensing electrodes PE may be formed in a mesh shape.

Since the driving electrodes TE, the sensing electrode RE, the proximity sensing electrodes PE, the conductive patterns DE, the second connection patterns BE2, the (3-1) connection patterns BE-1 and the (3-2) connection patterns BE3-2 are formed on the same layer, they may be spaced apart from each other. There may be gaps between the driving electrode TE and the sensing electrode RE, between the driving electrode TE and the proximity sensing electrode PE, between the driving electrode TE and the second connection pattern BE2, between the driving electrode TE and the (3-1) connection pattern BE3-1, between the driving electrode TE and the (3-2) connection pattern BE3-2, and between the sensing electrode RE and the conductive pattern DE. For convenience of illustration, the boundary between the driving electrode TE and the sensing electrode RE, the boundary between the driving electrode TE and the second connection pattern BE2, the boundary between the driving electrode TE and the (3-1) connection pattern BE3-1, and the boundary between the sensing electrode RE and the second connection pattern BE2 are indicated by dashed lines in FIGS. 12A and 12B.

The first connection patterns BE1 may be connected to the driving electrodes TE through the first contact holes CNT1, respectively. One end of each of the first connection patterns BE1 may be connected to one of the driving electrodes TE adjacent to each other in the second direction (y-axis direction) through a (1-1) contact hole CNT1-1. The other end of each of the first connection patterns BE1 may be connected to another one of the driving electrodes TE adjacent to each other in the second direction (y-axis direction) through a (1-2) contact hole CNT1-2. The first connection patterns BE1 may overlap the driving electrodes TE and the sensing electrode RE. Alternatively, the first connection pattern BE1 may overlap the second connection pattern BE2 instead of the sensing electrode RE. Alternatively, the first connection pattern BE1 may overlap the sensing electrode RE as well as the second connection pattern BE2. Since the first connection pattern BE1 is formed on a different layer from the driving electrodes TE, the sensing electrodes RE, and the second connection pattern BE2, it is possible to prevent a short-circuit from being created in the sensing electrode RE and/or the second connection pattern BE2 even though they overlap the sensing electrode RE and/or the second connection pattern BE2.

The second connection pattern BE2 may be disposed between the sensing electrodes RE. The second connection pattern BE2 is formed on the same layer as the sensing electrodes RE and may be extended from each of the sensing electrodes RE. Therefore, the second connection pattern BE2 may be connected to the sensing electrodes RE without any additional contact hole.

The (3-1) connection pattern BE3-1 may be disposed between one of the proximity sensing electrodes PE adjacent to one another in the second direction (y-axis direction) and the (3-3) connection pattern BE3-3. The (3-1) connection pattern BE3-1 may be formed on the same layer as the proximity sensing electrode PE. Therefore, the (3-1) connection pattern BE3-1 may be extended from one of the proximity sensing electrodes PE adjacent to one another in the second direction (y-axis direction). The (3-1) connection pattern BE3-1 may be connected to a plurality of (3-3) connection patterns BE3-3. The (3-1) connection pattern BE3-1 may be connected to one end of the (3-3) connection pattern BE3-3 through a (3-1) contact hole CNT3-1.

The (3-2) connection pattern BE3-2 may be disposed between another one of the proximity sensing electrodes PE adjacent to one another in the second direction (y-axis direction) and the (3-3) connection pattern BE3-3. The (3-2) connection pattern BE3-2 may be formed on the same layer as the proximity sensing electrode PE. Therefore, the (3-2) connection pattern BE3-2 may be extended from another one of the proximity sensing electrodes PE adjacent to one another in the second direction (y-axis direction). The (3-2) connection pattern BE3-2 may be connected to a plurality of (3-3) connection patterns BE3-3. The (3-2) connection pattern BE3-2 may be connected to the other end of the (3-3) connection pattern BE3-3 through a (3-2) contact hole CNT3-2.

The (3-3) connection pattern BE3-3 may be connected to each of the (3-1) connection pattern BE3-1 and the (3-2) connection pattern BE3-2 through the third contact holes CNT3. One end of the (3-3) connection pattern BE3-3 may be connected to the (3-1) connection pattern BE3-1 through the (3-1) contact hole CNT3-1. The other end of the (3-3) connection pattern BE3-3 may be connected to the (3-2) connection pattern BE3-2 through the (3-2) contact hole CNT3-2. The (3-3) connection patterns BE3-3 may overlap the driving electrodes TE and the sensing electrode RE. Alternatively, the (3-3) connection pattern BE3-3 may overlap the second connection pattern BE2 instead of the sensing electrode RE. Alternatively, the (3-3) connection pattern BE3-3 may overlap the sensing electrode RE and the second connection pattern BE2. Since the (3-3) connection pattern BE3-3 is formed on a different layer from the driving electrodes TE, the sensing electrodes RE and the second connection pattern BE2, it is possible to prevent a short-circuit from being created in the sensing electrode RE and/or the second connection pattern BE2 even though they overlap the sensing electrode RE and/or the second connection pattern BE2.

Sub-pixels R, G and B may include a first sub-pixel R emitting a first color, a second sub-pixel G emitting a second color, and a third sub-pixel B emitting a third color. Although the first sub-pixel R is a red sub-pixel, the second sub-pixel G is a green sub-pixel, and the third sub-pixel B is a blue sub-pixel in the example shown in FIGS. 12A and 12B, the present disclosure is not limited thereto. Although the first sub-pixel R, the second sub-pixel G, and the third sub-pixel B have a hexagonal shape when viewed from the top in the example shown in FIGS. 12A and 12B, the present disclosure is not limited thereto. The first sub-pixel R, the second sub-pixel G, and the third sub-pixel B may have a polygonal shape other than a hexagon, or a circular or elliptical shape when viewed from the top. In addition, the first sub-pixel R, the second sub-pixel G, and the third sub-pixel B all have substantially the same size, in the example shown in FIGS. 12A and 12B, the sizes of the sub-pixels R, G and B are not limited thereto. For example, the third sub-pixel B may have the largest size while the second sub-pixel G may have the smallest size. Alternatively, the size of the first sub-pixel R may be substantially equal to the size of the third sub-pixel B, while the size of the second sub-pixel G may be smaller than the size of each of the first sub-pixel R and the third sub-pixel B.

A pixel P refers to a group of sub-pixels capable of representing grayscales. In the example shown in FIGS. 12A and 12B, a pixel P includes a first sub-pixel R, two second sub-pixels G, and a third sub-pixel B. It is, however, to be understood that the present disclosure is not limited thereto. For example, a pixel P may include a first sub-pixel PX1, a second sub-pixel PX2, and a third sub-pixel PX3.

Since the driving electrodes TE, the sensing electrodes RE, the proximity sensing electrodes PE, the conductive patterns DE, the first connection patterns BE1, the second connection patterns BE2, the (3-1) connection patterns BE3-1, the (3-2) connection patterns BE3-2, and the (3-3) connection patterns BE3-3 are formed in a mesh shape, the sub-pixels R, G and B may not overlap the driving electrodes TE, the sensing electrodes RE, the proximity sensing electrodes PE, the conductive patterns DE, the first connection patterns BE1, the second connection patterns BE2, the (3-1) connection patterns BE3-1, the (3-2) connection patterns BE3-2, and the (3-3) connection patterns BE3-3. Accordingly, it is possible to prevent the brightness of the light emitted from the sub-pixels R, G and B from decreasing because the light emitted from the sub-pixels R, G and B is blocked by the driving electrodes TE, the sensing electrodes RE, the proximity sensing electrodes PE, the conductive patterns DE, the first connection patterns BE1, the second connection patterns BE2, the (3-1) connection patterns BE3-1, the (3-2) connection patterns BE3-2, and the (3-3) connection patterns BE3-3.

Figure 13A:
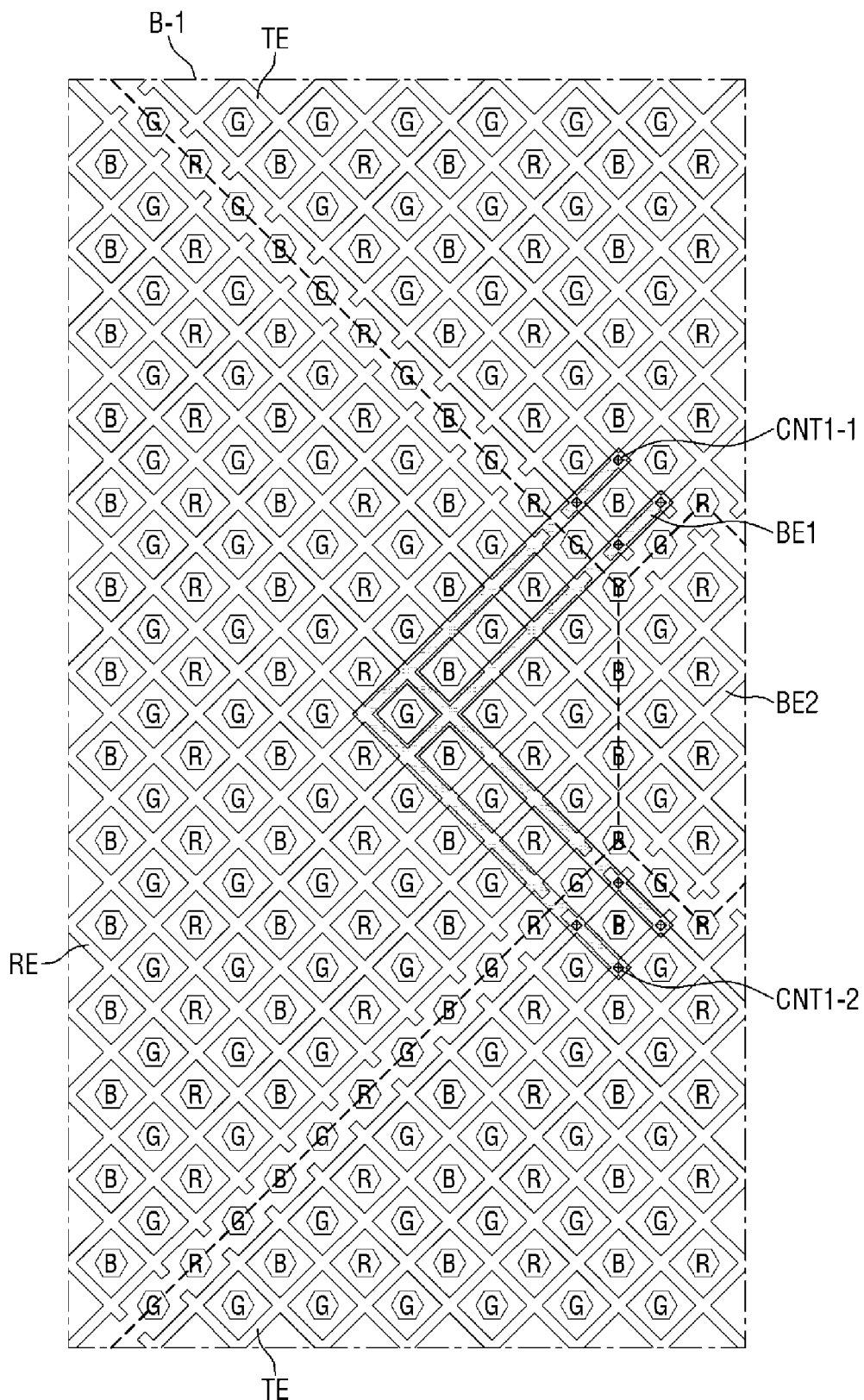
FIGS. 13A and 13B are enlarged plan views showing areas B-1 and B-2 of FIG. 11, respectively.
Figure 13B:
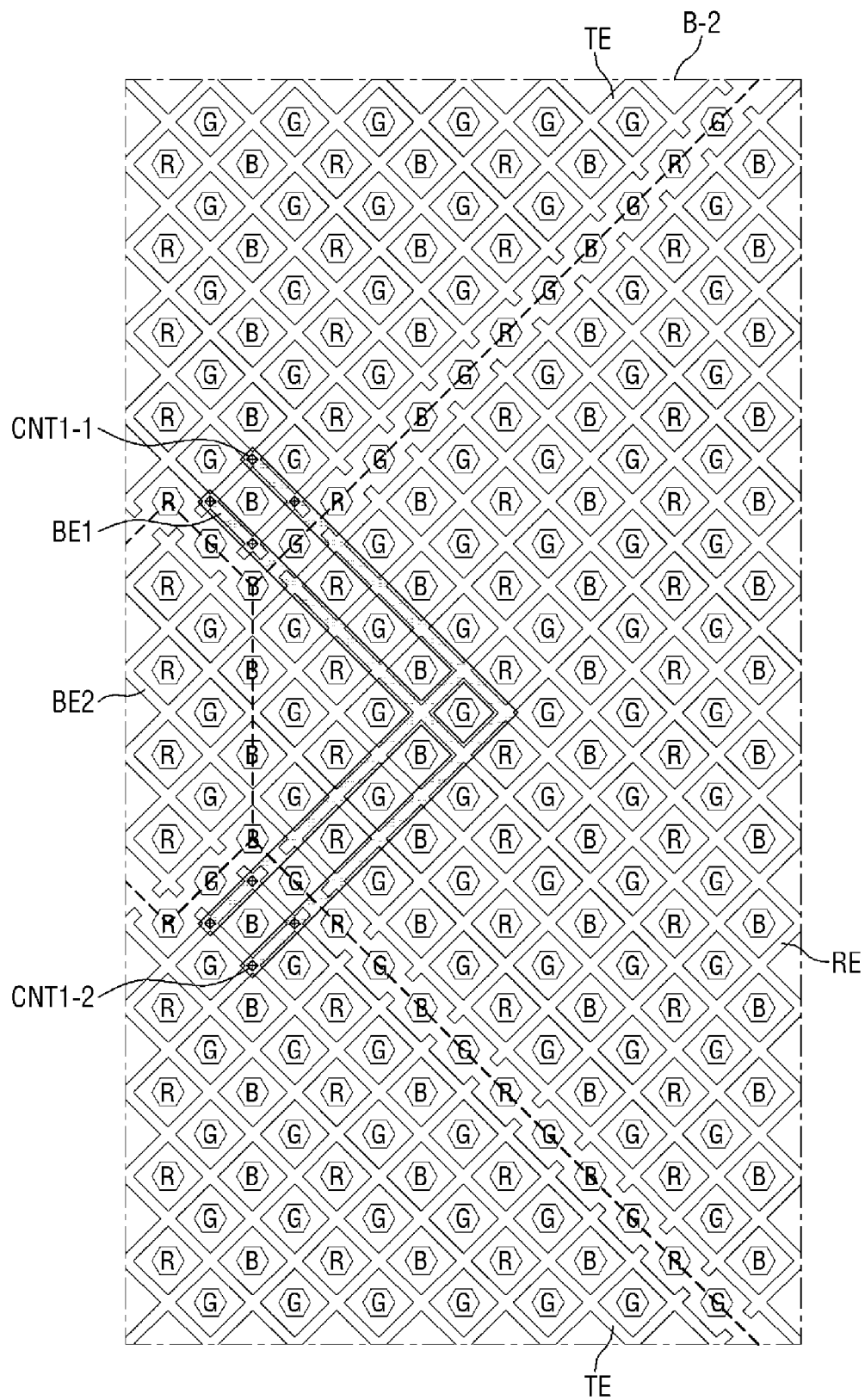

FIGS. 13A and 13B are enlarged plan views showing areas B-1 and B-2 of FIG. 11, respectively.

Referring to FIGS. 13A and 13B, the second area PA2 is different from the structure of the first area PA in that the proximity sensing electrodes PE are replaced with the conductive patterns DE, and the third connection patterns BE for electrically connecting the proximity sensing electrodes PE with one another in the second direction (y-axis direction) are eliminated. Therefore, the driving electrodes TE, the sensing electrodes RE, the first connection patterns BE1, and the second connection patterns BE2 shown in FIGS. 13A and 13B are substantially identical to those described above with reference to FIGS. 12A and 12B. Therefore, the driving electrodes TE, the sensing electrodes RE, the first connection patterns BE1, and the second connection patterns BE2 shown in FIGS. 13A and 13B will not be described again.

Figure 14:
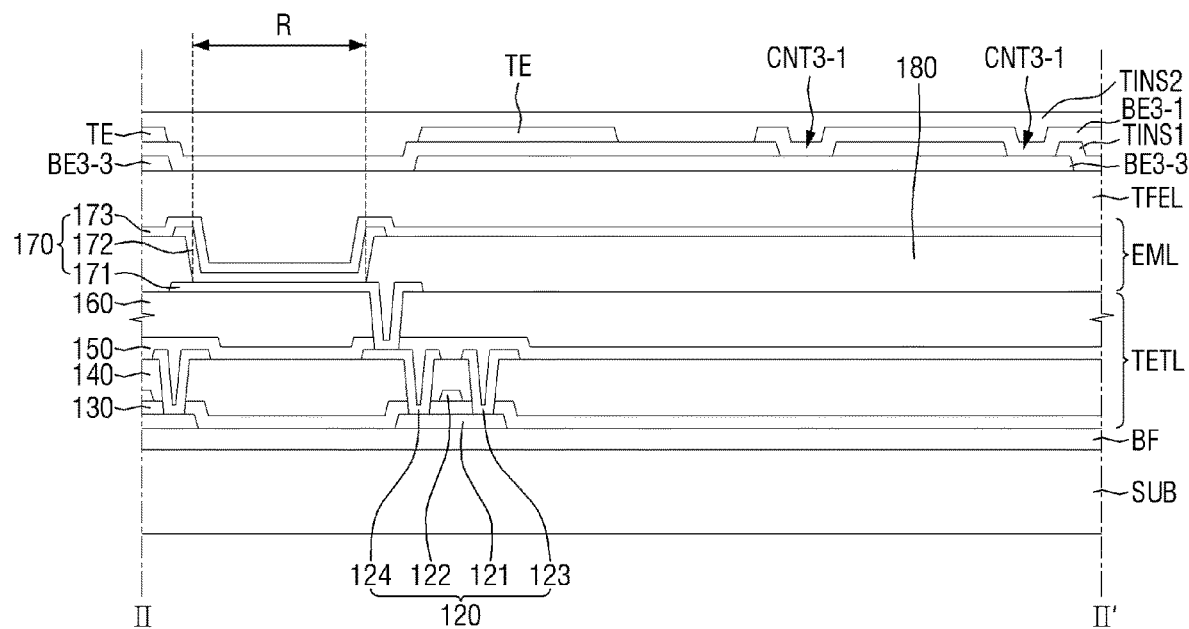
FIG. 14 is a cross-sectional view showing an example, taken along line II-II' of FIG. 12A.

FIG. 14 is a cross-sectional view showing an example, taken along line II-II' of FIG. 12A. FIG. 14 shows the connection structure between the driving electrode TE and the first connection pattern BE1

Referring to FIG. 14, a thin-film transistor layer TFTL is formed on the substrate SUB. The thin-film transistor layer TFTL includes thin-film transistors 120, a gate insulator 130, an interlayer dielectric layer 140, a protective layer 150, and a planarization layer 160.

A buffer film BF may be formed on a surface of the substrate SUB. The buffer film BF may be formed on one surface of the substrate SUB in order to protect the thin-film transistors 120 and organic emitting layer 172 of the emission material layer EML from moisture that is likely to permeate through the substrate SUB. The buffer film BF may be formed of a plurality of inorganic layers stacked on one another alternately. For example, the buffer film BF may be made up of multiple layers in which one or more inorganic layers of a silicon nitride layer, a silicon oxynitride layer, a silicon oxide layer, a titanium oxide layer and an aluminum oxide layer are alternately stacked on one another. The buffer film BF may be eliminated.

The thin-film transistors 120 are disposed on the buffer film BF. Each of the thin-film transistors 120 includes an active layer 121, a gate electrode 122, a source electrode 123, and a drain electrode 124. In FIG. 14, the thin-film transistors 120 are implemented as top-gate transistors in which the gate electrode 122 is located above the active layer 121. It is, however, to be understood that the present disclosure is not limited thereto. That is to say, the thin-film transistors 120 may be implemented as bottom-gate transistors in which the gate electrode 122 is located below the active layer 121, or as double-gate transistors in which the gate electrodes 122 are disposed above and below the active layer 121.

The active layer 121 is formed on the buffer film BF. The active layer 121 may include polycrystalline silicon, single crystal silicon, low-temperature polycrystalline silicon, amorphous silicon, or an oxide semiconductor. The oxide semiconductor may include, for example, a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), etc. For example, the active layer 121 may include an oxide including indium, tin, and titanium (ITZO) or an oxide including indium, gallium and tin (IGZO). A light-blocking layer for blocking external light incident on the active layer 121 may be formed between the buffer film BF and the active layer 121.

The gate insulator 130 may be formed on the active layer 121. The gate insulator 130 may be formed of an inorganic layer, for example, a silicon nitride layer, a silicon oxynitride layer, a silicon oxide layer, a titanium oxide layer, or an aluminum oxide layer. In FIG. 14, the gate insulator 130 is formed on the entire buffer film BF irrespectively of the gate electrode 122, but the present disclosure is not limited thereto. For example, the gate insulator 130 may be formed only over the gate electrode 122.

The gate electrodes 122 and gate lines may be formed on the gate insulator 130. The gate electrodes 122 and the gate lines may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The interlayer dielectric layer 140 may be formed over the gate electrodes 122 and the gate lines. The interlayer dielectric layer 140 may be formed of an inorganic layer, for example, a silicon nitride layer, a silicon oxynitride layer, a silicon oxide layer, a titanium oxide layer, or an aluminum oxide layer.

The source electrodes 123 and the drain electrodes 124 may be formed on the interlayer dielectric layer 140. Each of the source electrodes 123 and the drain electrodes 124 may be connected to the active layer 121 through a contact hole penetrating through the gate insulator 130 and the interlayer dielectric layer 140. The source electrode 123 and the drain electrode 124 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The protective layer 150 may be formed on the source electrode 213 and the drain electrode 124 in order to insulate the thin-film transistors 120. The protective layer 150 may be formed of an inorganic layer, for example, a silicon nitride layer, a silicon oxynitride layer, a silicon oxide layer, a titanium oxide layer, or an aluminum oxide layer.

The planarization layer 160 may be formed on the protective layer 150 to provide a flat surface over the step differences of the thin-film transistors 120. The planarization layer 160 may be formed of an organic layer such as an acryl resin, an epoxy resin, a phenolic resin, a polyamide resin and a polyimide resin.

The emission material layer EML is formed on the thin-film transistor layer TFTL. The emission material layer EML includes light-emitting elements 170 and a bank layer 180.

The light-emitting elements 170 and the bank layer 180 are formed on the planarization layer 160. Each of the light-emitting elements 170 may include a first electrode 171, an organic emitting layer 172, and a second electrode 173.

The first electrode 171 may be formed on the planarization layer 160. Although the first electrode 171 is connected to the drain electrode 124 of the thin-film transistor 120 through the contact hole penetrating through the protective layer 150 and the planarization layer 160 in the example shown in FIG. 14, the present disclosure is not limited thereto. The first electrode 171 may be connected to the source electrode 123 of the thin-film transistor 120 through the contact hole penetrating through the protective layer 150 and the planarization layer 160.

In the top-emission organic light-emitting diode that light exits from the organic emitting layer 172 toward the second electrode 173, the first electrode 171 may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd) and copper (Cu).

In the bottom-emission organic light-emitting diode that light exits from the organic emitting layer 172 toward the first electrode 173, the first electrode 171 may be formed of a transparent conductive material (TCP) such as ITO and IZO that can transmit light, or a semi-transmissive conductive material such as magnesium (Mg), silver (Ag) and an alloy of magnesium (Mg) and silver (Ag). In such case, when the first electrode 171 is made of a semi-transmissive metal material, the light extraction efficiency can be increased by using microcavities.

The bank layer 180 may be formed to separate the first electrode 171 from one another on the planarization layer 250 in order to define the sub-pixels R, G, and B. The bank layer 180 may be formed to cover the edge of the first electrode 171. The bank 180 may be formed of an organic layer such as an acryl resin, an epoxy resin, a phenolic resin, a polyamide resin and a polyimide resin.

In each of the sub-pixels R, G, and B, the first electrode 171, the organic emitting layer 172, and the second electrode 173 are stacked on one another sequentially, so that holes from the first electrode 171 and electrons from the second electrode 173 are combined with each other in the organic emitting layer 172 to emit light. The second sub-pixel G and the third sub-pixel B may be formed substantially the same as the first sub-pixel R shown in FIG. 14.

The organic emitting layer 172 is formed on the first electrode 171 and the bank 180. The organic emitting layer 172 may include an organic material and emit light of a certain color. For example, the organic emitting layer 172 may include a hole transporting layer, an organic material layer, and an electron transporting layer. In this instance, the organic emitting layer 172 of the red sub-pixel R may emit red light, the organic emitting layer 172 of the green sub-pixel G may emit green light, and the organic emitting layer 172 of the blue sub-pixel B may emit blue light.

Alternatively, the organic emitting layers 172 of the sub-pixels R, G, and B may be formed as a single layer to emit white light, ultraviolet light, or blue light. In this instance, the red sub-pixel R may overlap a red color filter layer transmitting red light, the green sub-pixel G may overlap a green color filter layer transmitting green light, and the blue sub-pixel B may overlap a blue color filter layer transmitting blue light. The red color filter layer, the green color filter layer and the blue color filter layer may be disposed on the thin-film encapsulation layer TFEL. In addition, the red sub-pixel R may overlap a red wavelength conversion layer that converts ultraviolet light or blue light into red light, the green sub-pixel G may overlap a green wavelength conversion layer that converts ultraviolet light or blue light into green light, and the blue sub-pixel B may overlap a blue wavelength conversion layer that converts ultraviolet light or blue light into blue light. The red wavelength conversion layer, the green wavelength conversion layer, and the blue wavelength conversion layer may be disposed on the thin-film encapsulation layer TFEL. For example, the red wavelength conversion layer may be disposed between the thin-film encapsulation layer TFEL and the red color filter layer, the green wavelength conversion layer may be disposed between the thin-film encapsulation layer TFEL and the green color filter layer, and the blue wavelength conversion layer may be disposed between the thin-film encapsulation layer TFEL and the blue color filter layer.

The second electrode 173 is formed on the organic emitting layer 172. The second electrode 173 may be formed to cover the organic emitting layer 172. The second electrode 173 may be a common layer formed across the pixels P. A capping layer may be formed on the second electrode 173.

In the top-emission organic light-emitting diode, the second electrode 173 may be formed of a transparent conductive material (TCP) such as ITO and IZO that can transmit light, or a semi-transmissive conductive material such as magnesium (Mg), silver (Ag) and an alloy of magnesium (Mg) and silver (Ag). When the second electrode 173 is formed of a transflective metal material, the light extraction efficiency can be increased by using microcavities.

In the bottom-emission organic light-emitting diode, the second electrode 173 may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd) and copper (Cu).

The thin-film encapsulation layer TFFL is formed on the emission material layer EML. The thin-film encapsulation layer TFEL is disposed on the second electrode 173. The thin-film encapsulation layer TFEL may include at least one inorganic layer to prevent oxygen or moisture from permeating into the organic emitting layer 172 and the second electrode 173. In addition, the thin-film encapsulation layer TFEL may include at least one organic layer to protect the emission material layer EML from particles such as dust. For example, the thin-film encapsulation layer TFEL may include a first inorganic layer disposed on the second electrode 173, an organic layer disposed on the first inorganic layer, and a second inorganic layer disposed on the organic layer. The first inorganic layer and the second inorganic layer may be formed of, but is not limited to, a silicon nitride layer, a silicon oxynitride layer, a silicon oxide layer, a titanium oxide layer, or an aluminum oxide layer. The organic layer may be formed of, but is not limited to, an acryl resin, an epoxy resin, a phenolic resin, a polyamide resin and a polyimide resin.

The touch sensing layer TSL may be formed on the thin-film encapsulation layer TFEL. A buffer layer may be further formed between the thin-film encapsulation layer TFEL and the touch sensing layer TSL. As described above with reference to FIG. 5, the touch sensing layer TSL may include the driving electrodes TE, the sensing electrodes RE, the proximity sensing electrodes PE, the conductive patterns DE, the first connection patterns BE1, the second connection patterns BE2, the third connection patterns BE3, the first driving lines TL1, the second driving lines TL2, the sensing lines RL, the proximity sensing line PL, the guard lines GL1, GL2, GL3, GL4 and GL5, and the ground lines GRL1, GRL2, GRL3 and GRL4. FIG. 14 shows only the driving electrode TE, the sensing electrode RE, the first connection pattern BE1, the (3-1) connection pattern BE3-1 and the (3-3) connection pattern BE3-3 of the third connection patterns BE3 of the touch sensing layer TSL.

On the thin-film encapsulation layer TFEL, the first layer including the first connection patterns BE1 and the (3-3) connection patterns BE3-3 is formed. The first layer may be made up of, but is not limited to, a stack structure of aluminum and titanium (Ti/Al/Ti), a stack structure of aluminum and ITO (ITO/Al/ITO), an APC alloy, and a stack structure of APC alloy and ITO (ITO/APC/ITO).

A first touch insulating layer TINS1 is formed on the first layer. The first touch insulating layer TINS1 may be formed of an inorganic layer, for example, a silicon nitride layer, a silicon oxynitride layer, a silicon oxide layer, a titanium oxide layer, or an aluminum oxide layer. Alternatively, the first touch insulating layer TINS1 may be formed of an organic layer such as an acryl resin, an epoxy resin, a phenolic resin, a polyamide resin and a polyimide resin.

The second layer is formed on the first touch insulating layer TINS1. The second layer may include the driving electrodes TE, the sensing electrodes RE, the proximity sensing electrodes PE, the conductive patterns DE, the second connection patterns BE2, the (3-1) connection patterns BE3-1, the (3-2) connection patterns BE3-2, the first driving lines TL1, the second driving lines TL2, the sensing lines RL, the proximity sensing line PL, the guard lines GL1, GL2, GL3, GL4, and GL5, and the ground lines GRL1, GRL2, GRL3, and GRL4. The second layer may be made up of, but is not limited to, a stack structure of aluminum and titanium (Ti/Al/Ti), a stack structure of aluminum and ITO (ITO/Al/ITO), an APC alloy and a stack structure of APC alloy and ITO (ITO/APC/ITO).

First contact holes CNT1 may be formed through the first touch insulating layer TINS1, via which the first connection patterns BE1 are exposed. The driving electrodes TE may be connected to the first connection patterns BE1 through the first contact holes CNT1. Third contact holes CNT3 may be formed through the first touch insulating layer TINS1, via which the (3-3) connection patterns BE3-3 are exposed. The (3-1) connection pattern BE3-1 and the (3-2) connection pattern BE3-2 may be connected to the (3-3) connection pattern BE3-3 through the third contact holes CNT3.

A second touch insulating layer TINS2 is formed on the second layer. The second touch insulating layer TINS2 may provide a flat surface over the level difference created by the first layer and the second layer. The second touch insulating layer TINS2 may be formed of an organic layer such as an acryl resin, an epoxy resin, a phenolic resin, a polyamide resin and a polyimide resin.

According to the example embodiment shown in FIG. 14, the first connection patterns BE1 connecting the driving electrodes TE adjacent to one another in the second direction (y-axis direction) and the (3-3) connection patterns BE3-3 electrically connecting the driving electrodes TE adjacent to one another in the second direction (y-axis direction) may be formed in the first layer, whereas the driving electrodes TE, the sensing electrodes RE, the proximity sensing electrodes PE, the second connection pattern BE2, the (3-1) connection pattern BE3-1 and the (3-2) connection pattern BE3-2 may be formed in the second layer different from the first layer. Therefore, the driving electrodes TE, the sensing electrodes RE, and the proximity sensing electrodes PE may be electrically separated from each other at their intersections, the sensing electrodes RE may be electrically connected with one another in the first direction (x-axis direction), and the driving electrodes TE, and the proximity sensing electrodes PE may be electrically connected with each other in the second direction (y-axis direction).

Figure 15:
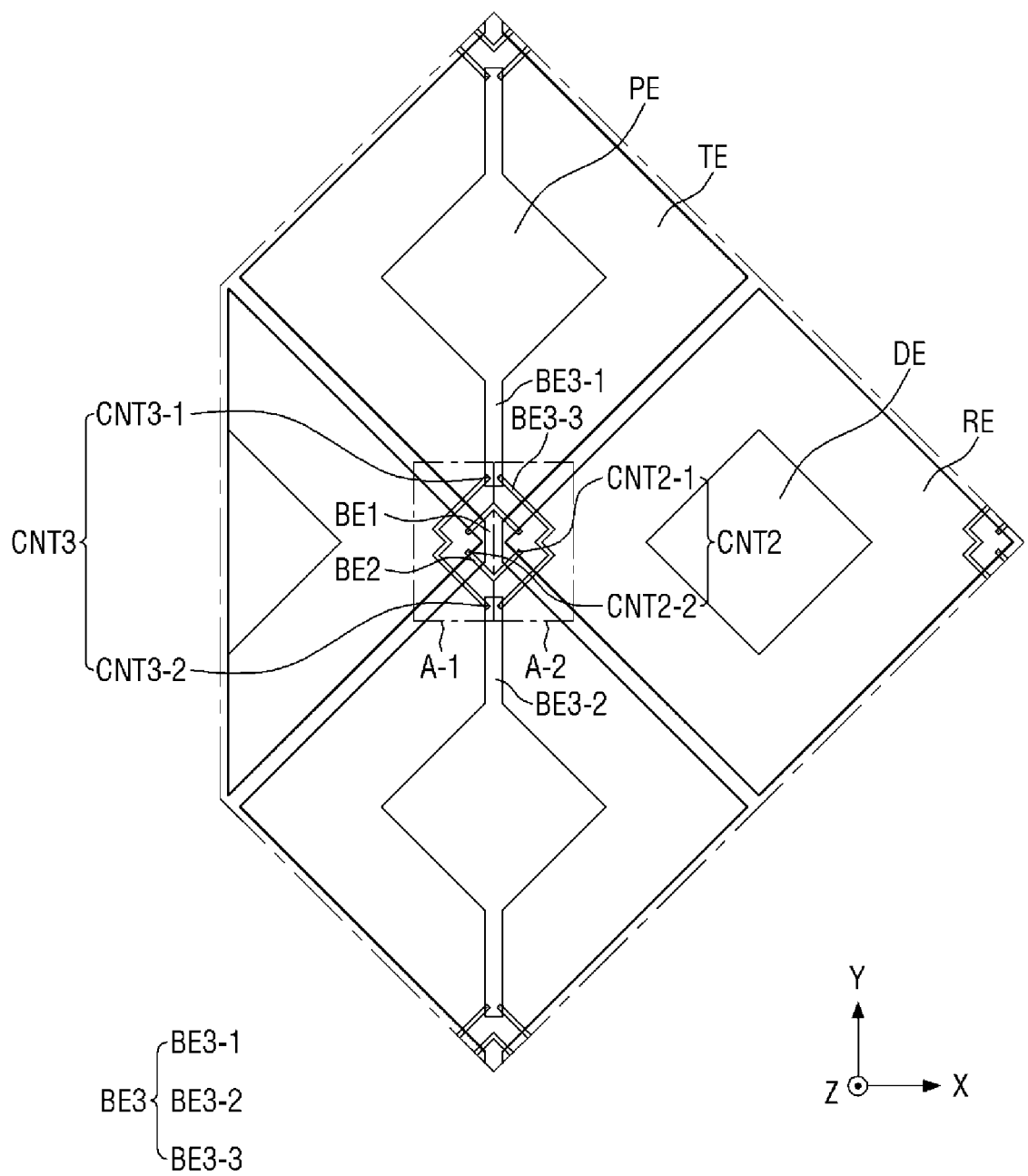
FIG. 15 is an enlarged plan view showing an example of area A of FIG. 7.
Figure 16:
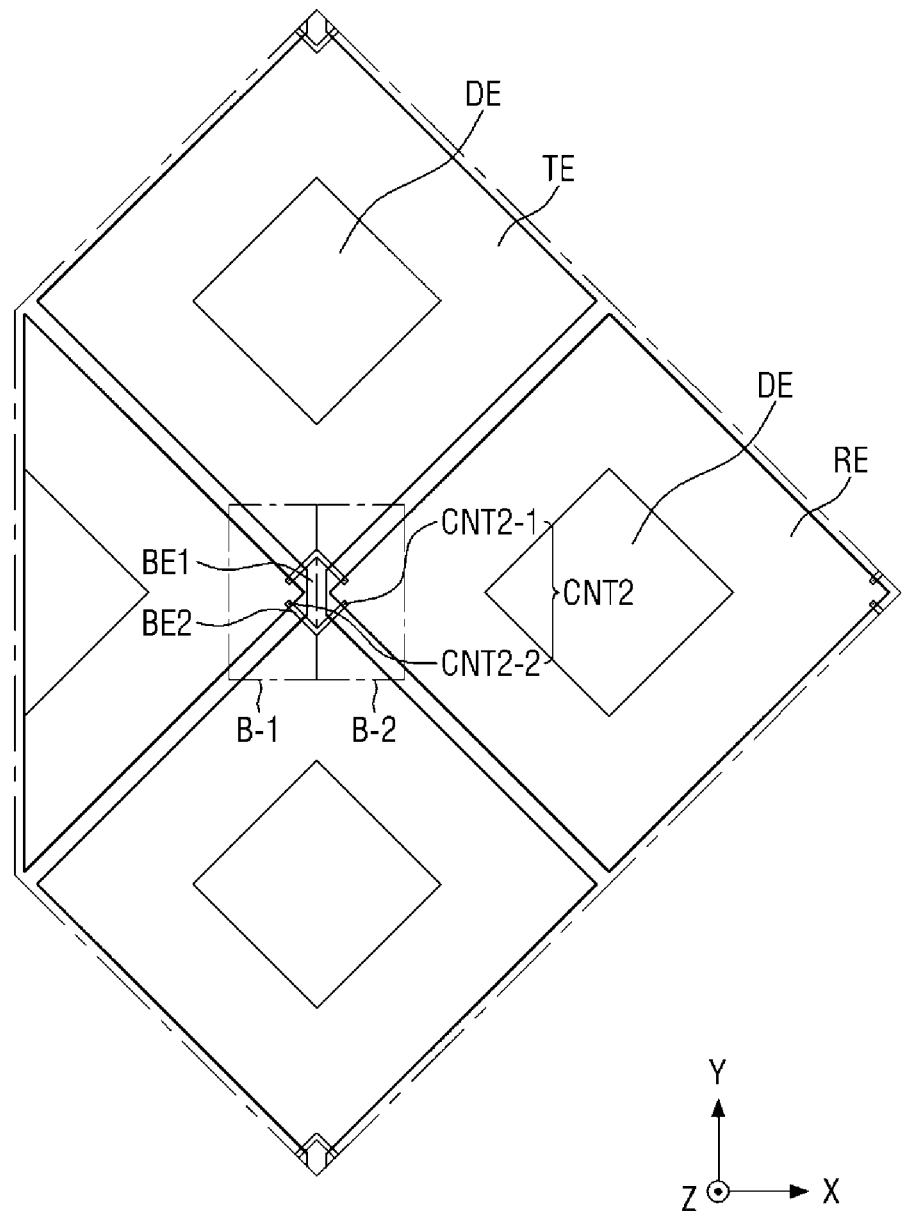
FIG. 16 is an enlarged plan view showing an example of area B of FIG. 7.
Figure 17A:
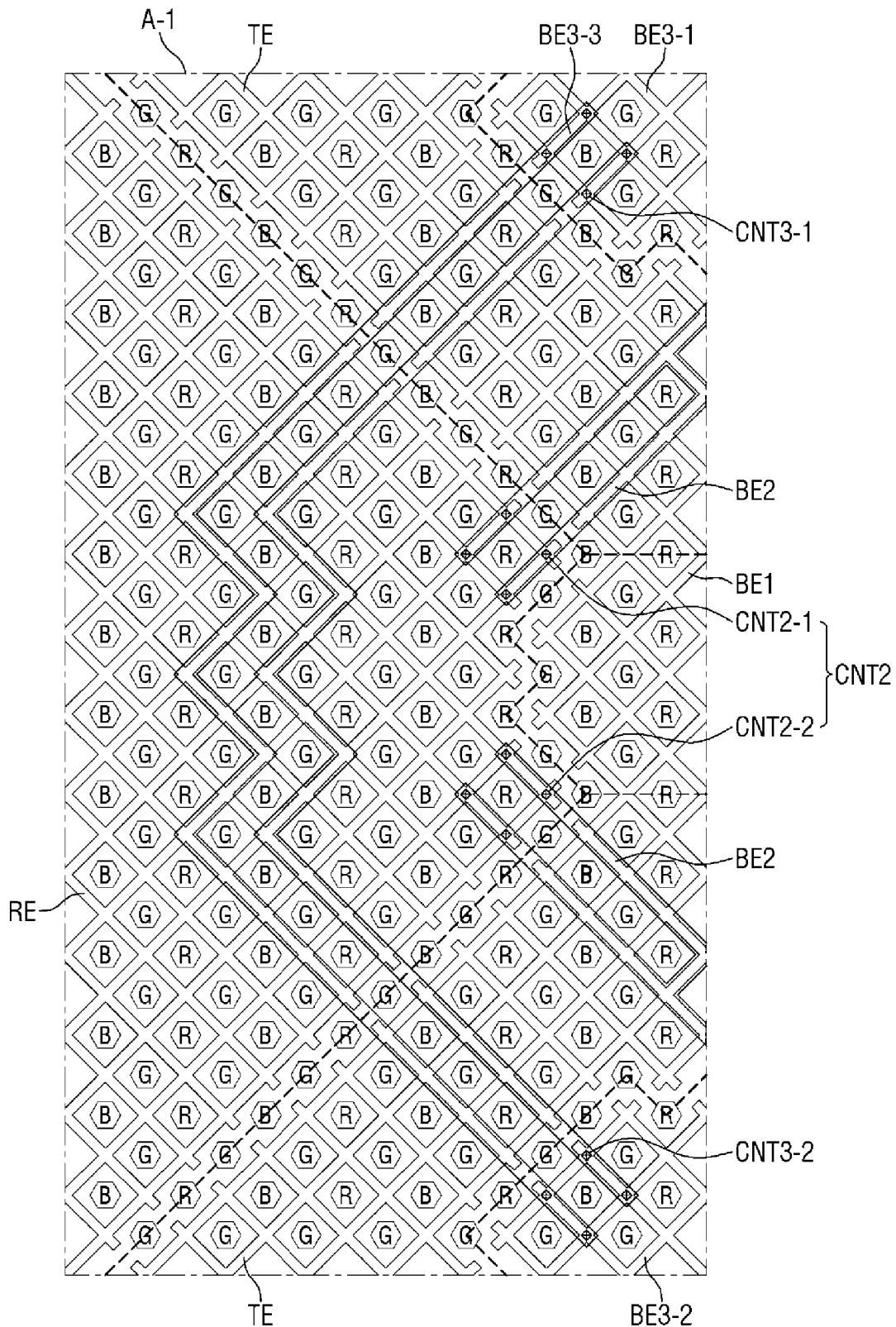
FIGS. 17A and 17B are enlarged plan views showing areas A-1 and A-2 of FIG. 15, respectively.
Figure 17B:
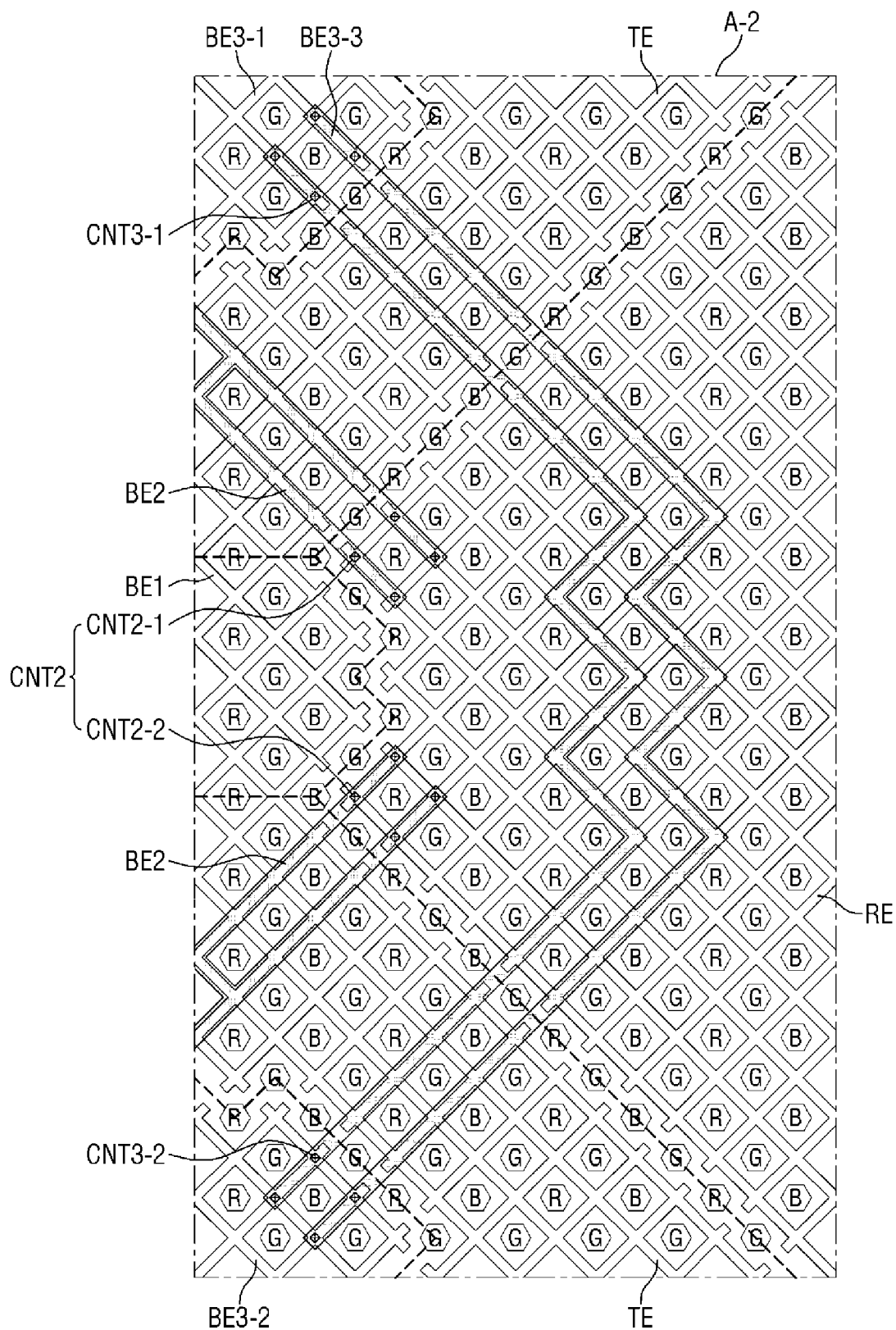
Figure 18A:
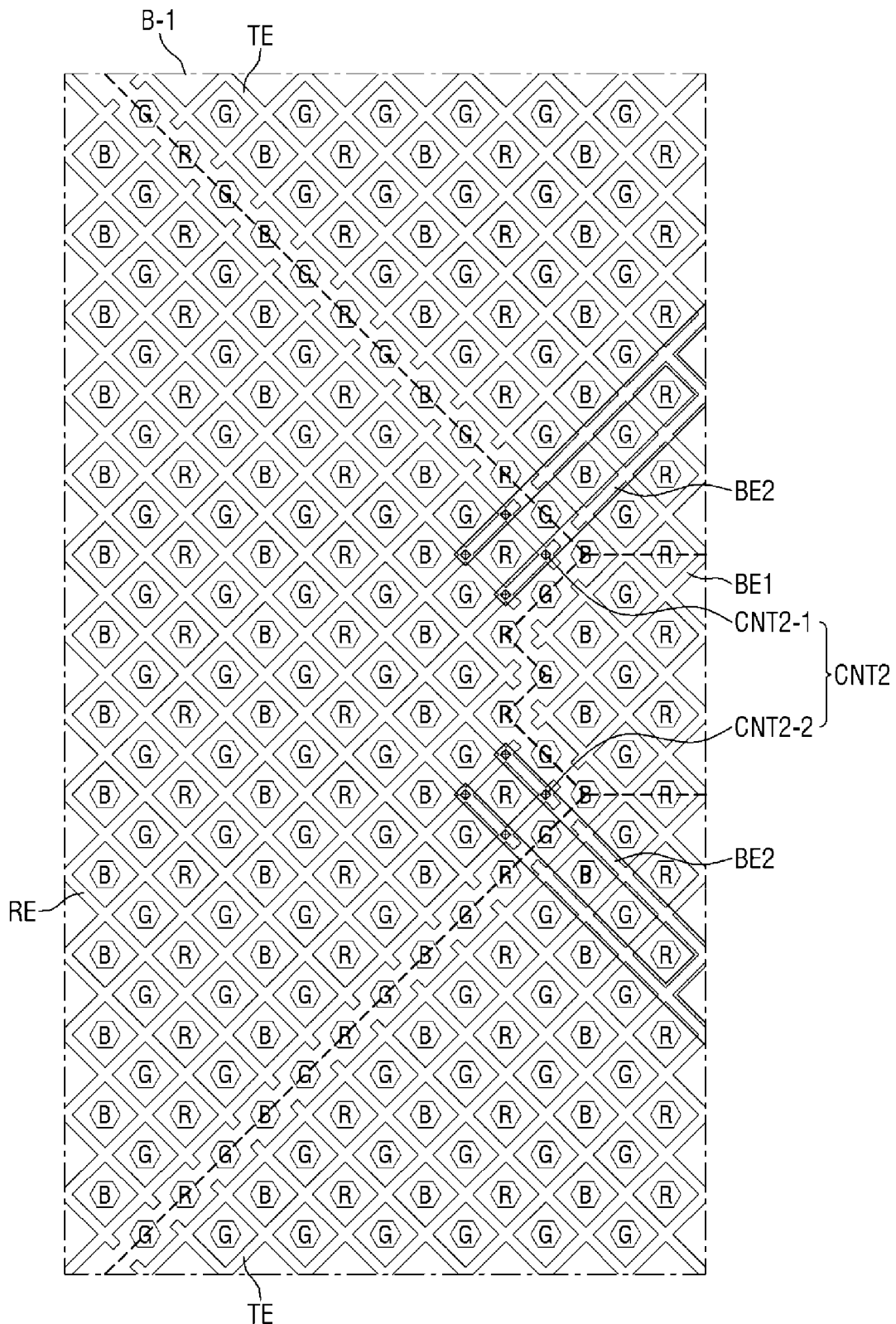
FIGS. 18A and 18B are enlarged plan views showing areas B-1 and B-2 of FIG. 16, respectively.
Figure 18B:
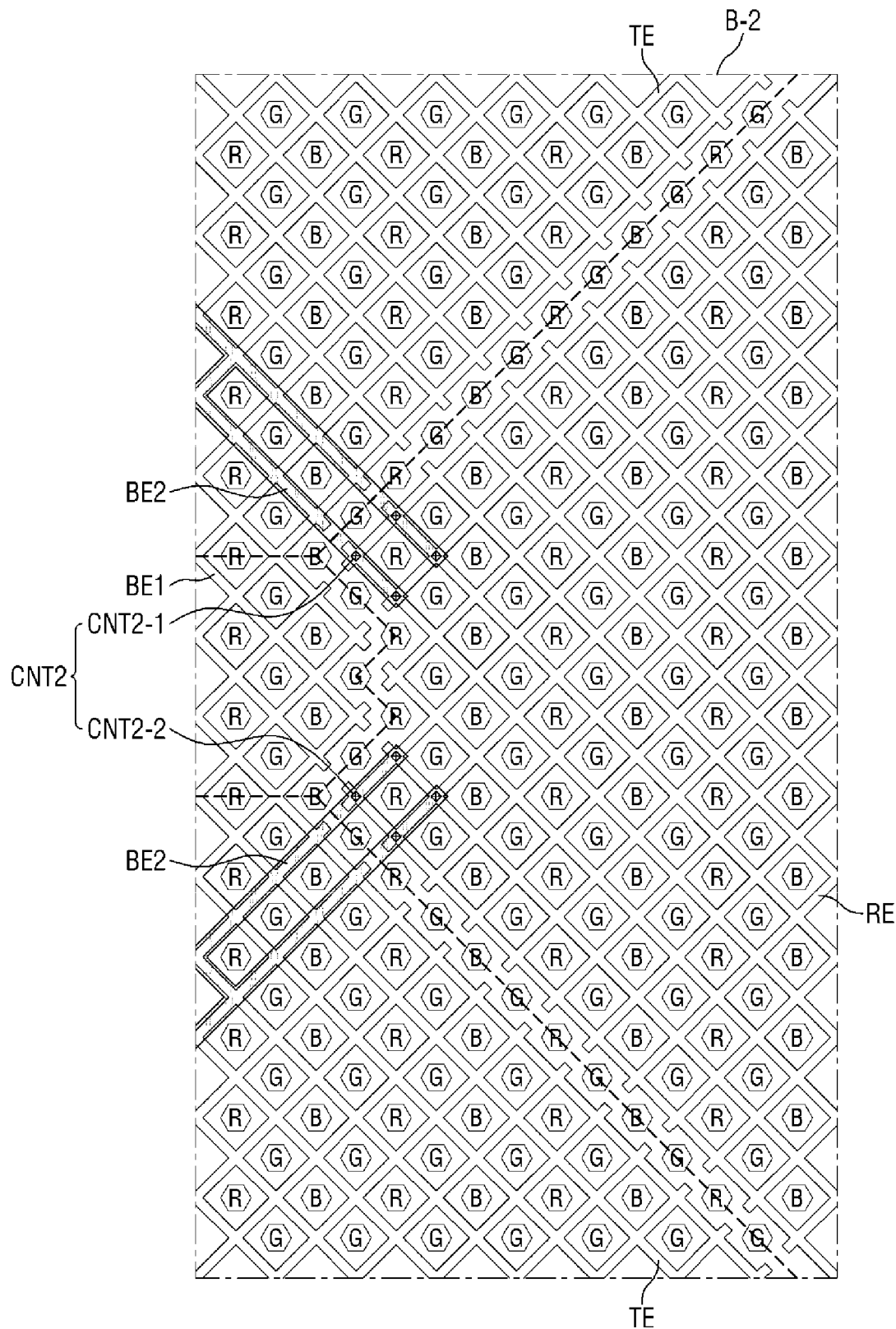

FIG. 15 is an enlarged plan view showing an example of area A of FIG. 7. FIG. 16 is an enlarged plan view showing an example of area B of FIG. 7. FIGS. 17A and 17B are enlarged plan views showing areas A-1 and A-2 of FIG. 15, respectively. FIGS. 18A and 18B are enlarged plan views showing areas B-1 and B-2 of FIG. 16, respectively.

The example embodiment shown in FIGS. 15 to 18B is different from the example embodiment shown in FIGS. 10 to 13 in that the first connection pattern BE1 is disposed on the same layer as the driving electrodes TE in the first area PA1 and the second area PA2 of the touch sensing area TSA and the second connection pattern BE2 is disposed on a different layer from the sensing electrodes RE. The following description will focus on the differences.

Referring to FIGS. 15 to 18B, since the driving electrodes TE, the sensing electrode RE, the proximity sensing electrodes PE, the conductive patterns DE, the first connection pattern BE1, the (3-1) connection pattern BE-1 and the (3-2) connection pattern BE3-2 are formed on the same layer, they may be spaced apart from each other. There may be gaps between the driving electrode TE and the sensing electrode RE, between the driving electrode TE and the proximity sensing electrode PE, between the sensing electrode RE and the first connection pattern BE1, between the driving electrode TE and the (3-1) connection pattern BE3-1, between the driving electrode TE and the (3-2) connection pattern BE3-2, and between the sensing electrode RE and the conductive pattern DE. For convenience of illustration, the boundary between the driving electrode TE and the sensing electrode RE, the boundary between the driving electrode TE and the second connection pattern BE2, the boundary between the driving electrode TE and the (3-1) connection pattern BE3-1, and the boundary between the sensing electrode RE and the second connection pattern BE2 are indicated by dashed lines in FIGS. 17A and 17B. For convenience of illustration, the boundary between the driving electrode TE and the sensing electrode RE, the boundary between the driving electrode TE and the second connection pattern BE2, and the boundary between the sensing electrode RE and the second connection pattern BE2 are indicated by dashed lines in FIGS. 18A and 18B.

The first connection pattern BE1 may be disposed between the driving electrodes TE. The first connection pattern BE1 is formed on the same layer as the driving electrodes TE and may be extended from each of the driving electrodes TE. For example, the driving electrodes TE and the first connection pattern BE1 may be formed in the second layer shown in FIG. 14. Therefore, the first connection pattern BE1 may be connected to the driving electrodes TE without any additional contact hole.

The second connection pattern BE2 may be formed on a different layer from the sensing electrodes RE and may be connected to the sensing electrodes RE through the second contact holes CNT2. The second connection patterns BE2 may be connected to the sensing electrodes RE through the second contact holes CNT2, respectively. One end of each of the second connection patterns BE2 may be connected to one of the sensing electrodes RE adjacent to each other in the first direction (x-axis direction) through a (2-1) contact hole CNT2-1. The other end of each of the second connection patterns BE2 may be connected to another one of the sensing electrodes RE adjacent to each other in the first direction (x-axis direction) through a (2-2) contact hole CNT2-2. The second connection pattern BE2 may overlap the driving electrodes TE and the sensing electrode RE. Alternatively, the second connection pattern BE2 may overlap the first connection pattern BE1 instead of the driving electrode TE. Alternatively, the second connection pattern BE2 may overlap the driving electrode TE as well as the first connection pattern BE1. Since the second connection pattern BE2 is formed on a different layer from the driving electrodes TE, the sensing electrodes RE, and the first connection pattern BE1, it is possible to prevent a short-circuit from being created in the driving electrode TE and/or the first connection pattern BE1 even though the second connection pattern BE2 overlaps the driving electrode TE and/or the first connection pattern BE1. For example, the second connection pattern BE2 may be formed in the first layer shown in FIG. 14, and the sensing electrodes RE may be formed in the second layer shown in FIG. 14. The second layer may be disposed on the first layer.

The third connection pattern BE3 may include a (3-1) connection pattern BE3-1, a (3-2) connection pattern BE3-2, and a (3-3) connection pattern BE3-3. Since the (3-1) connection pattern BE3-1, the (3-2) connection pattern BE3-2, and the (3-3) connection pattern BE3-3 are substantially identical to those described with reference to FIGS. 10 to 13, therefore, the redundant description is omitted.

According to the example embodiment shown in FIGS. 15 to 18B, the second connection patterns BE2 connecting the sensing electrodes RE adjacent to one another in the first direction (x-axis direction) and the (3-3) connection patterns BE3-3 electrically connecting the proximity sensing electrodes PE adjacent to one another in the second direction (y-axis direction) may be formed in the first layer, while the driving electrodes TE, the sensing electrodes RE, the proximity sensing electrodes PE, the first connection pattern BE1, the (3-1) connection pattern BE3-1, and the (3-2) connection pattern BE3-2 may be formed in the second layer different from the first layer. Therefore, the driving electrodes TE, the sensing electrodes RE, and the proximity sensing electrodes PE may be electrically separated from each other at their intersections, the sensing electrodes RE may be electrically connected with one another in the first direction (x-axis direction), and the driving electrodes TE and the proximity sensing electrodes PE may be electrically connected with each other in the second direction (y-axis direction).

Figure 19:
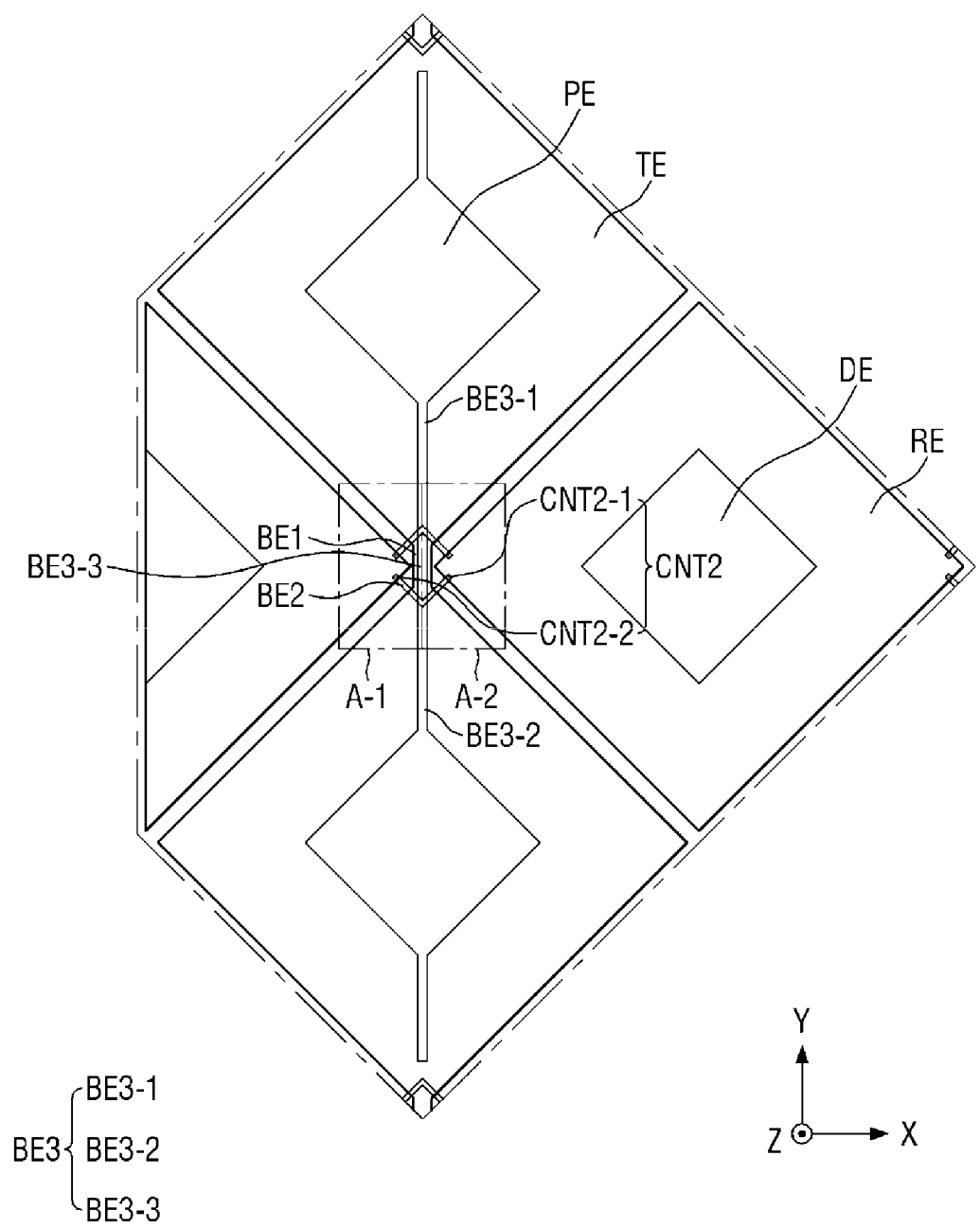
FIG. 19 is an enlarged plan view showing an example of area A of FIG. 7.
Figure 20A:
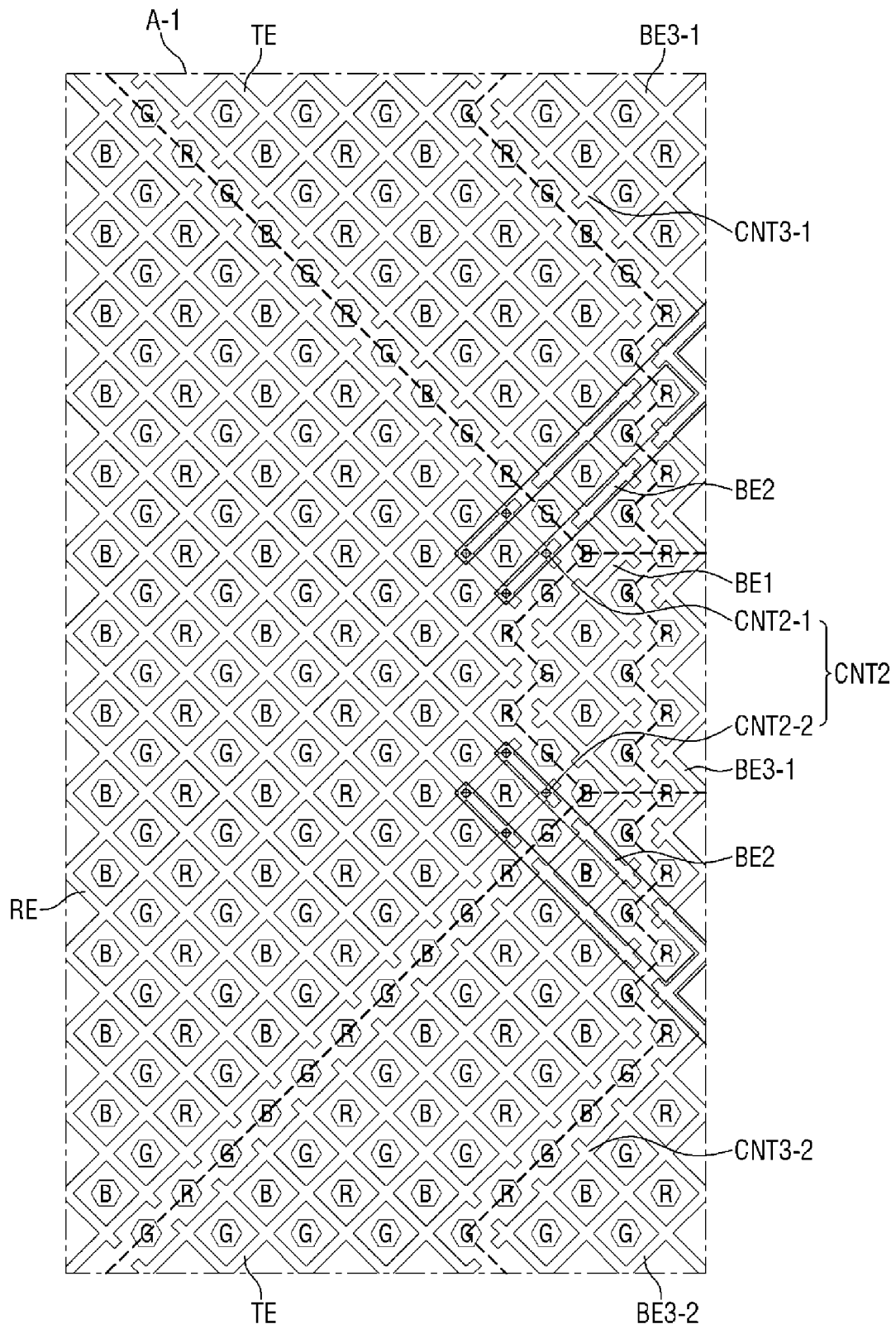
FIGS. 20A and 20B are enlarged plan views showing areas A-1 and A-2 of FIG. 19, respectively.
Figure 20B:
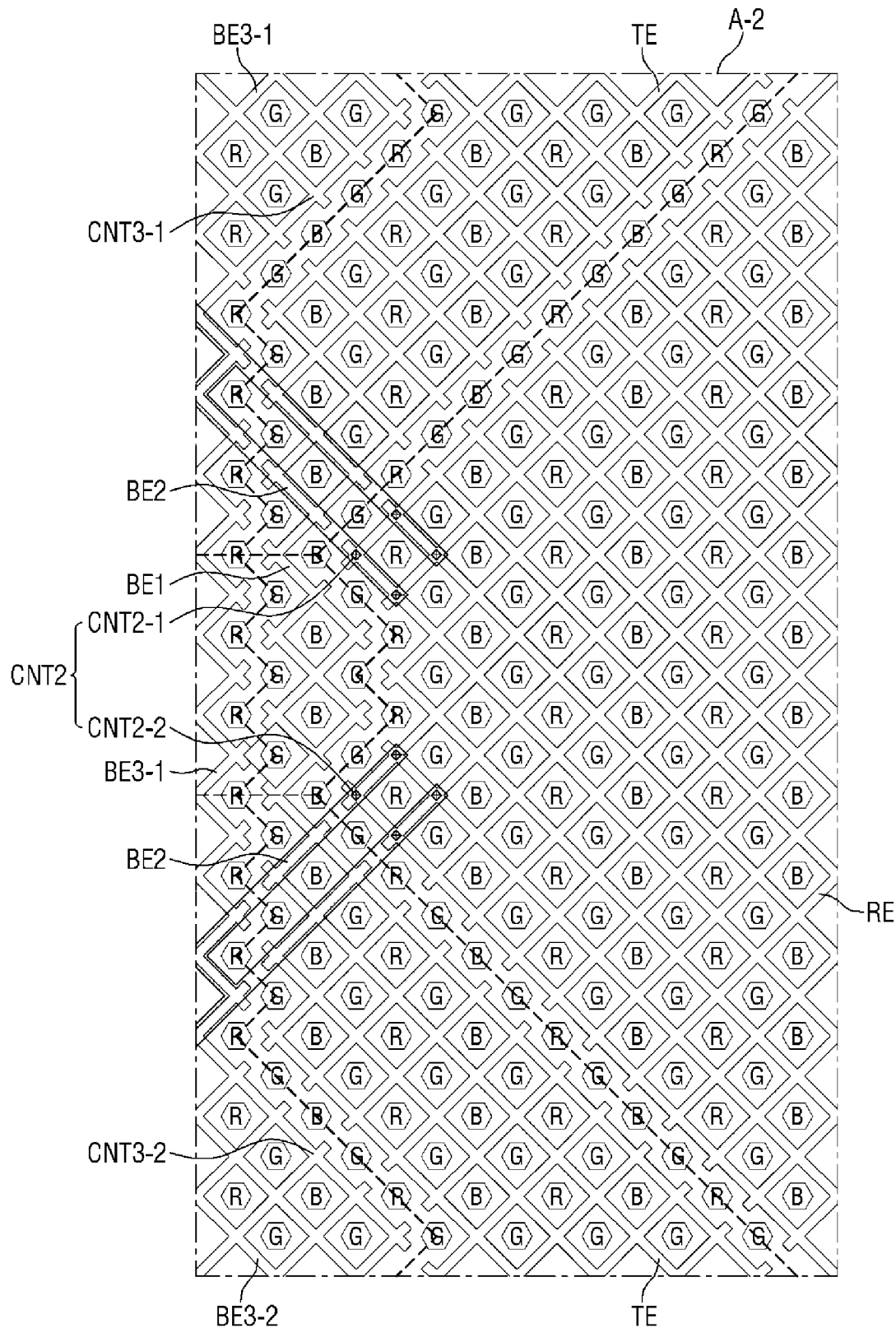

FIG. 19 is an enlarged plan view showing an example of area A of FIG. 7. FIGS. 20A and 20B are enlarged plan views showing areas A-1 and A-2 of FIG. 19, respectively.

The example embodiment shown in FIGS. 19 to 20B is different from the example embodiment shown in FIGS. 15 to 18 in that the (3-3) connection pattern BE3-3 is disposed on the same layer as the driving electrodes TE in the first area PA1. The second area PA2 according to the example embodiment shown in FIGS. 19 to 20B is substantially identical to the second area PA2 according to the example embodiment shown in FIGS. 15 to 18; and, therefore, the redundant description is omitted. The following description focuses on the differences.

Referring to FIGS. 19 to 20B since the driving electrodes TE, the sensing electrode RE, the proximity sensing electrodes PE, the conductive patterns DE, the first connection pattern BE1, the (3-1) connection pattern BE-1, the (3-2) connection pattern BE3-2, and the (3-3) connection pattern BE3-3 are formed on the same layer, they may be spaced apart from each other. There may be gaps between the driving electrode TE and the sensing electrode RE, between the driving electrode TE and the proximity sensing electrode PE, between the sensing electrode RE and the first connection pattern BE1, between the driving electrode TE and the (3-1) connection pattern BE3-1, between the driving electrode TE and the (3-2) connection pattern BE3-2, between the driving electrode TE and the (3-3) connection pattern BE3-3, and between the sensing electrode RE and the conductive pattern DE. For convenience of illustration, the boundary between the driving electrode TE and the sensing electrode RE, the boundary between the driving electrode TE and the first connection pattern BE1, the boundary between the driving electrode TE and the (3-1) connection pattern BE3-1, the boundary between the sensing electrode RE and the first connection pattern BE1, the boundary between the first connection pattern BE1 and the (3-3) connection pattern BE3-3, and the boundary between the (3-1) connection pattern BE3-1 and the (3-3) connection pattern BE3-3 are indicated by dashed lines in FIGS. 20A and 20B.

The third connection pattern BE3 may include a (3-1) connection pattern BE3-1, a (3-2) connection pattern BE3-2, and a (3-3) connection pattern BE3-3. Since the (3-1) connection pattern BE3-1 and the (3-2) connection pattern BE3-2 are substantially identical to those described with reference to FIGS. 10 to 13, therefore, the redundant description is omitted.

The (3-3) connection pattern BE3-3 may be disposed between the (3-1) connection pattern BE3-1 and the (3-2) connection pattern BE3-2. The (3-3) connection pattern BE3-3 may be formed on the same layer as the (3-1) connection pattern BE3-1, the (3-2) connection pattern BE3-2, and the proximity sensing electrodes PE. The (3-3) connection pattern BE3-3 may be extended from each of the (3-1) connection pattern BE3-1 and the (3-2) connection pattern BE3-2. For example, the proximity sensing electrodes PE, the (3-1) connection pattern BE3-1, the (3-2) connection pattern BE3-2 and the (3-3) connection pattern BE3-3 may be formed in the second layer shown in FIG. 14. Therefore, the (3-3) connection pattern BE3-3 may be connected to the (3-1) connection pattern BE3-1 and the (3-2) connection pattern BE3-2 without any additional contact hole.

According to the example embodiment shown in FIGS. 19 to 20B, the second connection patterns BE2 connecting the sensing electrodes RE adjacent to one another in the first direction (x-axis direction) may be formed in the first layer, while the driving electrodes TE, the sensing electrodes RE, the proximity sensing electrodes PE, the first connection pattern BE1, the (3-1) connection pattern BE3-1, the (3-2) connection pattern BE3-2 and the (3-3) connection pattern BE3-3 may be formed in the second layer different from the first layer. Therefore, the driving electrodes TE, the sensing electrodes RE and the proximity sensing electrodes PE may be electrically separated from each other at their intersections, the sensing electrodes RE may be electrically connected with one another in the first direction (x-axis direction), and the driving electrodes TE and the proximity sensing electrodes PE may be electrically connected with each other in the second direction (y-axis direction).

Figure 21:
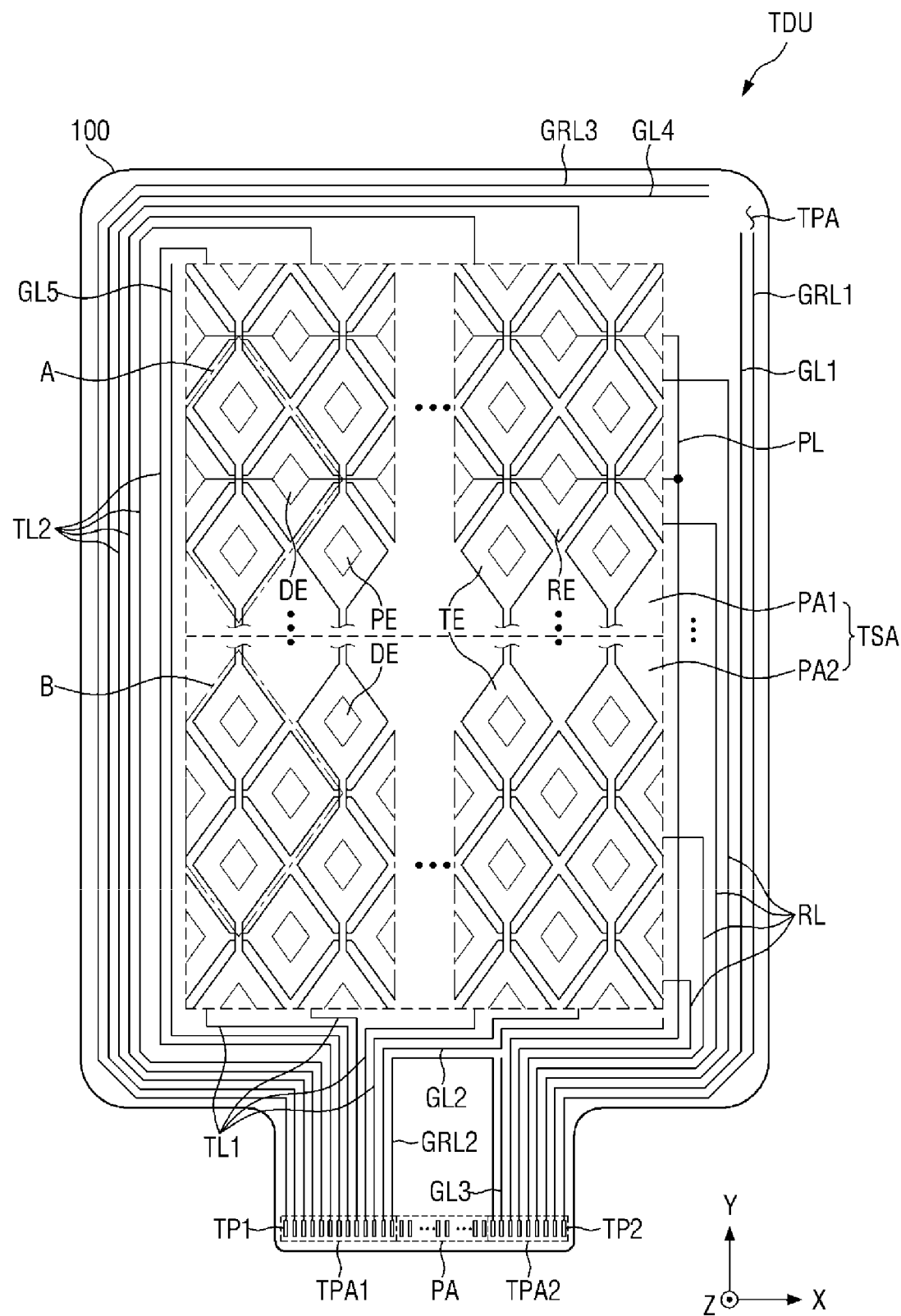
FIG. 21 is a plan view showing the touch detecting unit of FIG. 5 and the related elements.

FIG. 21 is a plan view showing the touch detecting unit of FIG. 5 and the related elements.

The example embodiment shown in FIG. 21 is different from the example embodiment shown in FIG. 7 in that the proximity sensing electrodes PE are arranged in the first direction (x-axis direction) and electrically connected with one another in the first area PA1, and the conductive patterns DE are surrounded by the driving electrodes TE, respectively. The following description focuses on the differences.

Referring to FIG. 21, in the first area PA1, the proximity sensing electrodes PE may be arranged in parallel in the first direction (x-axis direction) and may be electrically connected with one another. The proximity sensing electrodes PE may be surrounded by the sensing electrodes RE, respectively. In order to electrically separate the driving electrodes TE from the sensing electrodes PE at their intersections, the proximity sensing electrodes PE adjacent to each other in the first direction (x-axis direction) may be connected through the third connection patterns BE1, and the driving electrodes TE adjacent to each other in the second direction (y-axis direction) may be connected through first connection patterns BE1. In the first area PA1, the conductive patterns DE may be surrounded by the sensing electrodes RE, respectively.

The proximity sensing electrodes PE disposed on one side, i.e., the right side of the touch sensing area TSA may be connected to the proximity sensing line PL. For example, the rightmost one of the proximity sensing electrodes PE electrically connected with one another in the first direction (x-axis direction) may be connected to the proximity sensing line PL. The proximity sensing line PL may be connected to second touch pads TP2. Thus, the touch driving circuit 400 may be electrically connected to the proximity sensing electrodes PE.

According to the example embodiment shown in FIG. 21, the driving electrodes TE and the sensing electrodes RE may be disposed in both the first area PA1 and the second area PA2 of the touch sensing area TSA, and the proximity sensing electrodes PE may be disposed only in the first area PA1 of the touch sensing area TSA. Therefore, in the first area PA1, first mutual capacitances may be formed between the driving electrodes TE and the sensing electrodes RE, and third mutual capacitances may be formed between the driving electrodes TE and the proximity sensing electrodes PE, and thus touch sensing as well as proximity sensing can be performed. On the other hand, in the second area PA2, only the first mutual capacitances $C_{m1}$ are formed between the driving electrodes TE and the sensing electrodes RE, only touch sensing can be performed.

Since the method for detecting the amount of change in the first mutual capacitance $C_{m1}$ and the amount of change in the third mutual capacitance $C_{m3}$ in the first area PA1 is substantially identical to that described above with reference to FIG. 8, therefore, the redundant description is omitted. In addition, since the method for detecting the amount of change in the first mutual capacitance $C_{m1}$ in the second area PA2 according to the example embodiment shown in FIG. 21 is substantially identical to that described above with reference to FIG. 9, therefore, the redundant description is omitted.

Figure 22:
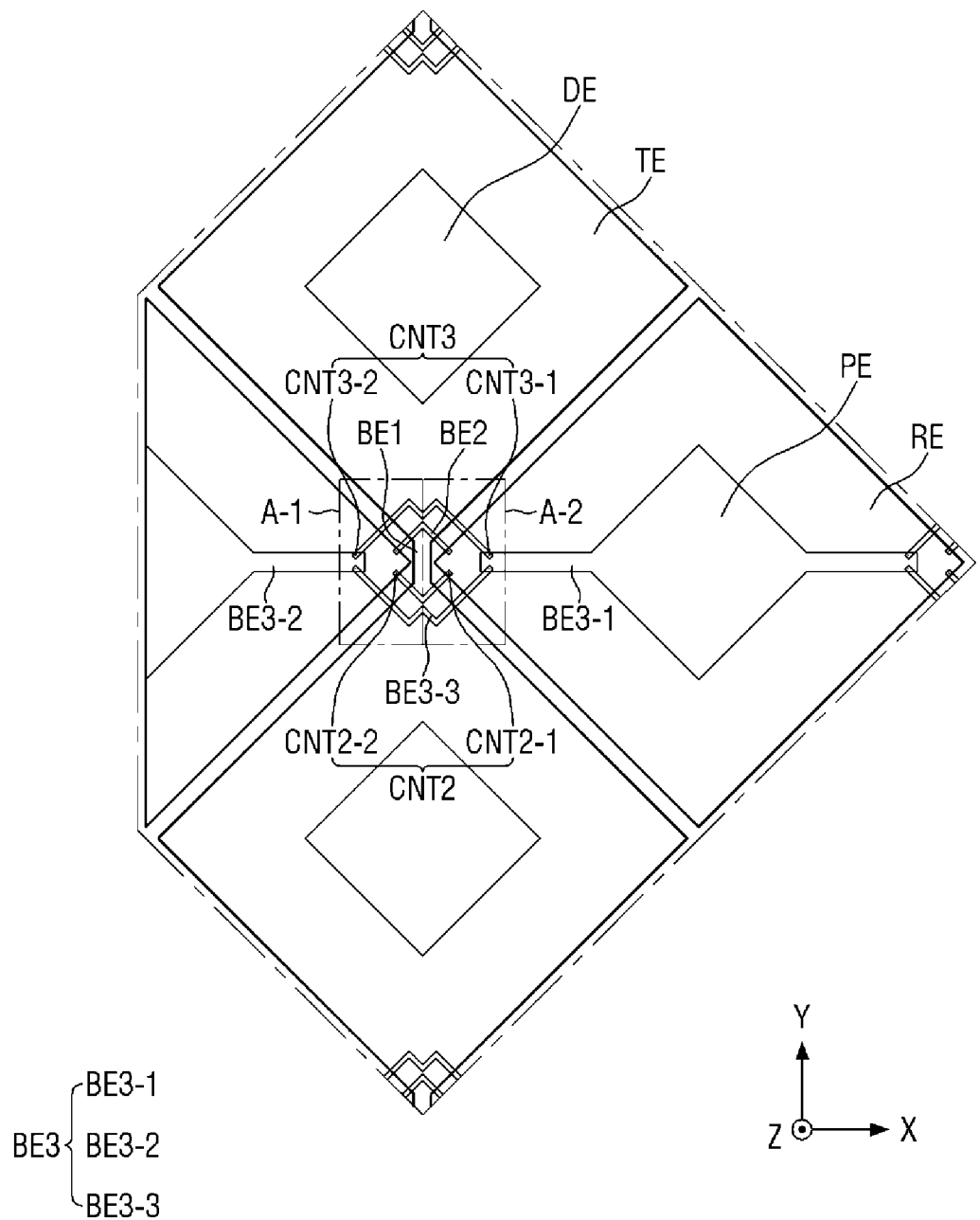
FIG. 22 is an enlarged plan view showing an example of area A of FIG. 21.
Figure 23:
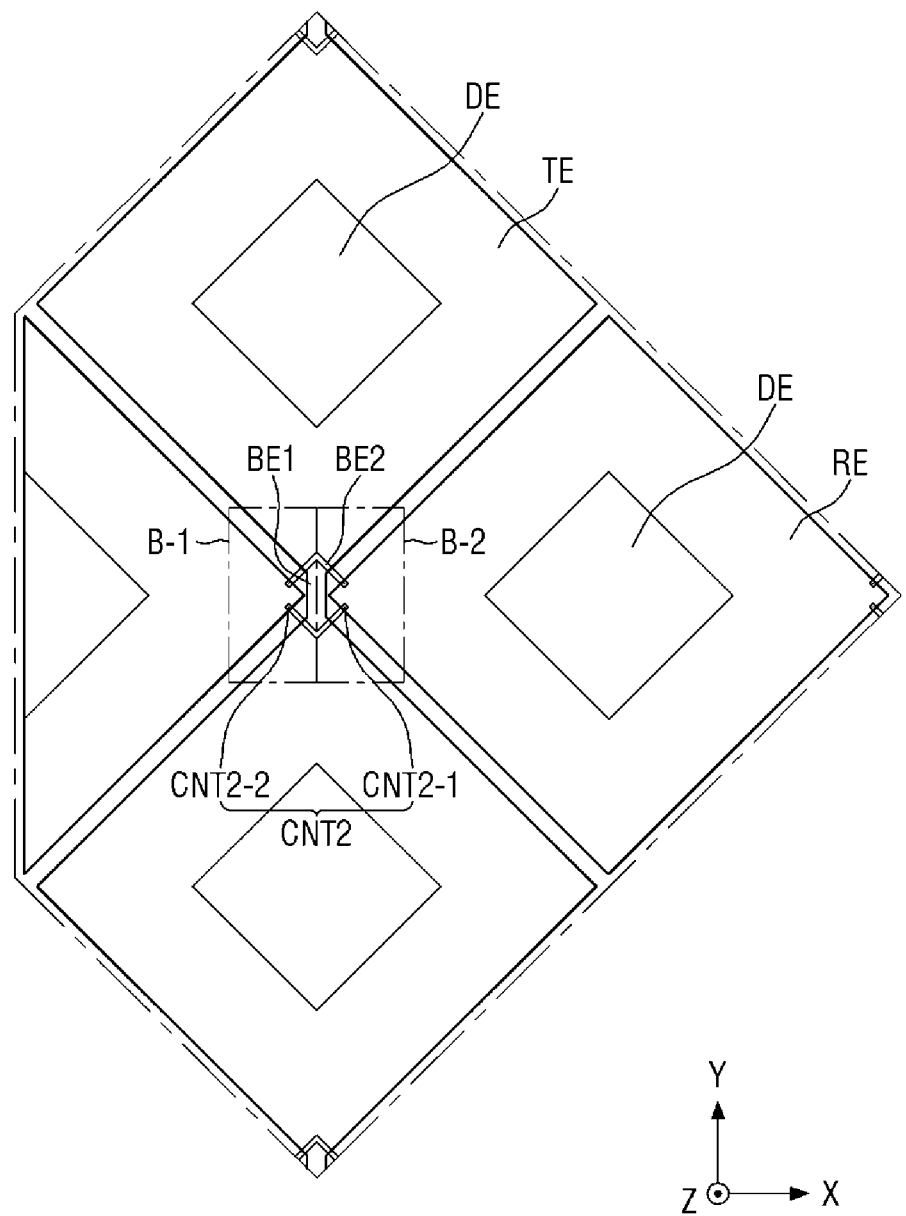
FIG. 23 is an enlarged plan view showing an example of area B of FIG. 21.
Figure 24A:
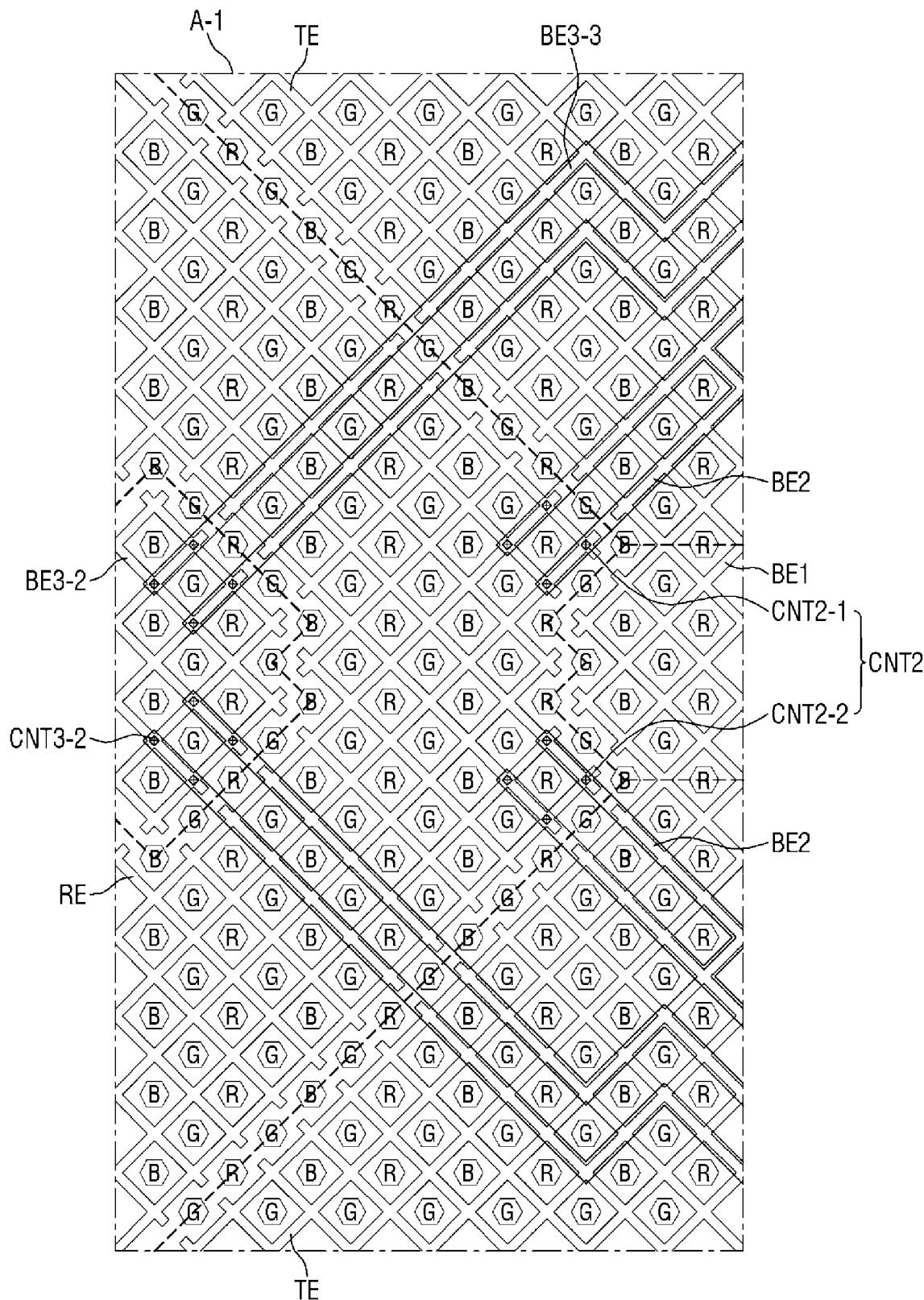
FIGS. 24A and 24B are enlarged plan views showing areas A-1 and A-2 of FIG. 22, respectively.
Figure 24B:
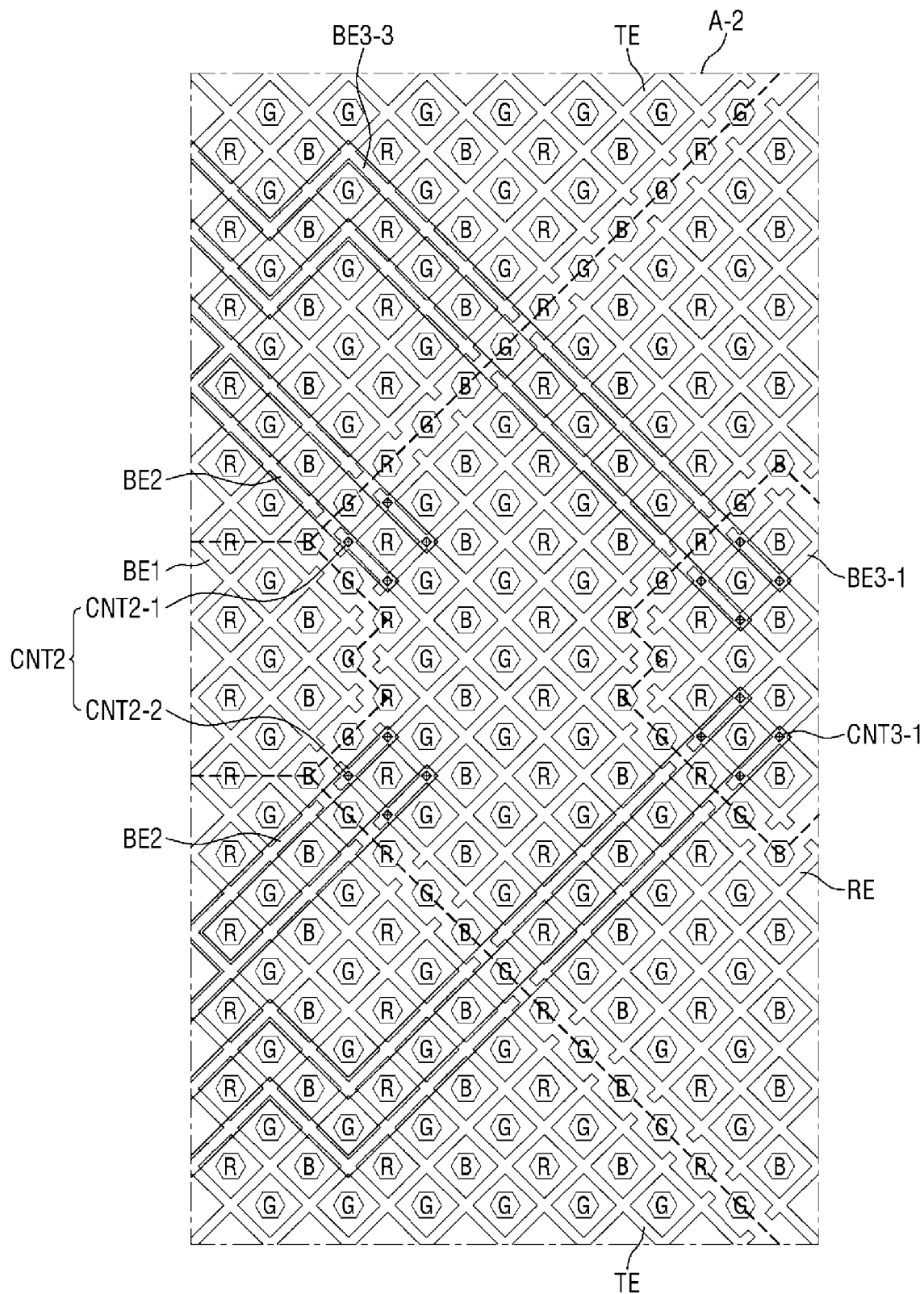
Figure 25A:
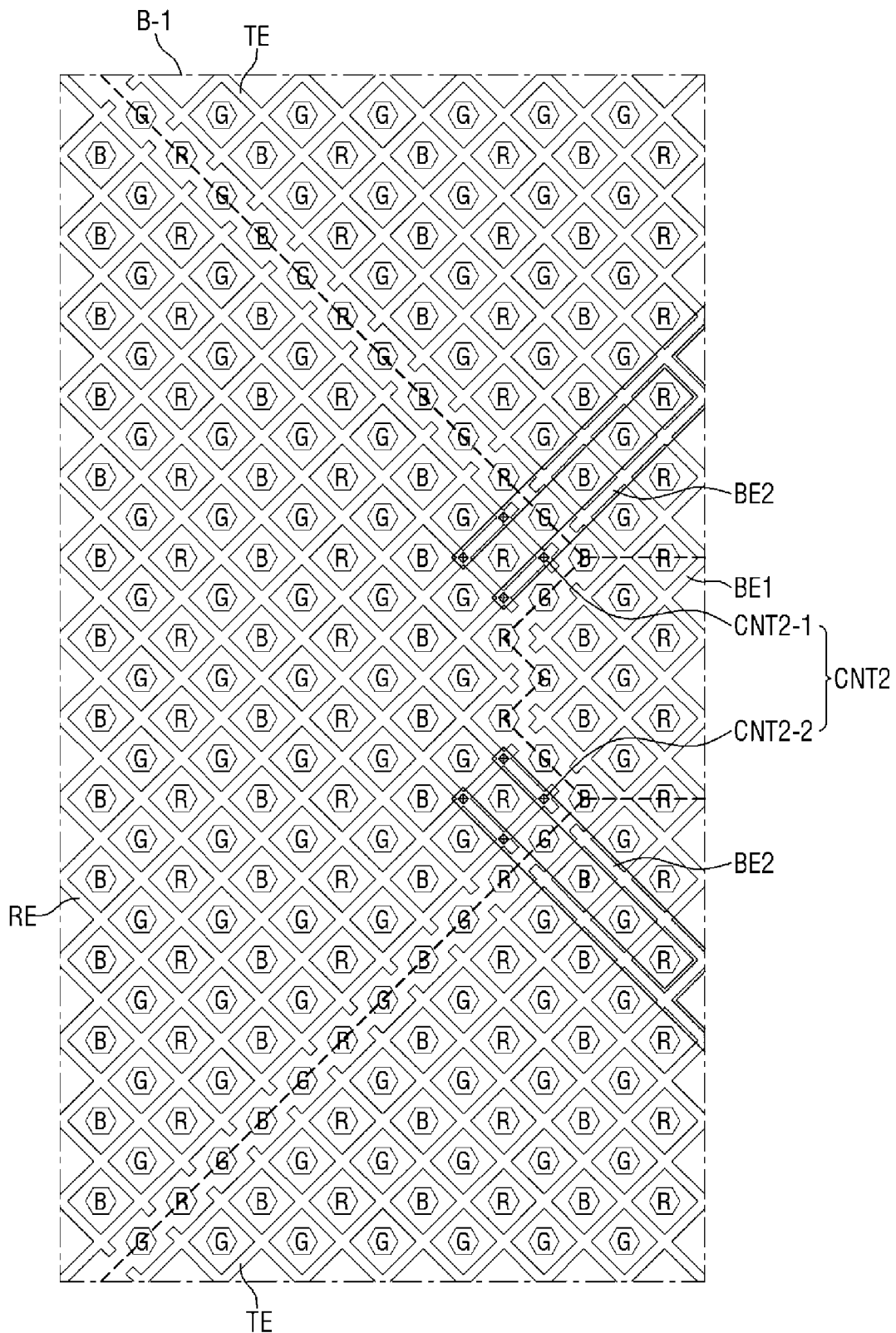
FIGS. 25A and 25B are enlarged plan views showing areas B-1 and B-2 of FIG. 23, respectively.
Figure 25B:
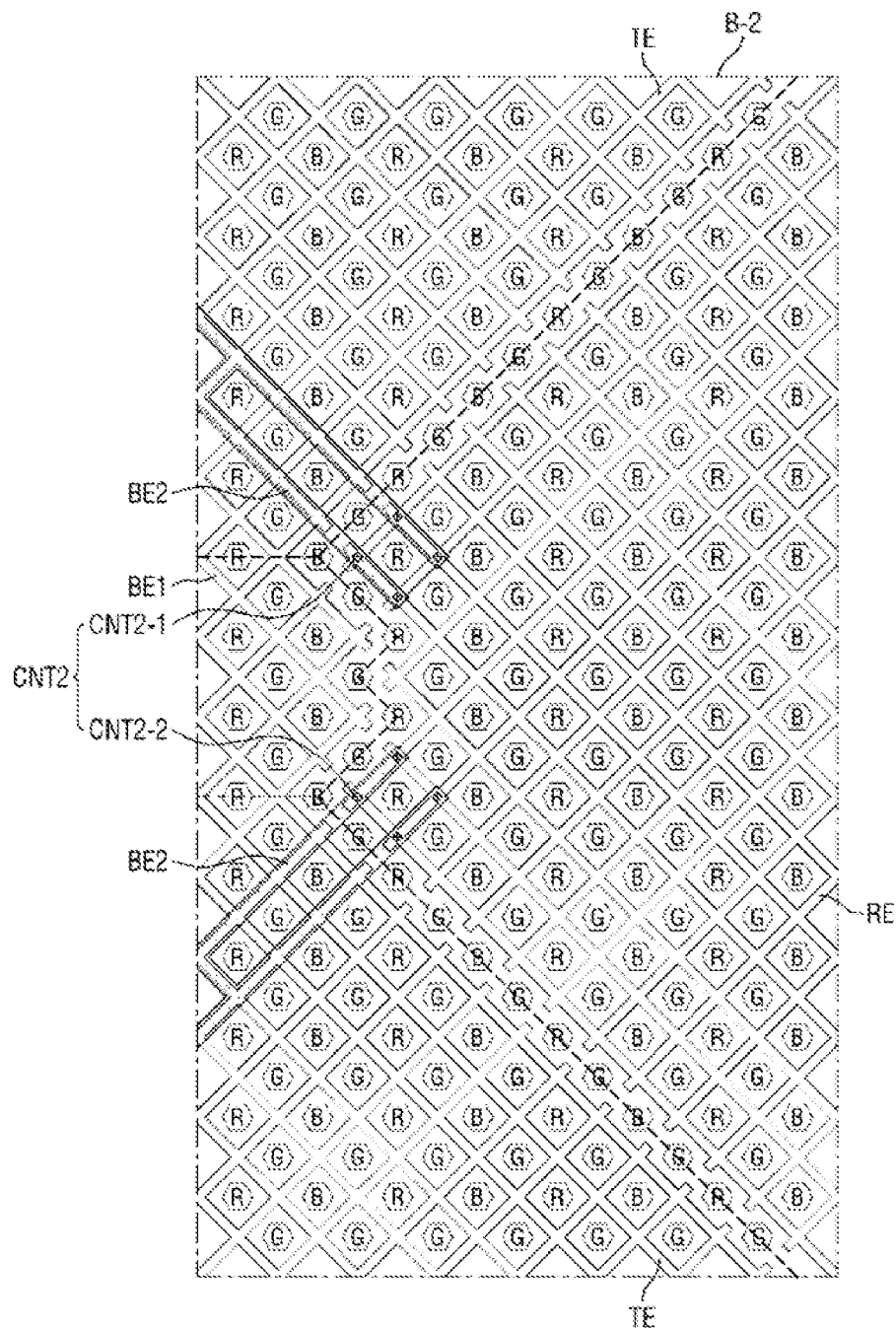

FIG. 22 is an enlarged plan view showing an example of area A of FIG. 21. FIG. 23 is an enlarged plan view showing an example of area B of FIG. 21. FIGS. 24A and 24B are enlarged plan views showing areas A-1 and A-2 of FIG. 22, respectively. FIGS. 25A and 25B are enlarged plan views showing areas B-1 and B-2 of FIG. 23, respectively.

The example embodiment shown in FIGS. 22 to 25B is different from the example embodiment shown in FIGS. 10 to 13 in that the first connection pattern BE1 is disposed on the same layer as the driving electrodes TE and the second connection pattern BE2 is disposed on a different layer from the sensing electrodes RE in the first area PA1 and the second area PA2 of the touch sensing area TSA, and that the proximity sensing electrodes PE are electrically connected with one another along the first direction (x-axis direction) through the third connection pattern BE3 in the first area PAL The following description focuses on the differences.

Referring to FIGS. 22 to 25B, since the driving electrodes TE, the sensing electrode RE, the proximity sensing electrodes PE, the conductive patterns DE, the first connection pattern BE1, the (3-1) connection pattern BE-1, and the (3-2) connection pattern BE3-2 are formed on the same layer, they may be spaced apart from each other. There may be gaps between the driving electrode TE and the sensing electrode RE, between the sensing electrode RE and the proximity sensing electrode PE, between the driving electrode TE and the second connection pattern BE2, between the sensing electrode RE and the (3-1) connection pattern BE3-1, between the sensing electrode RE and the (3-2) connection pattern BE3-2, and between the driving electrode TE and the conductive pattern DE. For convenience of illustration, the boundary between the driving electrode TE and the sensing electrode RE, the boundary between the driving electrode TE and the first connection pattern BE1, the boundary between the sensing electrode RE and the first connection pattern BE1, the boundary between the sensing electrode RE and the (3-1) connection pattern BE3-1, and the boundary between the sensing electrode RE and the (3-2) connection pattern BE3-2 are indicated by dashed lines in FIGS. 24A and 24B. For convenience of illustration, the boundary between the driving electrode TE and the sensing electrode RE, the boundary between the driving electrode TE and the first connection pattern BE1, and the boundary between the sensing electrode RE and the first connection pattern BE1 are indicated by dashed lines in FIGS. 18A and 18B.

The first connection pattern BE1 may be disposed between the driving electrodes TE. The first connection pattern BE1 is formed on the same layer as the driving electrodes TE and may be extended from each of the driving electrodes TE. For example, the driving electrodes TE and the first connection pattern BE1 may be formed in the second layer shown in FIG. 14. Therefore, the first connection pattern BE1 may be connected to the driving electrodes TE without any additional contact hole.

The second connection pattern BE2 may be formed on a different layer from the sensing electrodes RE and may be connected to the sensing electrodes RE through the second contact holes CNT2. The second connection patterns BE2 may be connected to the sensing electrodes RE through the second contact holes CNT2, respectively. One end of each of the second connection patterns BE2 may be connected to one of the sensing electrodes RE adjacent to each other in the first direction (x-axis direction) through a (2-1) contact hole CNT2-1. The other end of each of the second connection patterns BE2 may be connected to another one of the sensing electrodes RE adjacent to each other in the first direction (x-axis direction) through a (2-2) contact hole CNT2-2. The second connection pattern BE2 may overlap the driving electrodes TE and the sensing electrode RE. Alternatively, the second connection pattern BE2 may overlap the first connection pattern BE1 instead of the driving electrode TE. Alternatively, the second connection pattern BE2 may overlap the driving electrode TE as well as the first connection pattern BE1. Since the second connection pattern BE2 is formed on a different layer from the driving electrodes TE, the sensing electrodes RE and the first connection pattern BE1, it is possible to prevent a short-circuit from being created in the driving electrode TE and/or the first connection pattern BE1 even though the second connection pattern BE2 overlaps the driving electrode TE and/or the first connection pattern BE1. For example, the second connection pattern BE2 may be formed in the first layer shown in FIG. 14, and the sensing electrodes RE may be formed in the second layer shown in FIG. 14. The second layer may be disposed on the first layer.

The third connection pattern BE3 may include a (3-1) connection pattern BE3-1, a (3-2) connection pattern BE3-2, and a (3-3) connection pattern BE3-3.

Each of the (3-1) connection pattern BE3-1 and the (3-2) connection pattern BE3-2 may be electrically separated from the sensing electrode RE. Each of the (3-1) connection pattern BE3-1 and the (3-2) connection pattern BE3-2 may be spaced apart from the sensing electrodes RE.

The (3-1) connection pattern BE3-1 may be connected to the proximity sensing electrode PE surrounded by one of the sensing electrodes RE adjacent to each other in the first direction (x-axis direction). The (3-2) connection pattern BE3-2 may be connected to the proximity sensing electrode PE surrounded by another one of the sensing electrodes RE adjacent to each other in the first direction (x-axis direction).

Each of the (3-3) connection patterns BE3-3 may be connected to the (3-1) connection pattern BE3-1 and the (3-2) connection pattern BE3-2. The (3-3) connection patterns BE3-3 may be formed on a different layer from the (3-1) connection patterns BE3-1 and the (3-2) connection patterns BE3-2, and may be connected to the (3-1) connection pattern BE3-1 and the (3-2) connection pattern BE3-2 through the third contact holes CNT3. For example, the (3-3) connection patterns BE3-3 may be formed in the first layer shown in FIG. 14, and the proximity sensing electrodes PE, the (3-1) connection pattern BE3-1 and the (3-2) connection pattern BE3-2 may be formed in the second layer shown in FIG. 14. The second layer may be disposed on the first layer.

Each of the (3-3) connection patterns BE3-3 may be bent at least once. As shown in FIG. 22, the (3-3) connection pattern BE3-3 may be bent more than the first connection pattern BE1, but the present disclosure is not limited thereto. In FIG. 22, the (3-3) connection pattern BE3-3 is bent three times, but the number of bendings of the (3-3) connection pattern BE3-3 is not limited thereto. In addition, since the proximity sensing electrodes PE adjacent to each other in the first direction (x-axis direction) are connected by a plurality of the (3-3) connection patterns BE3-3, even if any of the (3-3) connection patterns BE3-3 is disconnected, the proximity sensing electrodes PE can still be stably connected with each other. Although two adjacent ones of the proximity sensing electrodes PE are connected by two (3-3) connection patterns BE3-3 in the example shown in FIG. 10, but the number of the (3-3) connection patterns BE3-3 is not limited thereto.

According to the embodiment shown in FIGS. 22 to 25B, the second connection patterns BE2 connecting the sensing electrodes RE adjacent to one another in the first direction (x-axis direction) and the (3-3) connection patterns BE3-3 electrically connecting the proximity sensing electrodes PE adjacent to one another in the first direction (x-axis direction) may be formed in the first layer, while the driving electrodes TE, the sensing electrodes RE, the proximity sensing electrodes PE, the first connection pattern BE1, the (3-1) connection pattern BE3-1 and the (3-2) connection pattern BE3-2 may be formed in the second layer different from the first layer. Therefore, the driving electrodes TE, the sensing electrodes RE and the proximity sensing electrodes PE may be electrically separated from each other at their intersections, the sensing electrodes RE may be electrically connected with one another in the first direction (x-axis direction), and the driving electrodes TE may be electrically connected with each other in the second direction (y-axis direction).

Figure 26:
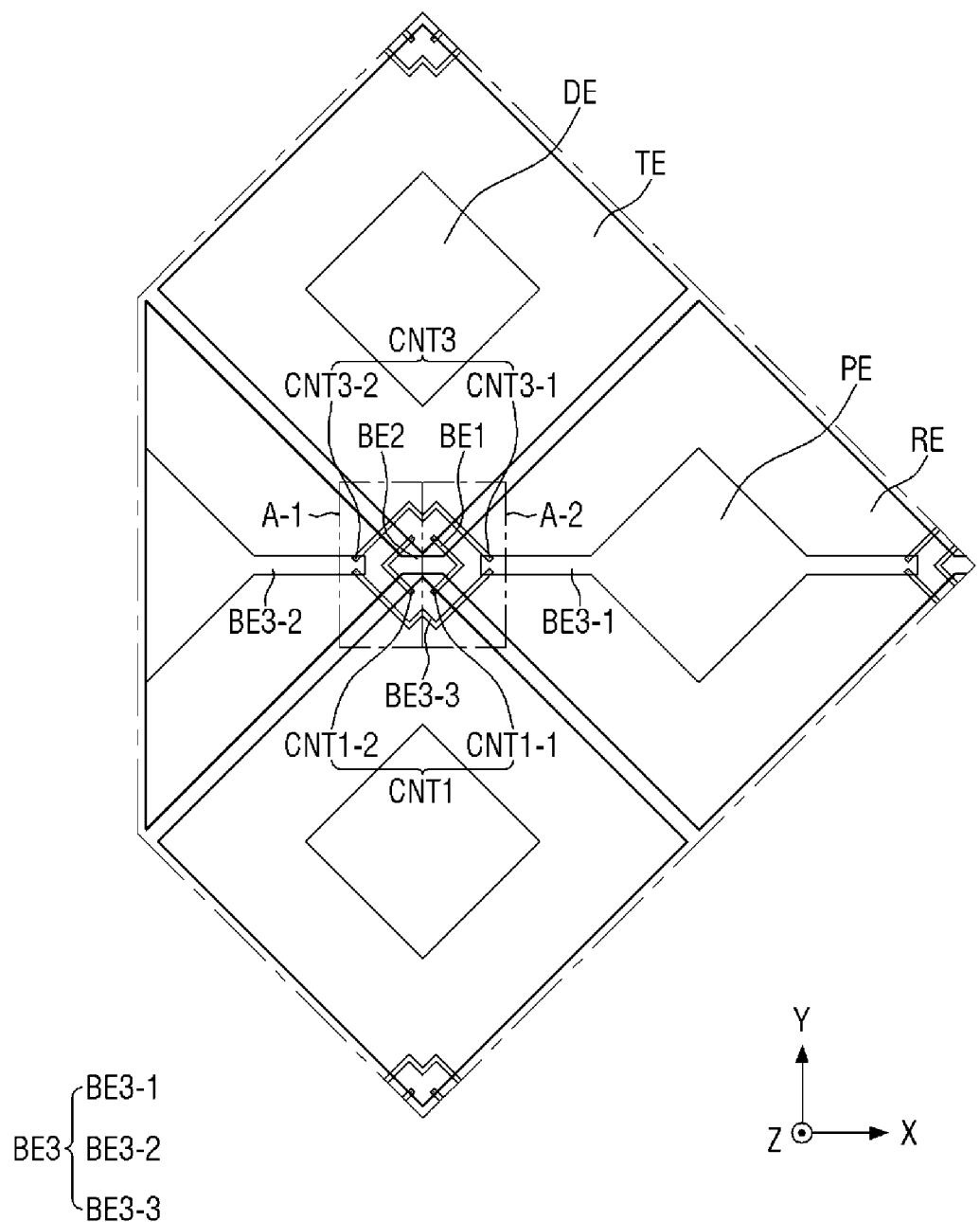
FIG. 26 is an enlarged plan view showing an example of area A of FIG. 21.
Figure 27:
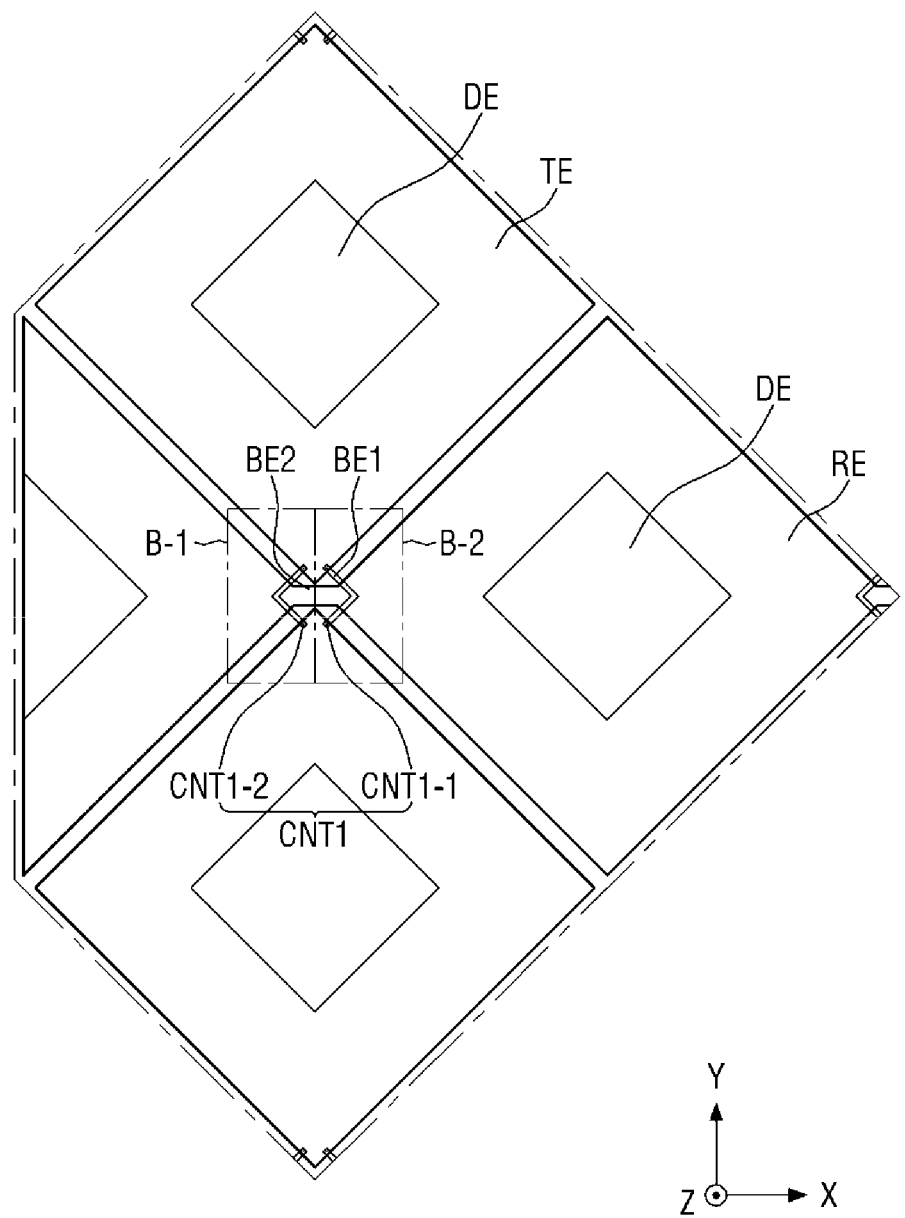
FIG. 27 is an enlarged plan view showing an example of area B of FIG. 21.
Figure 28A:
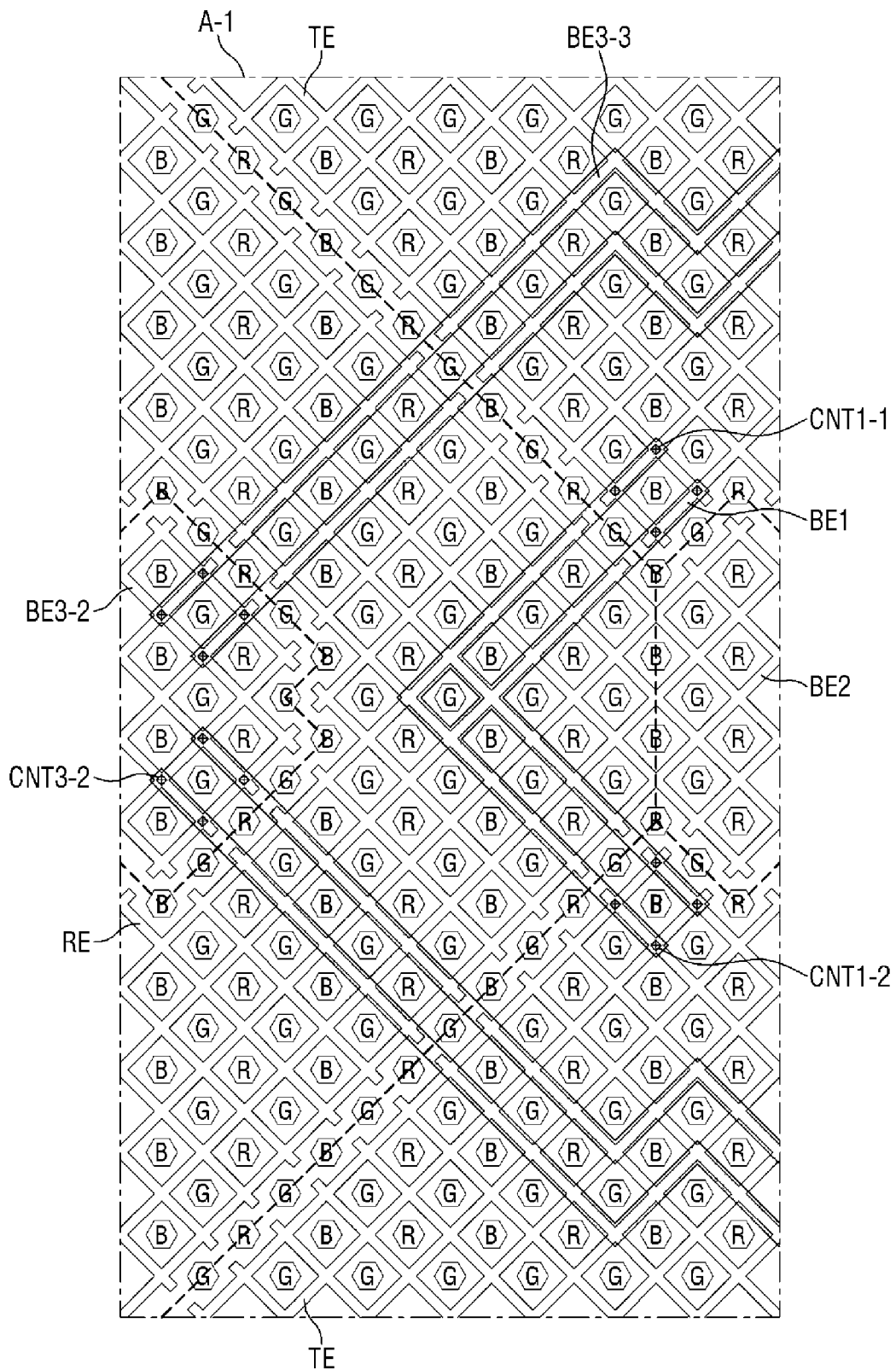
FIGS. 28A and 28B are enlarged plan views showing areas A-1 and A-2 of FIG. 26, respectively.
Figure 28B:
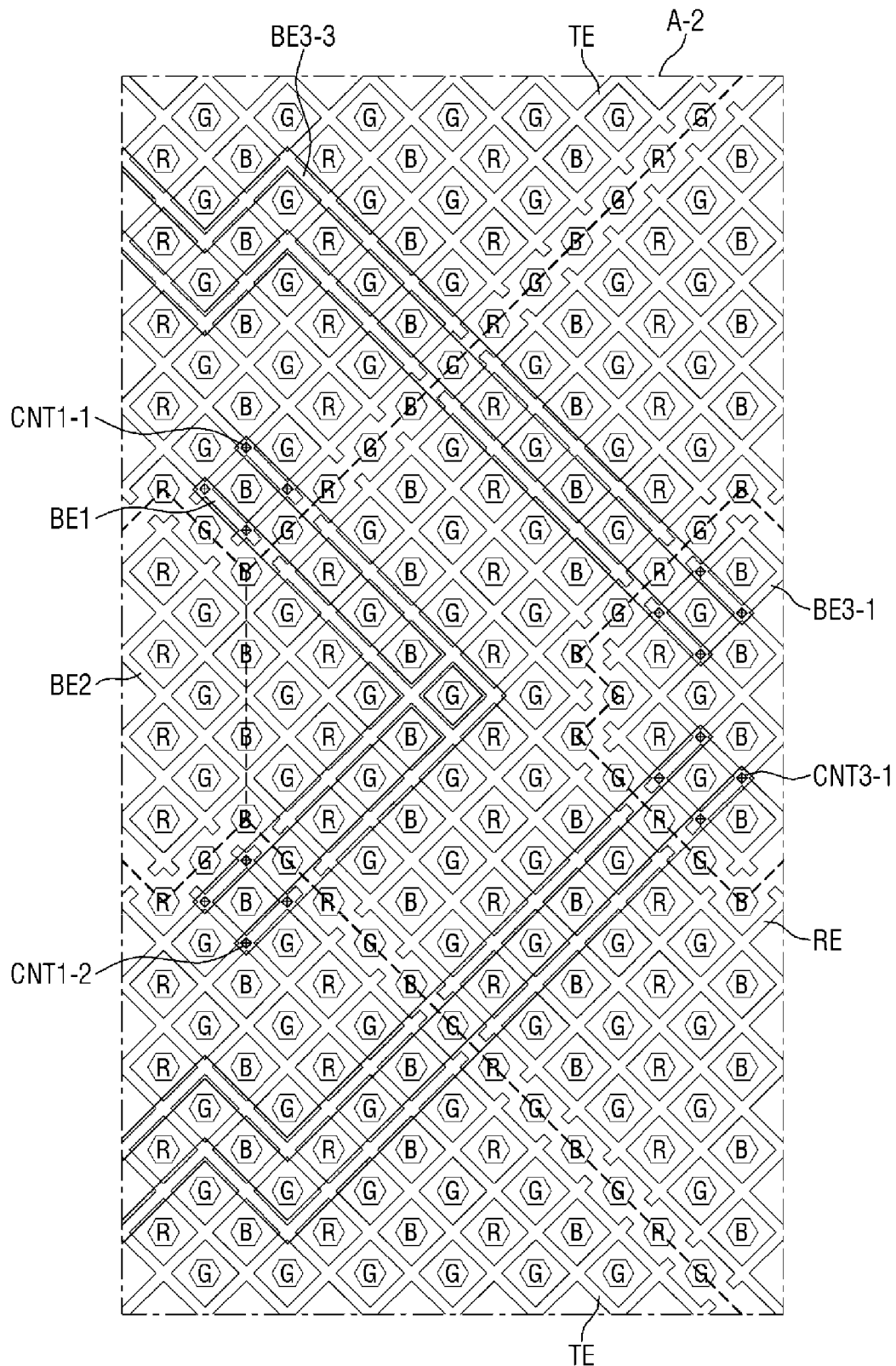
Figure 29A:
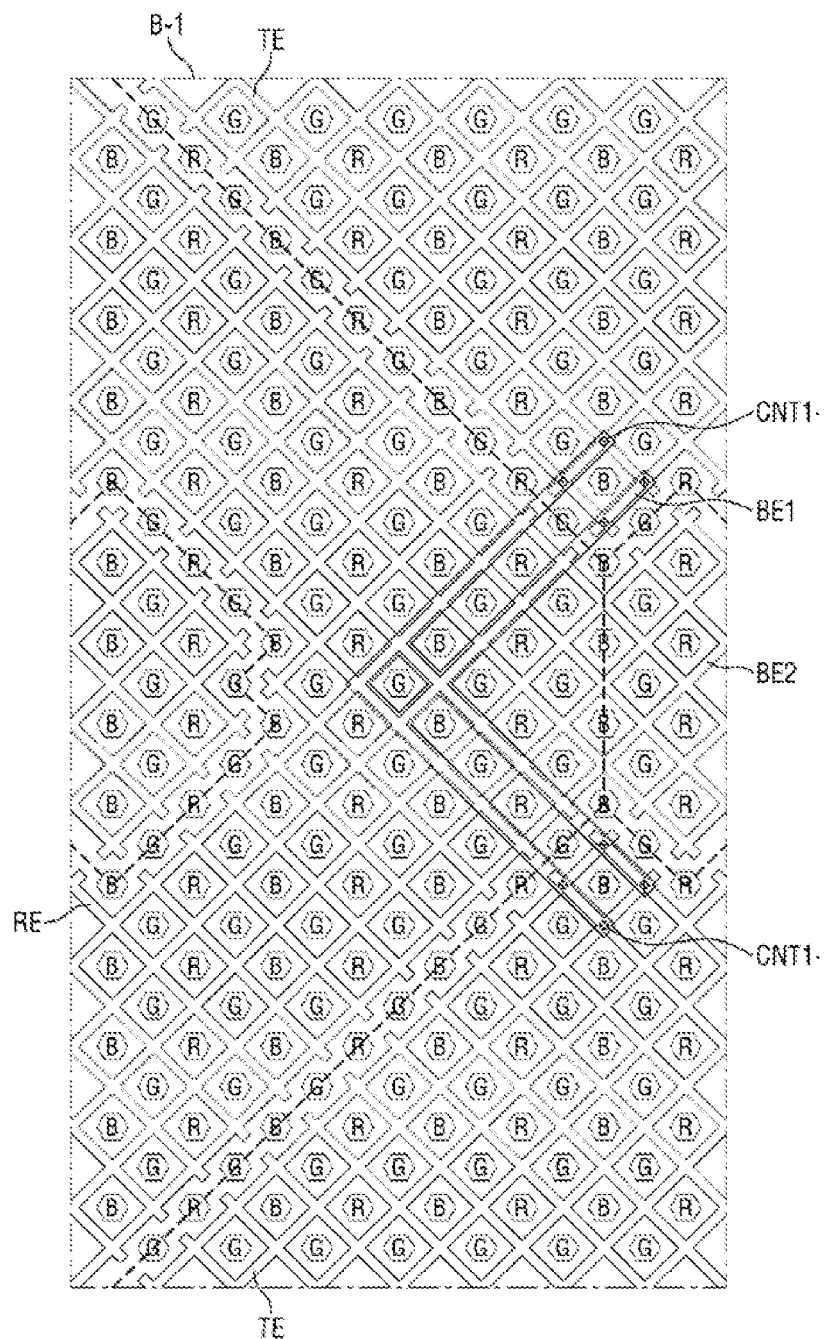
FIGS. 29A and 29B are enlarged plan views showing areas B-1 and B-2 of FIG. 27, respectively.
Figure 29B:
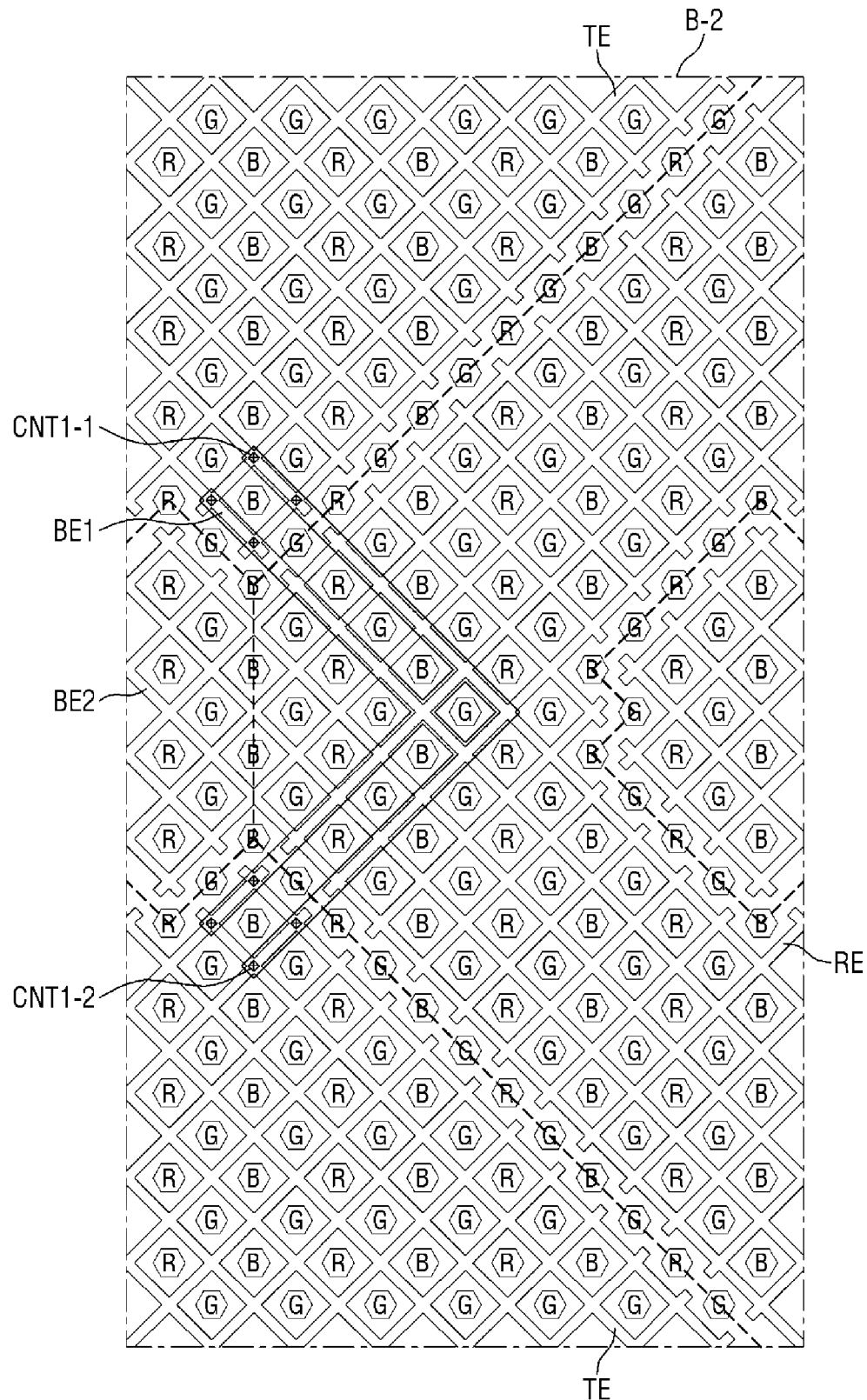

FIG. 26 is an enlarged plan view showing an example of area A of FIG. 21. FIG. 27 is an enlarged plan view showing an example of area B of FIG. 21. FIGS. 28A and 28B are enlarged plan views showing areas A-1 and A-2 of FIG. 26, respectively. FIGS. 29A and 29B are enlarged plan views showing areas B-1 and B-2 of FIG. 27, respectively.

The example embodiment shown in FIGS. 26 to 29B is different from the example embodiment shown in FIGS. 22 to 25B in that the first connection pattern BE1 is disposed on a different layer from the driving electrodes TE and the second connection pattern BE2 is disposed on the same layer as the sensing electrodes RE in the first area PA1 and the second area PA2. The following description focuses on the differences.

Referring to FIGS. 26 to 29B, since the driving electrodes TE, the sensing electrode RE, the proximity sensing electrodes PE, the conductive patterns DE, the second connection pattern BE2, the (3-1) connection pattern BE-1, and the (3-2) connection pattern BE3-2 are formed on the same layer, they may be spaced apart from each other. There may be gaps between the driving electrode TE and the sensing electrode RE, between the driving electrode TE and the proximity sensing electrode PE, between the driving electrode TE and the second connection pattern BE2, between the sensing electrode RE and the (3-1) connection pattern BE3-1, between the sensing electrode RE and the (3-2) connection pattern BE3-2, and between the driving electrode TE and the conductive pattern DE. For convenience of illustration, the boundary between the driving electrode TE and the sensing electrode RE, the boundary between the driving electrode TE and the second connection pattern BE2, the boundary between the sensing electrode RE and the second connection pattern BE2, the boundary between the sensing electrode RE and the (3-1) connection pattern BE3-1, and the boundary between the sensing electrode RE, and the (3-2) connection pattern BE3-2 are indicated by dashed lines in FIGS. 28A and 28B. For convenience of illustration, the boundary between the driving electrode TE and the sensing electrode RE, the boundary between the driving electrode TE and the second connection pattern BE2, and the boundary between the sensing electrode RE and the second connection pattern BE2 are indicated by dashed lines in FIGS. 29A and 29B.

The first connection pattern BE1 may be formed on a different layer from the driving electrodes TE and may be connected to the driving electrodes TE through the first contact holes CNT1. The first connection patterns BE1 may be connected to the driving electrodes TE through the first contact holes CNT1, respectively. One end of each of the first connection patterns BE1 may be connected to one of the driving electrodes TE adjacent to each other in the second direction (y-axis direction) through a (1-1) contact hole CNT1-1. The other end of each of the first connection patterns BE1 may be connected to another one of the driving electrodes TE adjacent to each other in the second direction (y-axis direction) through a (1-2) contact hole CNT1-2. The first connection patterns BE1 may overlap the driving electrodes TE and the sensing electrode RE. Alternatively, the first connection pattern BE1 may overlap the second connection pattern BE2 instead of the sensing electrode RE. Alternatively, the first connection pattern BE1 may overlap the sensing electrode RE as well as the second connection pattern BE2. Since the first connection pattern BE1 is formed on a different layer from the driving electrodes TE, the sensing electrodes RE, and the second connection pattern BE2, it is possible to prevent a short-circuit from being created in the sensing electrode RE and/or the second connection pattern BE2 even though the first connection pattern BE1 overlaps the sensing electrode RE and/or the second connection pattern BE2. For example, the first connection pattern BE1 may be formed in the first layer shown in FIG. 14, and the sensing electrodes RE may be formed in the second layer shown in FIG. 14. The second layer may be disposed on the first layer.

The second connection pattern BE2 may be disposed between the sensing electrodes RE. The second connection pattern BE2 is formed on the same layer as the sensing electrodes RE and may be extended from each of the sensing electrodes RE. For example, the sensing electrodes RE and the second connection pattern BE2 may be formed in the second layer shown in FIG. 14. Therefore, the second connection pattern BE2 may be connected to the sensing electrodes RE without any additional contact hole.

According to the example embodiment shown in FIGS. 26 to 29B, the first connection patterns BE1 connecting the driving electrodes TE adjacent to one another in the second direction (y-axis direction) and the (3-3) connection patterns BE3-3 electrically connecting the proximity sensing electrodes PE adjacent to one another in the first direction (x-axis direction) may be formed in the first layer, while the driving electrodes TE, the sensing electrodes RE, the proximity sensing electrodes PE, the second connection pattern BE2, the (3-1) connection pattern BE3-1 and the (3-2) connection pattern BE3-2 may be formed in the second layer different from the first layer. Therefore, the driving electrodes TE, the sensing electrodes RE and the proximity sensing electrodes PE may be electrically separated from each other at their intersections, the sensing electrodes RE may be electrically connected with one another in the first direction (x-axis direction), and the driving electrodes TE may be electrically connected with each other in the second direction (y-axis direction).

Figure 30:
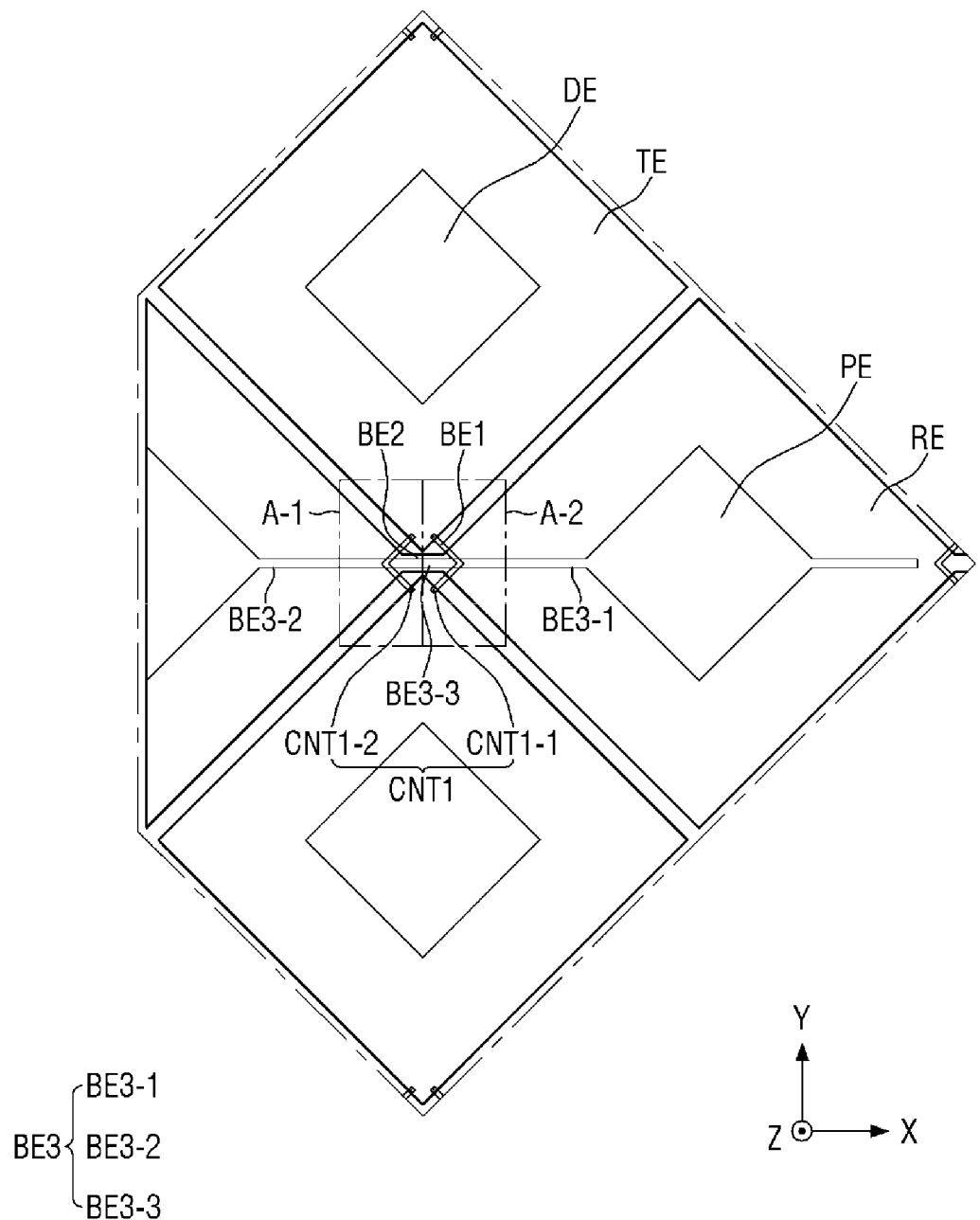
FIG. 30 is an enlarged plan view showing an example of area A of FIG. 7.
Figure 31A:
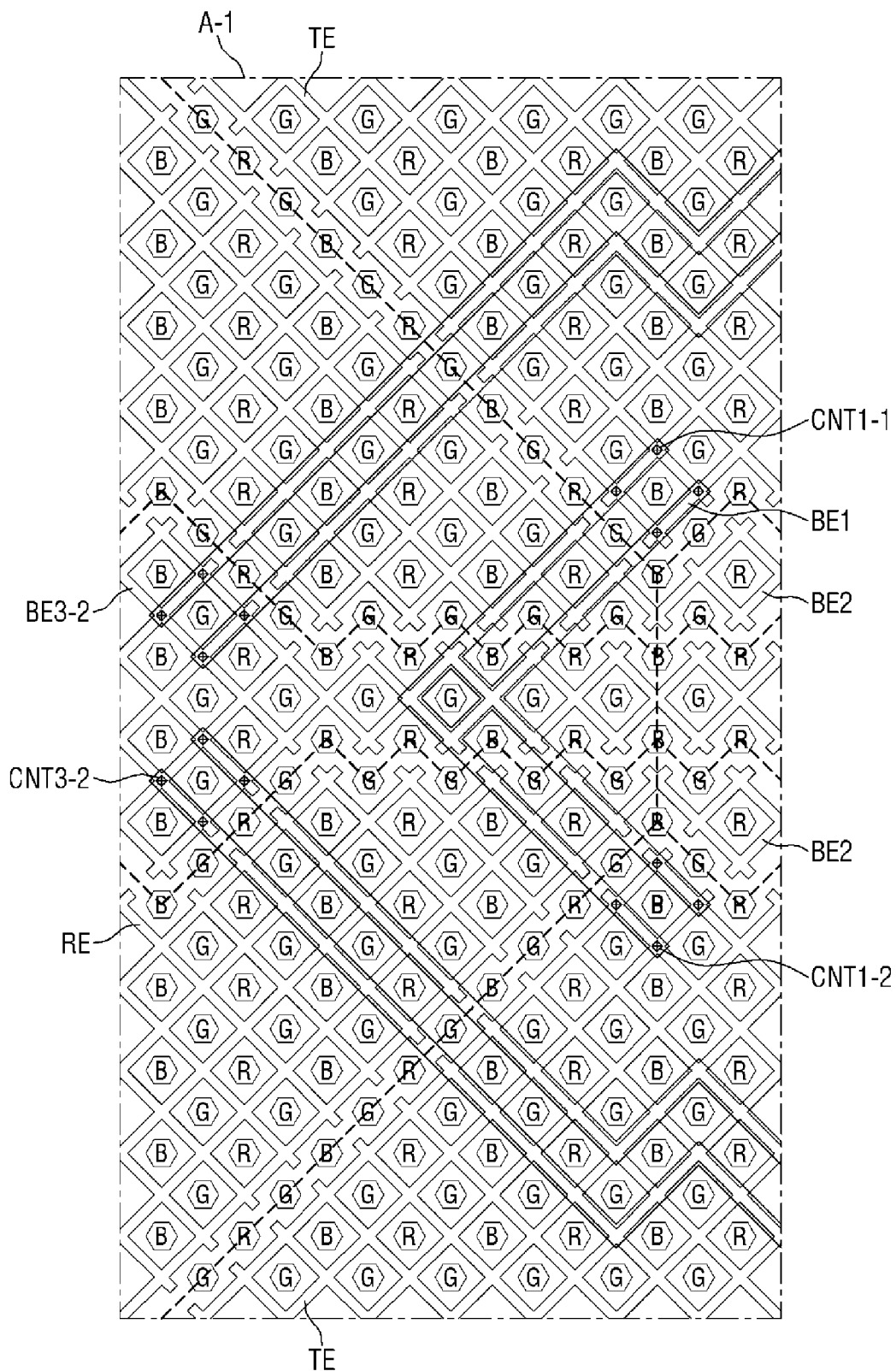
FIGS. 31A and 31B are enlarged plan views showing areas A-1 and A-2 of FIG. 30, respectively.
Figure 31B:
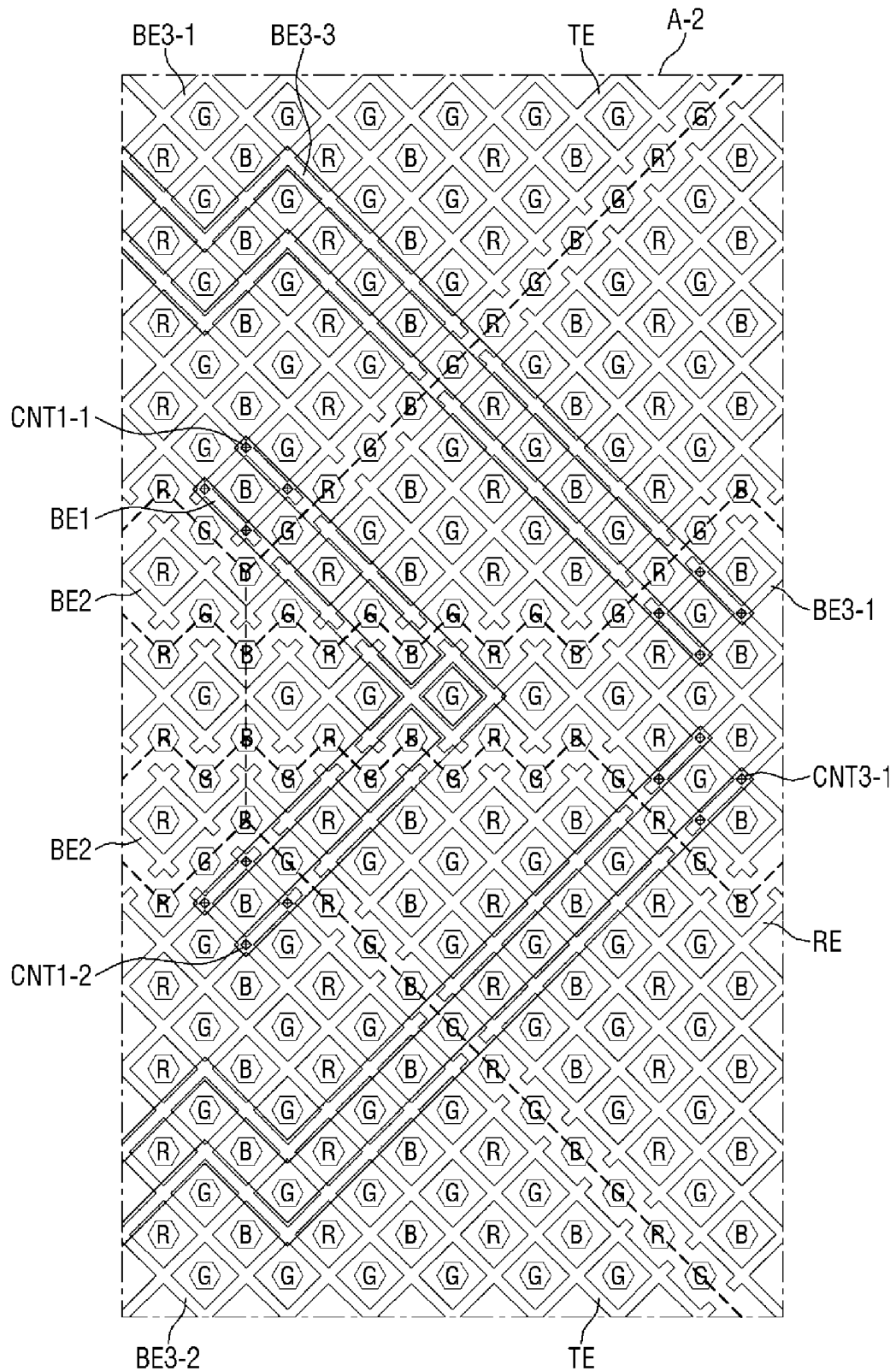

FIG. 30 is an enlarged plan view showing an example of area A of FIG. 7. FIGS. 31A and 31B are enlarged plan views showing areas A-1 and A-2 of FIG. 30, respectively.

The example embodiment shown in FIGS. 30 to 31B is different from the example embodiment shown in FIGS. 26 to 29B in that the (3-3) connection pattern BE3-3 is disposed on the same layer as the sensing electrodes RE in the first area PA1. The second area PA2 according to the example embodiment shown in FIGS. 30 to 31B is substantially identical to the second area PA2 according to the example embodiment shown in FIGS. 26 to 29; and, therefore, the redundant description is omitted. The following description will focus on the differences.

Referring to FIGS. 30 to 31B, since the driving electrodes TE, the sensing electrode RE, the proximity sensing electrodes PE, the conductive patterns DE, the second connection pattern BE2, the (3-1) connection pattern BE-1, the (3-2) connection pattern BE3-2, and the (3-3) connection pattern BE3-3 are formed on the same layer, they may be spaced apart from each other. There may be gaps between the driving electrode TE and the sensing electrode RE, between the driving electrode TE and the proximity sensing electrode PE, between the driving electrode TE and the second connection pattern BE2, between the sensing electrode RE and the (3-1) connection pattern BE3-1, between the sensing electrode RE and the (3-2) connection pattern BE3-2, between the sensing electrode RE and the (3-3) connection pattern BE3-3, and between the driving electrode TE and the conductive pattern DE. For convenience of illustration, the boundary between the driving electrode TE and the sensing electrode RE, the boundary between the driving electrode TE and the second connection pattern BE2, the boundary between the sensing electrode RE and the second connection pattern BE2, the boundary between the sensing electrode RE and the (3-1) connection pattern BE3-1, the boundary between the sensing electrode RE and the (3-2) connection pattern BE3-2, the boundary between the second connection pattern BE2 and the (3-3) connection pattern BE3-3, the boundary between the (3-1) connection pattern BE3-1 and the (3-3) connection pattern BE3-3, and the boundary between the (3-2) connection pattern BE3-2 and the (3-3) connection pattern BE3-3 are indicated by dashed lines in FIGS. 31A and 31B.

The third connection pattern BE3 may include a (3-1) connection pattern BE3-1, a (3-2) connection pattern BE3-2, and a (3-3) connection pattern BE3-3. Since the (3-1) connection pattern BE3-1 and the (3-2) connection pattern BE3-2 are substantially identical to those described with reference to FIGS. 26 to 29B, therefore, the redundant description is omitted.

The (3-3) connection pattern BE3-3 may be disposed between the (3-1) connection pattern BE3-1 and the (3-2) connection pattern BE3-2. The (3-3) connection pattern BE3-3 may be formed on the same layer as the (3-1) connection pattern BE3-1, the (3-2) connection pattern BE3-2 and the proximity sensing electrodes PE. The (3-3) connection pattern BE3-3 may be extended from each of the (3-1) connection pattern BE3-1 and the (3-2) connection pattern BE3-2. For example, the proximity sensing electrodes PE, the (3-1) connection pattern BE3-1, the (3-2) connection pattern BE3-2, and the (3-3) connection pattern BE3-3 may be formed in the second layer shown in FIG. 14. Therefore, the (3-3) connection pattern BE3-3 may be connected to the (3-1) connection pattern BE3-1 and the (3-2) connection pattern BE3-2 without any additional contact hole.

According to the example embodiment shown in FIGS. 19 and 20, the second connection patterns BE2 connecting the sensing electrodes RE adjacent to one another in the second direction (y-axis direction) may be formed in the first layer, while the driving electrodes TE, the sensing electrodes RE, the proximity sensing electrodes PE, the second connection pattern BE2, the (3-1) connection pattern BE3-1, the (3-2) connection pattern BE3-2, and the (3-3) connection pattern BE3-3 may be formed in the second layer different from the first layer. Therefore, the driving electrodes TE, the sensing electrodes RE, and the proximity sensing electrodes PE may be electrically separated from each other at their intersections, the sensing electrodes RE may be electrically connected with one another in the first direction (x-axis direction), and the driving electrodes TE and the proximity sensing electrodes PE may be electrically connected with each other in the second direction (y-axis direction).

Figure 32:
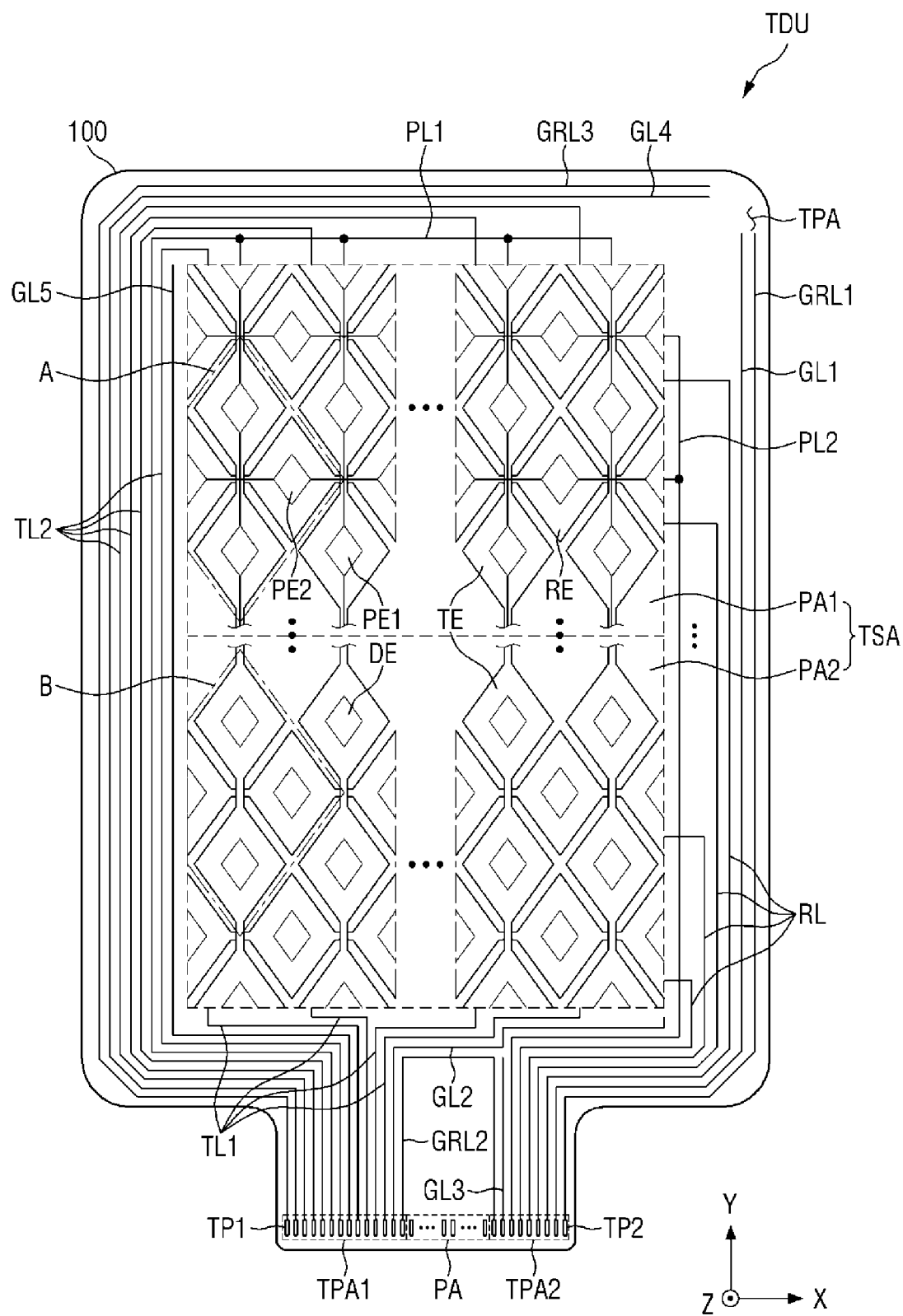
FIG. 32 is a plan view showing the touch detecting unit of FIG. 5 and the related elements.

FIG. 32 is a plan view showing the touch detecting unit of FIG. 5 and the related elements.

The example embodiment shown in FIG. 32 is different from the example embodiment shown in FIG. 7 in that first proximity sensing electrodes PE1 are arranged in the second direction (y-axis direction) and electrically connected with one another, and second proximity sensing electrodes PE2 are arranged in the first direction (x-axis direction) and electrically connected with one another in the first area PA1. The following description focuses on the differences.

Referring to FIG. 32, in the first area PA1, the first proximity sensing electrodes PE1 may be arranged in parallel in the second direction (y-axis direction) and may be electrically connected with one another. The first proximity sensing electrodes PE1 may be surrounded by the driving electrodes TE, respectively. In order to electrically separate the sensing electrodes RE from the first proximity sensing electrodes PE1 at their intersections, the first proximity sensing electrodes PE1 adjacent to each other in the second direction (y-axis direction) may be connected through third connection patterns BE3, and the sensing electrodes RE adjacent to each other in the first direction (x-axis direction) may be connected through the second connection patterns BE2.

The second proximity sensing electrodes PE2 may be arranged in parallel in the first direction (x-axis direction) and electrically connected to one another. The second proximity sensing electrodes PE2 may be surrounded by the sensing electrodes RE, respectively. In order to electrically separate the driving electrodes TE from the second proximity sensing electrodes PE2 at their intersections, the second proximity sensing electrodes PE2 adjacent to each other in the first direction (x-axis direction) may be connected through a fourth connection patterns BE4 (not shown in FIG. 32), and the driving electrodes TE adjacent to each other in the second direction (y-axis direction) may be connected through first connection patterns BE1.

The first proximity sensing electrodes PE1 disposed on one side, e.g., the upper side of the touch sensing area TSA may be connected to a first proximity sensing line PL1. For example, the uppermost one of the first proximity sensing electrodes PE1 electrically connected with one another in the second direction (y-axis direction) may be connected to the first proximity sensing line PL1. The first proximity sensing line PL1 may be connected to the first touch pads TP1. Therefore, the touch driving circuit 400 may be electrically connected to the first proximity sensing electrodes PE1.

The second proximity sensing electrodes PE2 disposed on the other side, e.g., the right side of the touch sensing area TSA may be connected to a second proximity sensing line PL2. For example, the rightmost one of the second proximity sensing electrodes PE2 electrically connected with one another in the first direction (x-axis direction) may be connected to the second proximity sensing line PL2. The second proximity sensing line PL2 may be connected to the second touch pads TP2. Therefore, the touch driving circuit 400 may be electrically connected to the second proximity sensing electrodes PE2.

According to the example embodiment shown in FIG. 32, the driving electrodes TE and the sensing electrodes RE may be disposed in both the first area PA1 and the second area PA2 of the touch sensing area TSA, and the first proximity sensing electrodes PE1 and the second proximity sensing electrode PE2 may be disposed only in the first area PA1 of the touch sensing area TSA. Therefore, in the first area PA1, first mutual capacitances $C_{m1}$ may be formed between the driving electrodes TE and the sensing electrodes RE, a second mutual capacitance $C_{m2}$ may be formed between the driving electrodes TE and the first proximity sensing electrodes PE1, and a third mutual capacitance $C_{m3}$ may be formed between the driving electrodes TE and the second proximity sensing electrodes PE2, and thus touch sensing as well as proximity sensing can be performed. In addition, in the second area PA2, only the first mutual capacitances $C_{m1}$ are formed between the driving electrodes TE and the sensing electrodes RE, only touch sensing can be performed.

On the other hand, proximity sensing should be able to detect the presence of a person or an object without any physically contact with the touch detecting unit TDU. Therefore, it is desired that the magnitude of the mutual capacitance for detecting proximity of a person or an object is larger than the magnitude of the mutual capacitance for detecting a touch of a person or an object. According to the example embodiment shown in FIG. 32, the third mutual capacitance $C_{m3}$ is included in addition to the second mutual capacitance $C_{m2}$, and thus the magnitude of the mutual capacitance can be increased for proximity sensing.

Figure 33:
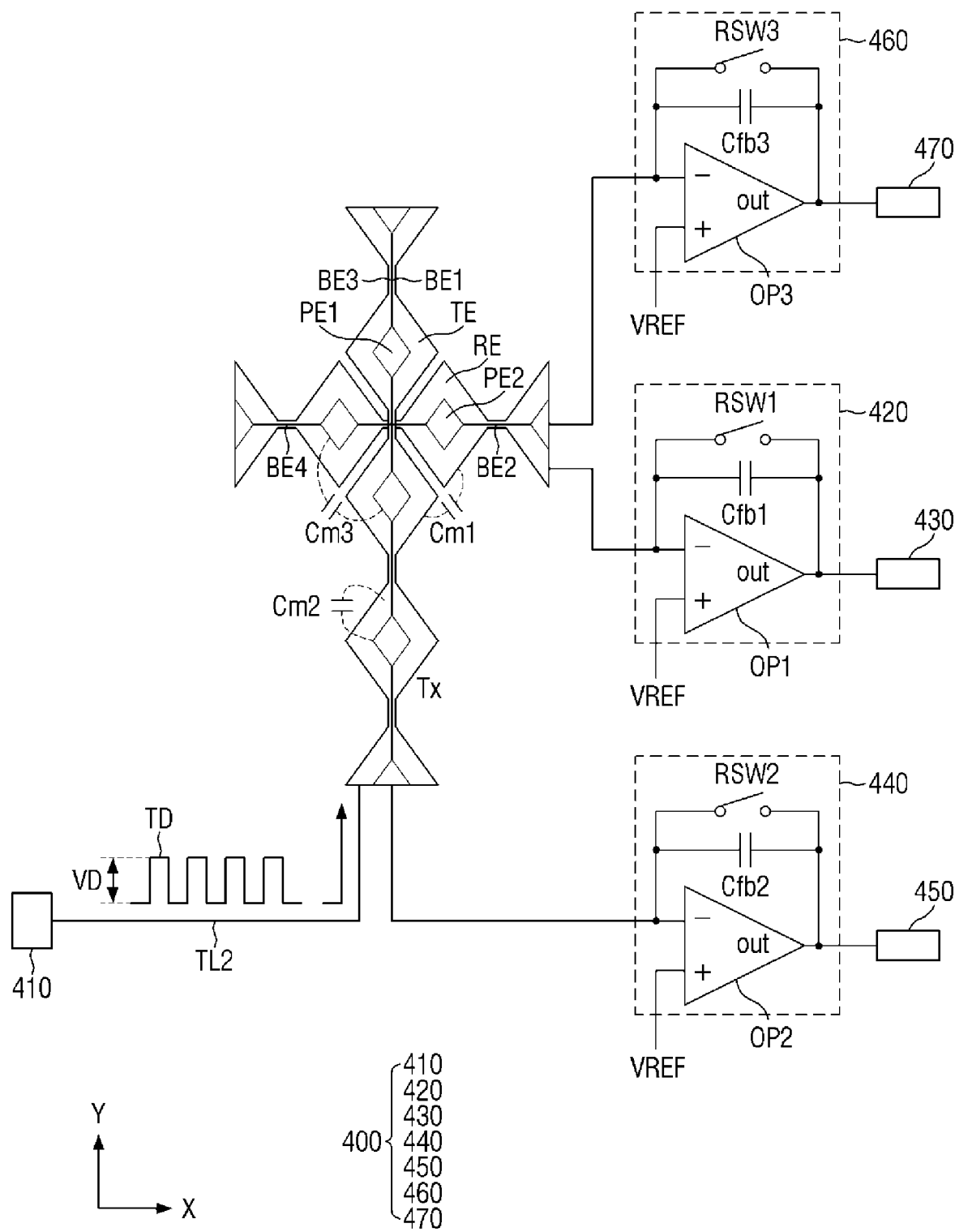
FIG. 33 shows an example of a method for detecting the amount of change in a first mutual capacitance, and the amount of change in a second mutual capacitance and the amount of change in a third mutual capacitance in the first area of FIG. 32.

FIG. 33 shows an example of a method for detecting the amount of change in the first mutual capacitance $C_{m1}$, and the amount of change in the second mutual capacitance $C_{m2}$ and the amount of change in the third mutual capacitance $C_{m3}$ in the first area of FIG. 32.

The example embodiment shown in FIG. 33 is different from the example embodiment shown in FIG. 8 in that the third mutual capacitance $C_{m3}$ is further formed between the driving electrode TE and the second proximity sensing electrode PE2, and a third touch detector 460 for detecting the amount of change in the third mutual capacitance $C_{m3}$, and a third analog-to-digital converter 470 are further included.

Referring to FIG. 33, the third touch detector 460 detects the voltage charged in the third mutual capacitance $C_{m3}$ through the second proximity sensing line PL2 connected to the second proximity sensing electrodes PE2. The third touch detector 460 may include a third operational amplifier OA3, a third feedback capacitor $C_{fb3}$, and a third reset switch RSW3. The third operational amplifier OA3 may include a first input terminal (−), a second input terminal (+), and an output terminal (out). The first input terminal (−) of the third operational amplifier OA3 may be connected to the second proximity sensing line PL2, the initialization voltage $V_{REF}$ may be supplied to the second input terminal (+), and the output terminal (out) may be connected to a third storage capacitor $C_{s3}$. The third storage capacitor $C_{s3}$ is connected between the output terminal (out) of the third operational amplifier OA3 and the ground to store the output voltage $V_{out3}$ of the third operational amplifier OA3. The third feedback capacitor $C_{fb3}$ and the third reset switch RSW3 may be connected in parallel between the first input terminal (−) and the output terminal (out) of the third operational amplifier OA3. The third reset switch RSW3 controls the connection of both ends of the third feedback capacitor $C_{fb3}$. When the third reset switch RSW3 is turned on such that both ends of the third feedback capacitor $C_{fb3}$ are connected, the third feedback capacitor $C_{fb3}$ may be reset.

The output voltage $V_{out3}$ of the third operational amplifier OA3 may be defined as in Equation 3 below:

$$V_{out3} = \frac{Cm3 \times Vt3}{Cfb3} \qquad \text{[Equation 3]}$$

where $V_{out3}$ denotes the output voltage of the third operational amplifier OA3, $C_{m3}$ denotes the third mutual capacitance, $C_{fb3}$ denotes the capacitance of the third feedback capacitor, and $V_{t3}$ denotes the voltage charged in the third mutual capacitance $C_{m3}$.

The third analog-to-digital converter 470 may convert the output voltage $V_{out3}$ stored in the third storage capacitor $C_{s3}$ into third digital data and output the third digital data.

The touch driving circuit 400 may be driven in the touch sensing mode and the proximity sensing mode. In the touch sensing mode, the touch driving circuit 400 may be driven to detect the amounts of change in the first mutual capacitances $C_{m1}$ of the first area PA1 and the second area PA2. In the proximity sensing mode, the touch driving circuit 400 may be driven to detect the amounts of change in the first mutual capacitances $C_{m1}$, the amounts of change in the second mutual capacitances $C_{m2}$, and the amounts of change in the third mutual capacitances $C_{m3}$.

Since the operation of the touch driving circuit 400 in the touch sensing mode is substantially identical to that described above with reference to FIGS. 8 and 9; and, therefore, the redundant description is omitted.

The touch driving signal output 410 may output the touch driving signal TD to the driving electrodes TE through the driving lines TL1 and TL2 in the proximity sensing mode. The first touch detector 420 may detect voltages charged in the first mutual capacitances $C_{m1}$ through the sensing line RL electrically connected to the sensing electrodes RE in the proximity sensing mode. The first analog-to-digital converter 430 may convert the output voltage $V_{out1}$ of the first touch detector 420 stored in the first storage capacitor $C_{s1}$ into first digital data in the proximity sensing mode.

The second touch detector 440 may detect a voltage charged in the second mutual capacitance $C_{m2}$ through the first proximity sensing line PL1 electrically connected to the first proximity sensing electrodes PE1 in the proximity sensing mode. The second analog-to-digital converter 450 may convert the output voltage $V_{out2}$ of the second touch detector 440 stored in the second storage capacitor $C_{s2}$ into second digital data in the proximity sensing mode to output it.

The third touch detector 460 may detect a voltage charged in the second mutual capacitance $C_{m2}$ through the second proximity sensing line PL2 electrically connected to the second proximity sensing electrodes PE2 in the proximity sensing mode. The second analog-to-digital converter 470 may convert the output voltage $V_{out3}$ of the third touch detector 460 stored in the third storage capacitor Cs3 into third digital data in the proximity sensing mode to output it.

The touch driving circuit 400 may determine whether a person or an object is proximate by analyzing the first digital data, the second digital data and the third digital data in the proximity sensing mode. For example, in the proximity sensing mode, the touch driving circuit 400 may determine that a person or an object is proximate when the summation of the first digital data, the second digital data, and the third digital data is greater than or equal to a second threshold value.

According to the example embodiment shown in FIG. 33, the touch detecting unit TDU can determine whether a person or an object is proximate by detecting the amount of change in the first mutual capacitances $C_{m1}$, the amount of change in the second mutual capacitance $C_{m2}$, and the amount of change in the third mutual capacitance $C_{m3}$ in the first area PA1. Therefore, the display device 10 can detect whether a person or an object is proximate without a proximity sensor. Accordingly, it is possible to prevent reduce the bezel width of the display device 10 where otherwise the proximity sensor is disposed.

Figure 34:
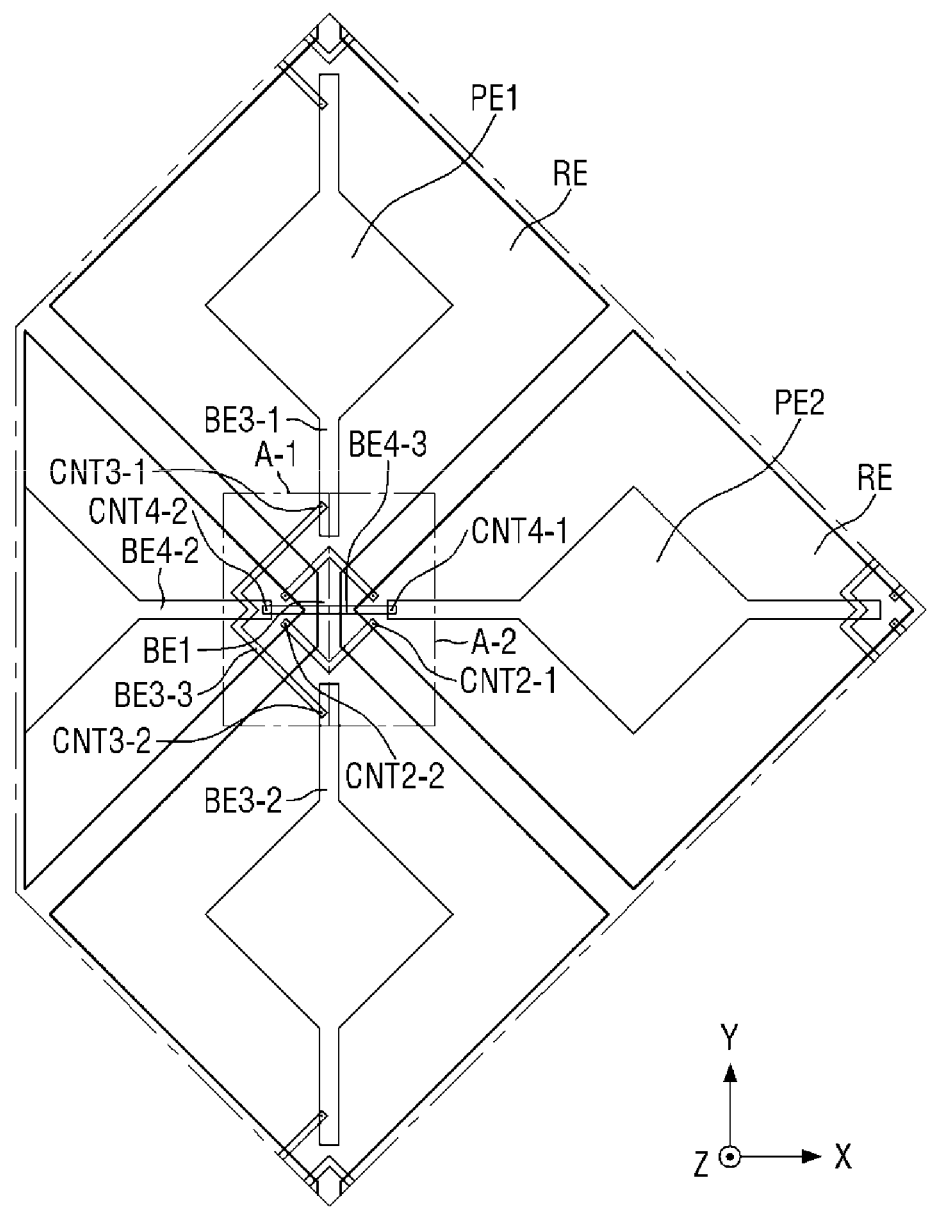
FIG. 34 is an enlarged plan view showing an example of area A of FIG. 32.
Figure 35A:
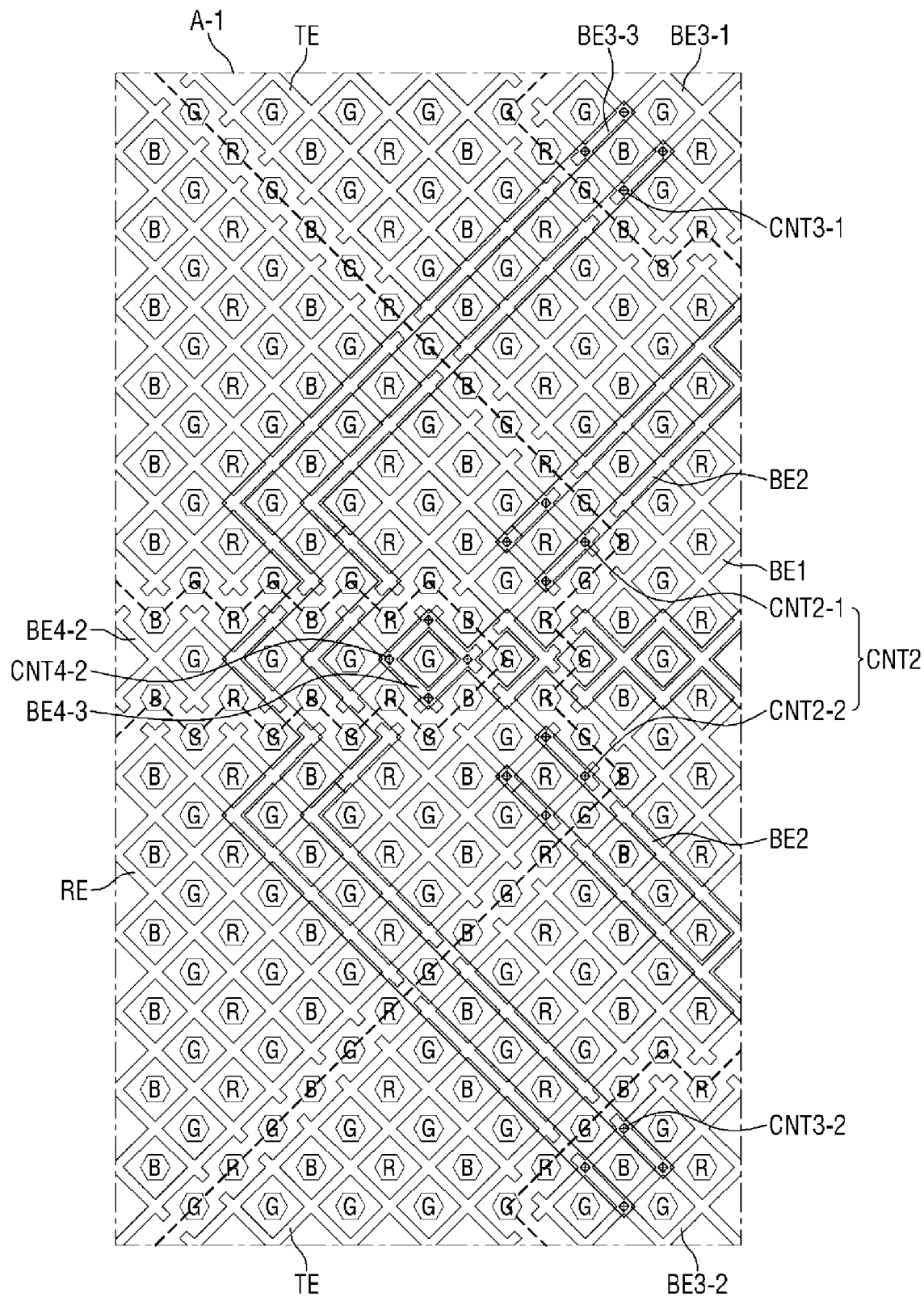
FIGS. 35A and 35B are enlarged plan views showing areas A-1 and A-2 of FIG. 34, respectively.
Figure 35B:
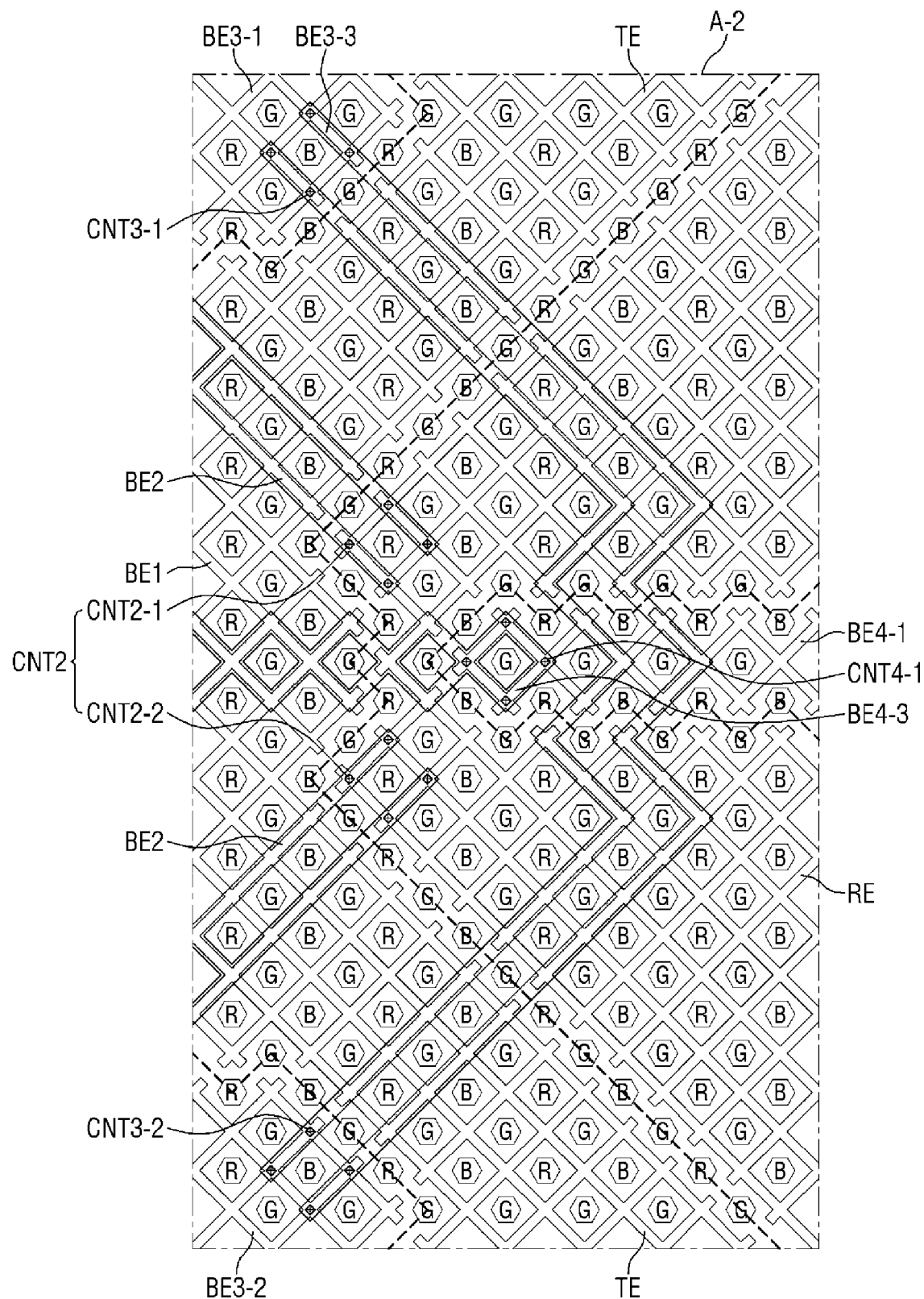

FIG. 34 is an enlarged plan view showing an example of area A of FIG. 32. FIGS. 35A and 35B are enlarged plan views showing areas A-1 and A-2 of FIG. 34, respectively.

The example embodiment shown in FIGS. 34 to 35B is different from the example embodiment shown in FIGS. 10 to 13 in that the first connection pattern BE1 is disposed on the same layer as the driving electrodes TE, and the second connection pattern BE2 is disposed on a different layer from the sensing electrodes RE in the first area PA1 and the second area PA2. The example embodiment shown in FIGS. 34 to 35B is different from the example embodiment shown in FIGS. 10 to 13 in that a (3-3) connection pattern BE3-3 is disposed between a (3-1) connection pattern BE3-1 and a (3-2) connection pattern BE3-2, a (4-1) connection pattern BE4-1 and a (4-2) connection pattern BE4-2 are disposed on the same layer as the sensing electrodes RE, and a (4-2) connection pattern BE4-2 is disposed on a different layer from the sensing electrodes RE. The following description focuses on the differences.

Referring to FIGS. 34 to 35B, since driving electrodes TE, sensing electrodes RE, first proximity sensing electrodes PE1, second proximity sensing electrodes PE2, the first connection pattern BE1, the (3-1) connection pattern BE3-1, the (3-2) connection pattern BE3-2, the (4-1) connection pattern BE4-1, and the (4-2) connection pattern BE4-2 are formed on the same layer, they may be spaced apart from each other. There may be gaps between the driving electrode TE and the sensing electrode RE, between the driving electrode TE and the first proximity sensing electrode PE1, between the driving electrode TE and the second proximity sensing electrode PE2, between the driving electrode TE and the second connection pattern BE2, between the driving electrode TE and the (3-1) connection pattern BE3-1, between the driving electrode TE and the (3-2) connection pattern BE3-2, between the sensing electrode RE and the (4-1) connection pattern BE4-1, and between the sensing electrode RE and the (4-2) connection pattern BE4-2. For convenience of illustration, the boundary between the driving electrode TE and the sensing electrode RE, the boundary between the driving electrode TE and the first connection pattern BE1, the boundary between the driving electrode TE and the (3-1) connection pattern BE3-1, the boundary between the sensing electrode RE and the (3-2) connection pattern BE3-2, the boundary between the sensing electrode RE and the first connection pattern BE1, the boundary between the sensing electrode RE and the (4-1) connection pattern BE4-1, and the boundary between the sensing electrode RE and the (4-2) connection pattern BE4-2 are indicated by dashed lines in FIGS. 35A and 35B.

The first connection pattern BE1 may be disposed between the driving electrodes TE. The first connection pattern BE1 is formed on the same layer as the driving electrodes TE and may be extended from each of the driving electrodes TE. For example, the driving electrodes TE and the first connection pattern BE1 may be formed in the second layer shown in FIG. 14. Therefore, the first connection pattern BE1 may be connected to the driving electrodes TE without any additional contact hole.

The second connection pattern BE2 may be formed on a different layer from the sensing electrodes RE and may be connected to the sensing electrodes RE through the second contact holes CNT2. The second connection patterns BE2 may be connected to the sensing electrodes RE through the second contact holes CNT2, respectively. One end of each of the second connection patterns BE2 may be connected to one of the sensing electrodes RE adjacent to each other in the first direction (x-axis direction) through a (2-1) contact hole CNT2-1. The other end of each of the second connection patterns BE2 may be connected to another one of the sensing electrodes RE adjacent to each other in the first direction (x-axis direction) through a (2-2) contact hole CNT2-2. The second connection pattern BE2 may overlap the driving electrodes TE and the sensing electrode RE. Alternatively, the second connection pattern BE2 may overlap the first connection pattern BE1 instead of the driving electrode TE. Alternatively, the second connection pattern BE2 may overlap the driving electrode TE as well as the first connection pattern BE1. Since the second connection pattern BE2 is formed on a different layer from the driving electrodes TE, the sensing electrodes RE, and the first connection pattern BE1, it is possible to prevent a short-circuit from being created in the driving electrode TE and/or the first connection pattern BE1 even though they overlap the driving electrode TE and/or the first connection pattern BE1. For example, the second connection pattern BE2 may be formed in the first layer shown in FIG. 14, and the sensing electrodes RE may be formed in the second layer shown in FIG. 14. The second layer may be disposed on the first layer.

The third connection pattern BE3 may include the (3-1) connection pattern BE3-1, the (3-2) connection pattern BE3-2, and the (3-3) connection pattern BE3-3. Since the (3-1) connection pattern BE3-1, the (3-2) connection pattern BE3-2, and the (3-3) connection pattern BE3-3 are substantially identical to those described with reference to FIGS. 10 to 13 except that the (3-3) connection pattern BE3-3 is disposed between the (3-1) connection pattern BE3-1 and the (3-2) connection pattern BE3-2, therefore, the redundant description is omitted.

The fourth connection pattern BE4 may include the (41) connection pattern BE4-1, the (4-2) connection pattern BE4-2, and the (4-3) connection pattern BE4-3. Each of the (4-1) connection pattern BE4-1 and the (4-2) connection pattern BE4-2 may be electrically separated from the sensing electrode RE. Each of the (4-1) connection pattern BE4-1 and the (4-2) connection pattern BE4-2 may be spaced apart from the sensing electrode RE. The (4-1) connection pattern BE4-1, the (4-2) connection pattern BE4-2, and the (4-3) connection pattern BE4-3 may be formed in a mesh shape.

The (4-1) connection pattern BE4-1 may be connected to the second proximity sensing electrode PE2 surrounded by one of the sensing electrodes RE adjacent to each other in the first direction (x-axis direction). The (4-2) connection pattern BE4-2 may be connected to the second proximity sensing electrode PE2 surrounded by another of the sensing electrodes RE adjacent to each other in the first direction (x-axis direction).

The (4-1) connection pattern BE4-1 may be disposed between one of the second proximity sensing electrodes PE adjacent to each other in the first direction (x-axis direction) and the (4-3) connection pattern BE4-3. The (4-1) connection pattern BE4-1 may be formed on the same layer as the second proximity sensing electrode PE2. Therefore, the (4-1) connection pattern BE4-1 may be extended from one of the second proximity sensing electrodes PE2 adjacent to one another in the first direction (x-axis direction). The (4-1) connection pattern BE4-1 may be connected to one end of the (4-3) connection pattern BE4-3 through a (4-1) contact hole CNT4-1.

The (4-2) connection pattern BE4-2 may be disposed between another one of the second proximity sensing electrodes PE adjacent to each other in the first direction (x-axis direction) and the (4-3) connection pattern BE4-3. The (4-2) connection pattern BE4-2 may be formed on the same layer as the second proximity sensing electrode PE2. Therefore, the (4-2) connection pattern BE4-2 may be extended from another one of the second proximity sensing electrodes PE2 adjacent to one another in the first direction (x-axis direction). The (4-2) connection pattern BE4-2 may be connected to the other end of the (4-3) connection pattern BE4-3 through a (4-2) contact hole CNT4-2. The (4-2) connection pattern BE4-2 may overlap the (3-3) connection pattern BE3-3. Since the (4-2) connection pattern BE4-2 is formed on a different layer from the (3-3) connection pattern BE3-3, it is possible to prevent a short-circuit from being created in the (3-3) connection pattern BE3-3 even though it the (4-2) connection pattern BE4-2 overlaps the (3-3) connection pattern BE3-3.

Each of the (4-3) connection patterns BE4-3 may be connected to the (4-1) connection pattern BE4-1 and the (4-2) connection pattern BE4-2. The (4-3) connection patterns BE4-3 may be formed on a different layer from the (4-1) connection patterns BE4-1 and the (4-2) connection patterns BE4-2, and may be connected to the (4-1) connection pattern BE4-1 and the (4-2) connection pattern BE4-2 through the fourth contact holes CNT4. For example, the (4-3) connection patterns BE4-3 may be formed in the first layer shown in FIG. 14, while the proximity sensing electrodes PE, the (4-1) connection pattern BE4-1, and the (4-2) connection pattern BE4-2 may be formed in the second layer shown in FIG. 14. The second layer may be disposed on the first layer. The (3-3) connection pattern BE3-3 may be bent at least once, while the (4-3) connection pattern BE4-3 may not be bent. The (4-3) connection patterns BE4-3 may be disposed between the (4-1) connection pattern BE4-1 and the (4-2) connection pattern BE4-2.

The (4-3) connection pattern BE4-3 may be connected to each of the (4-1) connection pattern BE4-1 and the (4-2) connection pattern BE4-2 through the fourth contact holes CNT4. One end of the (4-3) connection pattern BE4-3 may be connected to the (4-1) connection pattern BE4-1 through the (4-1) contact hole CNT4-1. The other end of the (4-3) connection pattern BE4-3 may be connected to the (4-2) connection pattern BE4-2 through the (4-2) contact hole CNT4-2. The (4-3) connection pattern BE4-3 may overlap the sensing electrodes RE and the first connection pattern BE1. Since the (4-3) connection pattern BE4-3 is formed on a different layer from the sensing electrodes RE and the first connection pattern BE1, it is possible to prevent a short-circuit from being created in the sensing electrode RE and/or the first connection pattern BE1 even though the (4-3) connection pattern BE4-3 overlaps the sensing electrode RE and the first connection pattern BE1.

According to the embodiment shown in FIGS. 34 to 35B, the second connection patterns BE2 connecting the sensing electrodes RE adjacent to one another in the first direction (x-axis direction), the (3-3) connection patterns BE3-3 electrically connecting the first proximity sensing electrodes PE1 adjacent to one another in the second direction (y-axis direction), and the (4-3) connection pattern connecting the second proximity sensing electrodes PE2 adjacent to each other in the first direction may be formed in the first layer, while the driving electrodes TE, the sensing electrodes RE, the proximity sensing electrodes PE, the first connection pattern BE1, the (3-1) connection pattern BE3-1, the (3-2) connection pattern BE3-2, the (4-1) connection pattern BE4-1, and the (4-2) connection pattern BE4-2 may be formed in the second layer different from the first layer. Therefore, the driving electrodes TE, the sensing electrodes RE, and the proximity sensing electrodes PE may be electrically separated from each other at their intersections, the sensing electrodes RE and the second proximity sensing electrode PE2 may be electrically connected with one another in the first direction (x-axis direction), and the driving electrodes TE and the first proximity sensing electrode PE1 may be electrically connected with each other in the second direction (y-axis direction).

The present disclosure should not be construed as being limited to the embodiments set forth herein. Rather, these embodiments are provided so that this disclosure will be thorough and complete and will fully convey the concept of the invention to those skilled in the art.

While the present disclosure has been particularly shown and described with reference to some embodiments thereof, it will be understood by one of ordinary skill in the art that various changes in form and detail may be made therein without departing from the spirit and scope of the present disclosure as defined by the following claims.

What is claimed is:

1. A touch detecting unit comprising:
   first sensor electrodes arranged in a first direction and electrically connected with one another;
   second sensor electrodes arranged in a second direction crossing the first direction, and electrically connected with one another, the second sensor electrodes electrically separated from the first sensor electrodes; and
   third sensor electrodes electrically separated from the first sensor electrodes and the second sensor electrodes;
   a first connection pattern connecting the first sensor electrodes adjacent to each other in the first direction;
   a second connection pattern electrically separated from the first connection pattern and connecting the second sensor electrodes adjacent to each other in the second direction; and
   a third connection pattern electrically separated from the first connection pattern and the second connection pattern and connecting the third sensor electrodes adjacent to each other in the first direction,
   wherein amounts of change in first capacitances between the first sensor electrodes and the second sensor electrodes are detected in a first mode,
   wherein amounts of change in a second capacitances between the first sensor electrodes and the third sensor electrodes and the amounts of change in the first capacitances are detected in a second mode,
   wherein the first sensor electrodes, the second sensor electrodes, and the third sensor electrodes are disposed on a same layer, and
   wherein the first connection pattern is connected to two first sensor electrodes adjacent to each other among the first sensor electrodes through first contact holes, the second connection pattern is directly connected to two second sensor electrodes adjacent to each other among the second sensor electrodes, and the third connection pattern is connected to two third sensor electrodes adjacent to each other among the third sensor electrodes through second contact holes.

2. The touch detecting unit of claim 1, wherein the third sensor electrodes are arranged in the first direction and electrically connected with one another.

3. The touch detecting unit of claim 1, further comprising conductive patterns electrically separated from the first sensor electrodes and the second sensor electrodes.

4. The touch detecting unit of claim 3, wherein the third sensor electrodes are surrounded by the first sensor electrodes, respectively, and
   the conductive patterns are surrounded by the second sensor electrodes, respectively.

5. The touch detecting unit of claim 3, wherein the third sensor electrodes are surrounded by the first sensor electrodes, respectively, in a first area, and
   wherein the conductive patterns are surrounded by the second sensor electrodes, respectively, in the first area, and the conductive patterns are surrounded by the first sensor electrodes and the second sensor electrodes, respectively, in a second area around the first area.

6. The touch detecting unit of claim 1, wherein the third connection pattern comprises:
   a first sub-connection pattern connected to a third sensor electrode among the third sensor electrodes surrounded by one of the first sensor electrodes adjacent to each other in the first direction;
   a second sub-connection pattern connected to the third sensor electrode surrounded by another one of the first sensor electrodes adjacent to each other in the first direction; and
   a third sub-connection pattern disposed between the first sub-connection pattern and the second sub-connection pattern.

7. The touch detecting unit of claim 6, wherein the first sub-connection pattern and the second sub-connection pattern are electrically separated from the first sensor electrodes adjacent to each other in the first direction.

8. The touch detecting unit of claim 6, wherein each of the first connection pattern and the third sub-connection pattern overlaps at least one of the second sensor electrodes adjacent to each other in the second direction or the second connection pattern.

9. The touch detecting unit of claim 6, wherein the first connection pattern and the third sub-connection pattern are disposed on a first layer, and
   wherein the first sensor electrodes, the second sensor electrodes, the third sensor electrodes, the second connection pattern, the first sub-connection pattern, and the second sub-connection pattern are disposed on a second layer.

* * * * *